(12) United States Patent
Ishii

(10) Patent No.: US 11,043,163 B2
(45) Date of Patent: Jun. 22, 2021

(54) DISPLAY DEVICE AND ELECTRONIC SHELF LABEL

(71) Applicant: Japan Display Inc., Minato-ku (JP)

(72) Inventor: Tatsuya Ishii, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 99 days.

(21) Appl. No.: 16/357,482

(22) Filed: Mar. 19, 2019

(65) Prior Publication Data

US 2019/0295464 A1 Sep. 26, 2019

(30) Foreign Application Priority Data

Mar. 22, 2018 (JP) .............................. JP2018-054687

(51) Int. Cl.
*G09G 3/3225* (2016.01)
*H01L 27/32* (2006.01)

(52) U.S. Cl.
CPC ....... *G09G 3/3225* (2013.01); *H01L 27/3276* (2013.01); *G09G 2310/0264* (2013.01)

(58) Field of Classification Search
None
See application file for complete search history.

(56) References Cited

U.S. PATENT DOCUMENTS

| 5,646,885 | A | * | 7/1997 | Matsuo | G11C 11/412 365/154 |
| 2002/0021274 | A1 | * | 2/2002 | Koyama | G09G 3/3266 345/98 |
| 2011/0303964 | A1 | * | 12/2011 | Ueda | H01L 29/66825 257/317 |
| 2012/0038604 | A1 | * | 2/2012 | Liu | G09G 3/3648 345/211 |
| 2013/0009163 | A1 | * | 1/2013 | Ueda | H01L 29/94 257/72 |

FOREIGN PATENT DOCUMENTS

| JP | 58-196582 | 11/1983 |
| JP | 02-130797 | 5/1990 |
| JP | 09-212140 | 8/1997 |

* cited by examiner

*Primary Examiner* — Krishna P Neupane
(74) *Attorney, Agent, or Firm* — Oblon, McClelland, Maier & Neustadt, L.L.P.

(57) ABSTRACT

According to an aspect, a display device includes a plurality of sub-pixels arranged in a row direction and a column direction, and each including a memory block that has at least one memory configured to store sub-pixel data. The at least one memory includes: a first transistor including a first floating gate and configured to store the sub-pixel data based on an electric charge in the first floating gate; and a second transistor including a second floating gate electrically coupled to the first floating gate of the first transistor, one of a drain and a source of the second transistor being coupled to a power supply potential, the other of the drain and the source being coupled to a node. Each of the sub-pixels is configured to display an image based on a potential of the node.

19 Claims, 38 Drawing Sheets

FIG.7

| ROW \ COLUMN | FIRST COLUMN | SECOND COLUMN | THIRD COLUMN |
|---|---|---|---|
| FIRST ROW | 1 | 0 | 0 |
| SECOND ROW | 0 | 1 | 0 |
| THIRD ROW | 0 | 1 | 0 |
| FOURTH ROW | 1 | 1 | 1 |
| FIFTH ROW | 1 | 0 | 1 |
| SIXTH ROW | 0 | 0 | 1 |

|  |  | ERASING PERIOD | WRITING PERIOD ||||||
|--|--|--|--|--|--|--|--|--|
|  |  |  | STEP 1 | STEP 2 | STEP 3 | STEP 4 | STEP 5 | STEP 6 |
| WRITING POTENTIAL | $SGL_1$ | 0 V | 20 V | 0 V | 0 V | 20 V | 20 V | 0 V |
|  | $SGL_2$ | 0 V | 0 V | 20 V | 20 V | 20 V | 0 V | 0 V |
|  | $SGL_3$ | 0 V | 0 V | 0 V | 0 V | 20 V | 20 V | 20 V |
| $GL_1 (GCL_a)$ || 20 V | 0 V | 0 V | 0 V | 0 V | 0 V | 0 V |
| $GL_2 (GCL_a)$ || 20 V | 23 V | 0 V | 0 V | 0 V | 0 V | 0 V |
| $GL_3 (GCL_a)$ || 20 V | 23 V | 23 V | 0 V | 0 V | 0 V | 0 V |
| $GL_4 (GCL_a)$ || 20 V | 23 V | 23 V | 23 V | 0 V | 0 V | 0 V |
| $GL_5 (GCL_a)$ || 20 V | 23 V | 23 V | 23 V | 23 V | 0 V | 0 V |
| $GL_6 (GCL_a)$ || 20 V | 23 V | 23 V | 23 V | 23 V | 23 V | 0 V |
| VDD || 3 V OR 0 V | 3 V | 3 V | 3 V | 3 V | 3 V | 3 V |
| MEMORY POTENTIAL | $SPix_{1-1}$ | 3 V | 3 V | 3 V | 3 V | 3 V | 3 V | 3 V |
|  | $SPix_{2-1}$ | 3 V | 3 V | 0 V | 0 V | 0 V | 0 V | 0 V |
|  | $SPix_{3-1}$ | 3 V | 3 V | 3 V | 0 V | 0 V | 0 V | 0 V |
|  | $SPix_{4-1}$ | 3 V | 3 V | 3 V | 3 V | 3 V | 3 V | 3 V |
|  | $SPix_{5-1}$ | 3 V | 3 V | 3 V | 3 V | 3 V | 3 V | 3 V |
|  | $SPix_{6-1}$ | 3 V | 3 V | 3 V | 3 V | 3 V | 3 V | 0 V |
|  | $SPix_{1-2}$ | 3 V | 0 V | 0 V | 0 V | 0 V | 0 V | 0 V |
|  | $SPix_{2-2}$ | 3 V | 3 V | 3 V | 3 V | 3 V | 3 V | 3 V |
|  | $SPix_{3-2}$ | 3 V | 3 V | 3 V | 3 V | 3 V | 3 V | 3 V |
|  | $SPix_{4-2}$ | 3 V | 3 V | 3 V | 3 V | 3 V | 3 V | 3 V |
|  | $SPix_{5-2}$ | 3 V | 3 V | 3 V | 3 V | 3 V | 0 V | 0 V |
|  | $SPix_{6-2}$ | 3 V | 3 V | 3 V | 3 V | 3 V | 3 V | 0 V |
|  | $SPix_{1-3}$ | 3 V | 0 V | 0 V | 0 V | 0 V | 0 V | 0 V |
|  | $SPix_{2-3}$ | 3 V | 3 V | 0 V | 0 V | 0 V | 0 V | 0 V |
|  | $SPix_{3-3}$ | 3 V | 3 V | 3 V | 0 V | 0 V | 0 V | 0 V |
|  | $SPix_{4-3}$ | 3 V | 3 V | 3 V | 3 V | 3 V | 3 V | 3 V |
|  | $SPix_{5-3}$ | 3 V | 3 V | 3 V | 3 V | 3 V | 3 V | 3 V |
|  | $SPix_{6-3}$ | 3 V | 3 V | 3 V | 3 V | 3 V | 3 V | 3 V |

| | | FIRST EMBODIMENT OF PRESENT APPLICATION | JP-A-S58-196582 |
|---|---|---|---|
| NUMBER OF TRANSISTORS | INVERSION SWITCH | 6 | 4 |
| | MEMORY | 2 | 6 |
| | OTHER | 1 (PULL-DOWN RESISTOR) | 0 |
| NUMBER OF SIGNAL WIRES | VERTICAL | 1 | 2 |
| | HORIZONTAL | 3 | 3 |
| NUMBER OF POWER SUPPLY WIRES | | 2 | 2 |
| TOTAL | NUMBER OF TRANSISTORS | 9 | 10 |
| | NUMBER OF WIRES | 6 | 7 |

FIG.12

| ROW \ COLUMN | FIRST COLUMN | SECOND COLUMN | THIRD COLUMN |
|---|---|---|---|
| FIRST ROW | 1 | 0 | 0 |
| SECOND ROW | 0 | 1 | 0 |
| THIRD ROW | 0 | 1 | 0 |
| FOURTH ROW | 1 | 1 | 1 |
| FIFTH ROW | 1 | 0 | 1 |
| SIXTH ROW | 0 | 0 | 1 |

|  |  | ERASING PERIOD | WRITING PERIOD ||||||
|---|---|---|---|---|---|---|---|---|
|  |  |  | STEP 1 | STEP 2 | STEP 3 | STEP 4 | STEP 5 | STEP 6 |
| WRITING POTENTIAL | SGL$_1$ | 20 V | 0 V | 5 V | 5 V | 0 V | 0 V | 5 V |
|  | SGL$_2$ | 20 V | 5 V | 0 V | 0 V | 0 V | 5 V | 5 V |
|  | SGL$_3$ | 20 V | 5 V | 5 V | 5 V | 0 V | 0 V | 0 V |
|  | GL$_1$ (GCL$_a$) | 0 V | 10 V | 0 V | 0 V | 0 V | 0 V | 0 V |
|  | GL$_2$ (GCL$_a$) | 0 V | 0 V | 10 V | 0 V | 0 V | 0 V | 0 V |
|  | GL$_3$ (GCL$_a$) | 0 V | 0 V | 0 V | 10 V | 0 V | 0 V | 0 V |
|  | GL$_4$ (GCL$_a$) | 0 V | 0 V | 0 V | 0 V | 10 V | 0 V | 0 V |
|  | GL$_5$ (GCL$_a$) | 0 V | 0 V | 0 V | 0 V | 0 V | 10 V | 0 V |
|  | GL$_6$ (GCL$_a$) | 0 V | 0 V | 0 V | 0 V | 0 V | 0 V | 10 V |
|  | VDD | 3 V OR 0 V | 3 V | 3 V | 3 V | 3 V | 3 V | 3 V |
| MEMORY POTENTIAL | SPix$_{1-1}$ | 3 V | 3 V | 3 V | 3 V | 3 V | 3 V | 3 V |
|  | SPix$_{2-1}$ | 3 V | 3 V | 0 V | 0 V | 0 V | 0 V | 0 V |
|  | SPix$_{3-1}$ | 3 V | 3 V | 3 V | 0 V | 0 V | 0 V | 0 V |
|  | SPix$_{4-1}$ | 3 V | 3 V | 3 V | 3 V | 3 V | 3 V | 3 V |
|  | SPix$_{5-1}$ | 3 V | 3 V | 3 V | 3 V | 3 V | 3 V | 3 V |
|  | SPix$_{6-1}$ | 3 V | 3 V | 3 V | 3 V | 3 V | 3 V | 0 V |
|  | SPix$_{1-2}$ | 3 V | 0 V | 0 V | 0 V | 0 V | 0 V | 0 V |
|  | SPix$_{2-2}$ | 3 V | 3 V | 3 V | 3 V | 3 V | 3 V | 3 V |
|  | SPix$_{3-2}$ | 3 V | 3 V | 3 V | 3 V | 3 V | 3 V | 3 V |
|  | SPix$_{4-2}$ | 3 V | 3 V | 3 V | 3 V | 3 V | 3 V | 3 V |
|  | SPix$_{5-2}$ | 3 V | 3 V | 3 V | 3 V | 3 V | 0 V | 0 V |
|  | SPix$_{6-2}$ | 3 V | 3 V | 3 V | 3 V | 3 V | 3 V | 0 V |
|  | SPix$_{1-3}$ | 3 V | 0 V | 0 V | 0 V | 0 V | 0 V | 0 V |
|  | SPix$_{2-3}$ | 3 V | 3 V | 0 V | 0 V | 0 V | 0 V | 0 V |
|  | SPix$_{3-3}$ | 3 V | 3 V | 3 V | 0 V | 0 V | 0 V | 0 V |
|  | SPix$_{4-3}$ | 3 V | 3 V | 3 V | 3 V | 3 V | 3 V | 3 V |
|  | SPix$_{5-3}$ | 3 V | 3 V | 3 V | 3 V | 3 V | 3 V | 3 V |
|  | SPix$_{6-3}$ | 3 V | 3 V | 3 V | 3 V | 3 V | 3 V | 3 V |

| ROW / COLUMN | | FIRST COLUMN | SECOND COLUMN | THIRD COLUMN |
|---|---|---|---|---|
| FIRST ROW | FIRST MEMORY | 1 | 0 | 0 |
| | SECOND MEMORY | 0 | 1 | 0 |
| | THIRD MEMORY | 0 | 1 | 0 |
| SECOND ROW | FIRST MEMORY | 1 | 1 | 1 |
| | SECOND MEMORY | 1 | 0 | 1 |
| | THIRD MEMORY | 0 | 0 | 1 |

FIG.21

|  |  | ERASING PERIOD | WRITING PERIOD | | | | | |
|---|---|---|---|---|---|---|---|---|
|  |  |  | STEP 1 | STEP 2 | STEP 3 | STEP 4 | STEP 5 | STEP 6 |
| WRITING POTENTIAL | SGL$_1$ | 0 V | 20 V | 0 V | 0 V | 20 V | 20 V | 0 V |
| | SGL$_2$ | 0 V | 0 V | 20 V | 20 V | 20 V | 0 V | 0 V |
| | SGL$_3$ | 0 V | 0 V | 0 V | 0 V | 20 V | 20 V | 20 V |
| GL$_1$ | GCL$_a$ | 20 V | 0 V | 0 V | 0 V | 0 V | 0 V | 0 V |
| | GCL$_b$ | 20 V | 23 V | 0 V | 0 V | 0 V | 0 V | 0 V |
| | GCL$_c$ | 20 V | 23 V | 23 V | 0 V | 0 V | 0 V | 0 V |
| GL$_2$ | GCL$_a$ | 20 V | 23 V | 23 V | 23 V | 0 V | 0 V | 0 V |
| | GCL$_b$ | 20 V | 23 V | 23 V | 23 V | 23 V | 0 V | 0 V |
| | GCL$_c$ | 20 V | 23 V | 23 V | 23 V | 23 V | 23 V | 0 V |

|  |  | READING PERIOD | | |
|---|---|---|---|---|
|  |  | STEP 7 | STEP 8 | STEP 9 |
|  | SEL$_a$ | 0 V | -5 V | -5 V |
|  | SEL$_b$ | -5 V | 0 V | -5 V |
|  | SEL$_c$ | -5 V | -5 V | 0 V |
| MEMORY POTENTIAL | SPix$_{1-1}$ | 3 V | 0 V | 0 V |
| | SPix$_{2-1}$ | 3 V | 3 V | 0 V |
| | SPix$_{1-2}$ | 0 V | 3 V | 3 V |
| | SPix$_{2-2}$ | 3 V | 0 V | 0 V |
| | SPix$_{1-3}$ | 0 V | 0 V | 0 V |
| | SPix$_{2-3}$ | 3 V | 3 V | 3 V |

| ROW / COLUMN | | FIRST COLUMN | SECOND COLUMN | THIRD COLUMN |
|---|---|---|---|---|
| FIRST ROW | FIRST MEMORY | 1 | 0 | 0 |
| | SECOND MEMORY | 0 | 1 | 0 |
| | THIRD MEMORY | 0 | 1 | 0 |
| SECOND ROW | FIRST MEMORY | 1 | 1 | 1 |
| | SECOND MEMORY | 1 | 0 | 1 |
| | THIRD MEMORY | 0 | 0 | 1 |

FIG.26

| | | ERASING PERIOD | WRITING PERIOD | | | | | |
|---|---|---|---|---|---|---|---|---|
| | | | STEP 1 | STEP 2 | STEP 3 | STEP 4 | STEP 5 | STEP 6 |
| WRITING POTENTIAL | SGL$_1$ | 20 V | 0 V | 5 V | 5 V | 0 V | 0 V | 5 V |
| | SGL$_2$ | 20 V | 5 V | 0 V | 0 V | 0 V | 5 V | 5 V |
| | SGL$_3$ | 20 V | 5 V | 5 V | 5 V | 0 V | 0 V | 0 V |
| GL$_1$ | GCL$_a$ | 0 V | 10 V | 0 V | 0 V | 0 V | 0 V | 0 V |
| | GCL$_b$ | 0 V | 0 V | 10 V | 0 V | 0 V | 0 V | 0 V |
| | GCL$_c$ | 0 V | 0 V | 0 V | 10 V | 0 V | 0 V | 0 V |
| GL$_2$ | GCL$_a$ | 0 V | 0 V | 0 V | 0 V | 10 V | 0 V | 0 V |
| | GCL$_b$ | 0 V | 0 V | 0 V | 0 V | 0 V | 10 V | 0 V |
| | GCL$_c$ | 0 V | 0 V | 0 V | 0 V | 0 V | 0 V | 10 V |

| | | READING PERIOD | | |
|---|---|---|---|---|
| | | STEP 7 | STEP 8 | STEP 9 |
| | SEL$_a$ | 0 V | -5 V | -5 V |
| | SEL$_b$ | -5 V | 0 V | -5 V |
| | SEL$_c$ | -5 V | -5 V | 0 V |
| MEMORY POTENTIAL | SPix$_{1-1}$ | 3 V | 0 V | 0 V |
| | SPix$_{2-1}$ | 3 V | 3 V | 0 V |
| | SPix$_{1-2}$ | 0 V | 3 V | 3 V |
| | SPix$_{2-2}$ | 3 V | 0 V | 0 V |
| | SPix$_{1-3}$ | 0 V | 0 V | 0 V |
| | SPix$_{2-3}$ | 3 V | 3 V | 3 V |

| ROW / COLUMN | | FIRST COLUMN | SECOND COLUMN | THIRD COLUMN |
|---|---|---|---|---|
| FIRST ROW | FIRST MEMORY | 1 | 0 | 0 |
| | SECOND MEMORY | 0 | 1 | 0 |
| | THIRD MEMORY | 0 | 1 | 0 |
| SECOND ROW | FIRST MEMORY | 1 | 1 | 1 |
| | SECOND MEMORY | 1 | 0 | 1 |
| | THIRD MEMORY | 0 | 0 | 1 |

FIG.32

|  |  | ERASING PERIOD | WRITING PERIOD | | | | | |
|---|---|---|---|---|---|---|---|---|
|  |  |  | STEP 1 | STEP 2 | STEP 3 | STEP 4 | STEP 5 | STEP 6 |
| WRITING POTENTIAL | $SGL_1$ | 0 V | 20 V | 0 V | 0 V | 20 V | 20 V | 0 V |
|  | $SGL_2$ | 0 V | 0 V | 20 V | 20 V | 20 V | 0 V | 0 V |
|  | $SGL_3$ | 0 V | 0 V | 0 V | 0 V | 20 V | 20 V | 20 V |
| $GL_1$ | $GCL_a$ | 20 V | 0 V | 0 V | 0 V | 0 V | 0 V | 0 V |
|  | $GCL_b$ | 20 V | 23 V | 0 V | 0 V | 0 V | 0 V | 0 V |
|  | $GCL_c$ | 20 V | 23 V | 23 V | 0 V | 0 V | 0 V | 0 V |
| $GL_2$ | $GCL_a$ | 20 V | 23 V | 23 V | 23 V | 0 V | 0 V | 0 V |
|  | $GCL_b$ | 20 V | 23 V | 23 V | 23 V | 23 V | 0 V | 0 V |
|  | $GCL_c$ | 20 V | 23 V | 23 V | 23 V | 23 V | 23 V | 0 V |
| VDD |  | 3 V OR 0 V | 3 V | 3 V | 3 V | 3 V | 3 V | 3 V |
|  |  | $t_{60}$ | $t_{61}$ | $t_{62}$ | $t_{63}$ | $t_{64}$ | $t_{65}$ | $t_{66}$  $t_{67}$ |

FIG.33

|  |  | READING PERIOD | | |
|---|---|---|---|---|
|  |  | STEP 7 | STEP 8 | STEP 9 |
| $GL_1, GL_2$ | $GCL_a$ | 0 V | -5 V | -5 V |
|  | $GCL_b$ | -5 V | 0 V | -5 V |
|  | $GCL_c$ | -5 V | -5 V | 0 V |
| MEMORY POTENTIAL | $SPix_{1-1}$ | 3 V | 0 V | 0 V |
|  | $SPix_{2-1}$ | 3 V | 3 V | 0 V |
|  | $SPix_{1-2}$ | 0 V | 3 V | 3 V |
|  | $SPix_{2-2}$ | 3 V | 0 V | 0 V |
|  | $SPix_{1-3}$ | 0 V | 0 V | 0 V |
|  | $SPix_{2-3}$ | 3 V | 3 V | 3 V |
| VDD |  | 3 V | 3 V | 3 V |
|  |  | $t_{67}$ | $t_{68}$ | $t_{69}$  $t_{70}$ |

FIG.37

| ROW \ COLUMN | | FIRST COLUMN | SECOND COLUMN | THIRD COLUMN |
|---|---|---|---|---|
| FIRST ROW | FIRST MEMORY | 1 | 0 | 0 |
| | SECOND MEMORY | 0 | 1 | 0 |
| | THIRD MEMORY | 0 | 1 | 0 |
| SECOND ROW | FIRST MEMORY | 1 | 1 | 1 |
| | SECOND MEMORY | 1 | 0 | 1 |
| | THIRD MEMORY | 0 | 0 | 1 |

FIG.39

|  |  | ERASING PERIOD | WRITING PERIOD | | | | | |
|---|---|---|---|---|---|---|---|---|
|  |  |  | STEP 1 | STEP 2 | STEP 3 | STEP 4 | STEP 5 | STEP 6 |
| WRITING POTENTIAL | $SGL_1$ | 20 V | 0 V | 5 V | 5 V | 0 V | 0 V | 5 V |
|  | $SGL_2$ | 20 V | 5 V | 0 V | 0 V | 0 V | 5 V | 5 V |
|  | $SGL_3$ | 20 V | 5 V | 5 V | 5 V | 0 V | 0 V | 0 V |
| $GL_1$ | $GCL_a$ | 0 V | 10 V | 0 V | 0 V | 0 V | 0 V | 0 V |
|  | $GCL_b$ | 0 V | 0 V | 10 V | 0 V | 0 V | 0 V | 0 V |
|  | $GCL_c$ | 0 V | 0 V | 0 V | 10 V | 0 V | 0 V | 0 V |
| $GL_2$ | $GCL_a$ | 0 V | 0 V | 0 V | 0 V | 10 V | 0 V | 0 V |
|  | $GCL_b$ | 0 V | 0 V | 0 V | 0 V | 0 V | 10 V | 0 V |
|  | $GCL_c$ | 0 V | 0 V | 0 V | 0 V | 0 V | 0 V | 10 V |
| VDD |  | 3 V OR 0 V | 0 V | 0 V | 0 V | 0 V | 0 V | 0 V |

|  |  | READING PERIOD | | |
|---|---|---|---|---|
|  |  | STEP 7 | STEP 8 | STEP 9 |
| $GL_1$, $GL_2$ | $GCL_a$ | 0 V | -5 V | -5 V |
|  | $GCL_b$ | -5 V | 0 V | -5 V |
|  | $GCL_c$ | -5 V | -5 V | 0 V |
| MEMORY POTENTIAL | $SPix_{1-1}$ | 3 V | 0 V | 0 V |
|  | $SPix_{2-1}$ | 3 V | 3 V | 0 V |
|  | $SPix_{1-2}$ | 0 V | 3 V | 3 V |
|  | $SPix_{2-2}$ | 3 V | 0 V | 0 V |
|  | $SPix_{1-3}$ | 0 V | 0 V | 0 V |
|  | $SPix_{2-3}$ | 3 V | 3 V | 3 V |
| VDD |  | 3 V | 3 V | 3 V |

$t_{87}$ $t_{88}$ $t_{89}$ $t_{90}$

DISPLAY DEVICE AND ELECTRONIC SHELF LABEL

CROSS-REFERENCE TO RELATED APPLICATIONS

This application claims priority from Japanese Application No. 2018-054687, filed on Mar. 22, 2018, the contents of which are incorporated by reference herein in its entirety.

BACKGROUND

1. Technical Field

The present disclosure relates to a display device and an electronic shelf label.

2. Description of the Related Art

A display device that displays images includes a plurality of pixels. Japanese Patent Application Laid-open Publication No. H9-212140 (JP-A-H9-212140) describes a memory-in-pixel (MIP) display device, in which each of the pixels includes a plurality of memories. In the display device described in JP-A-H9-212140, each of the pixels includes the memories and a switching circuit between the memories. Japanese Patent Application Laid-open Publication No. S58-196582 (JP-A-S58-196582) describes a display element that includes a one-bit memory.

In the display device described in JP-A-H9-212140, a dynamic random access memory (DRAM) or a static random access memory (SRAM) is used as each of the memories of each of the pixels. The DRAM needs to perform a refresh operation, and is thus not suitable for reduction of power consumption. The SRAM has a large-scale circuit, and is thus not suitable for increasing resolution. The SRAM has a higher wiring density, and thus has a higher risk of wiring short circuits caused by, for example, foreign matter, potentially resulting in a lower yield rate.

For the foregoing reasons, there is a need for a display device and an electronic shelf label that are capable of reducing power consumption.

SUMMARY

According to an aspect of the present disclosure, a display device includes a plurality of sub-pixels arranged in a row direction and a column direction, and each including a memory block that has at least one memory configured to store sub-pixel data. The at least one memory includes: a first transistor including a first floating gate and configured to store the sub-pixel data based on an electric charge in the first floating gate; and a second transistor including a second floating gate electrically coupled to the first floating gate of the first transistor, one of a drain and a source of the second transistor being coupled to a power supply potential, the other of the drain and the source being coupled to a node.

Each of the sub-pixels is configured to display an image based on a potential of the node.

According to another aspect of the present disclosure, an electronic shelf label includes a plurality of sub-pixels arranged in a row direction and a column direction, and each including a memory block that has at least one memory configured to store sub-pixel data. The at least one memory includes: a first transistor including a first floating gate and configured to store the sub-pixel data based on an electric charge in the first floating gate; and a second transistor including a second floating gate electrically coupled to the first floating gate of the first transistor, one of a drain and a source of the second transistor being coupled to a power supply potential, the other of the drain and the source being coupled to a node.

Each of the sub-pixels is configured to display an image based on a potential of the node.

BRIEF DESCRIPTION OF THE DRAWINGS

FIG. 7 is a diagram illustrating sub-pixel data written to the sub-pixels of the display device according to the first embodiment;

FIG. 9 is a diagram illustrating potentials of various parts when the writing is performed to the sub-pixels of the display device according to the first embodiment;

FIG. 10 is a diagram illustrating the numbers of transistors and the numbers of wires in each of the sub-pixels of the display device according to the first embodiment and the numbers of transistors and the numbers of wires in the display element of JP-A-S58-196582;

FIG. 12 is a diagram illustrating the sub-pixel data written to the sub-pixels of the display device according to the second embodiment;

FIG. 14 is a diagram illustrating the potentials of the various parts when the writing is performed to the sub-pixels of the display device according to the second embodiment;

FIG. 19 is a diagram illustrating the sub-pixel data written to the sub-pixels of the display device according to the third embodiment;

FIG. 21 is a diagram illustrating potentials of various parts when the writing is performed to the sub-pixels of the display device according to the third embodiment;

FIG. 22 is a diagram illustrating potentials of various parts when the reading is performed from the sub-pixels of the display device according to the third embodiment;

FIG. 24 is a diagram illustrating the sub-pixel data written to the sub-pixels of the display device according to the fourth embodiment;

FIG. 26 is a diagram illustrating the potentials of the various parts when the writing is performed to the sub-pixels of the display device according to the fourth embodiment;

FIG. 27 is a diagram illustrating the potentials of the various parts when the reading is performed from the sub-pixels of the display device according to the fourth embodiment;

FIG. 30 is a diagram illustrating the sub-pixel data written to the sub-pixels of the display device according to the fifth embodiment;

FIG. 32 is a diagram illustrating the potentials of the various parts when the writing is performed to the sub-pixels of the display device according to the fifth embodiment;

FIG. 33 is a diagram illustrating the potentials of the various parts when the reading is performed from the sub-pixels of the display device according to the fifth embodiment;

FIG. 37 is a diagram illustrating the sub-pixel data written to the sub-pixels of the display device according to the sixth embodiment;

FIG. 39 is a diagram illustrating the potentials of the various parts when the writing is performed to the sub-pixels of the display device according to the sixth embodiment;

FIG. 40 is a diagram illustrating the potentials of the various parts when the reading is performed from the sub-pixels of the display device according to the sixth embodiment;

DETAILED DESCRIPTION

Figure 1:
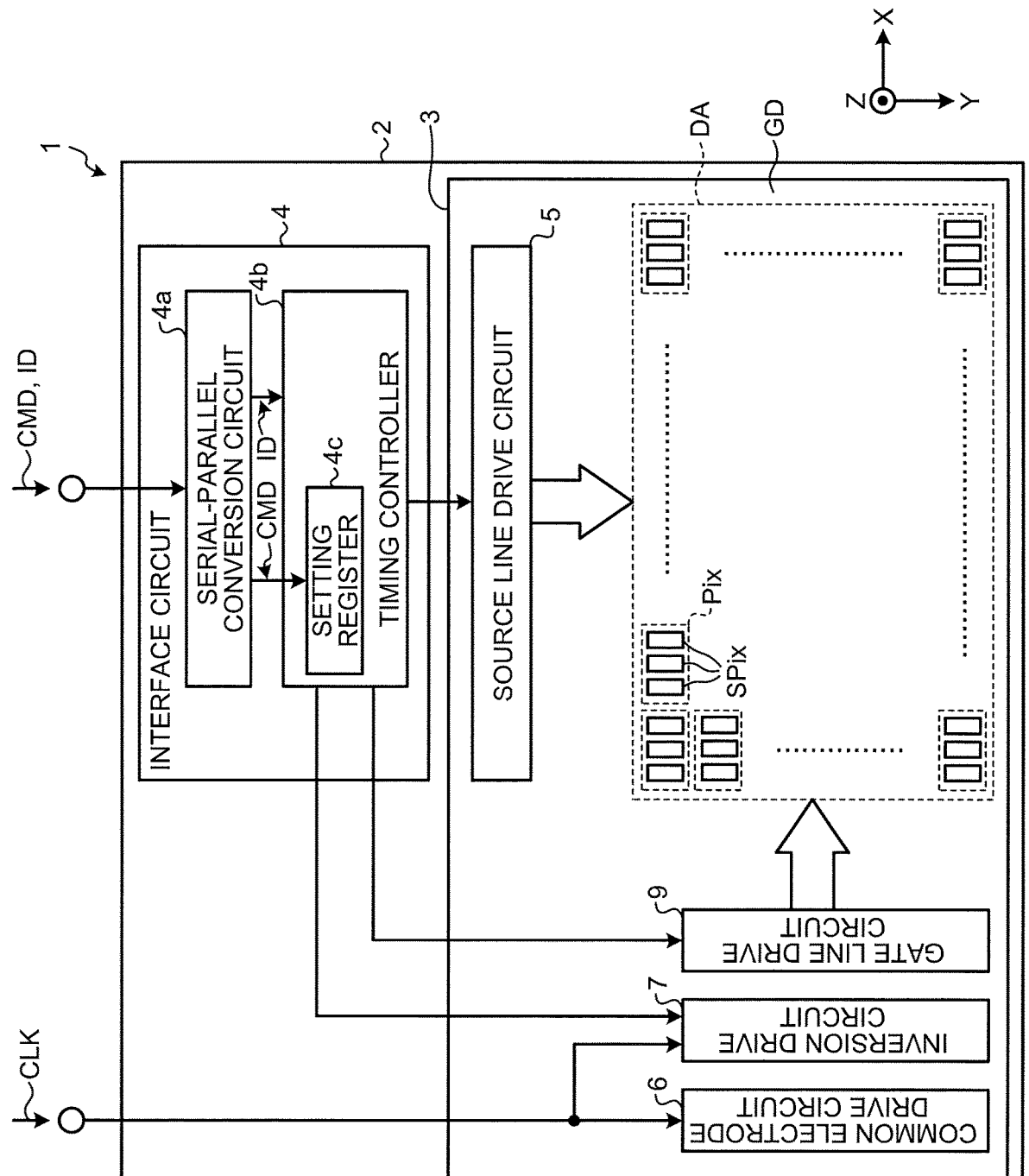
FIG. 1 is a diagram illustrating an overview of an overall configuration of a display device according to a first embodiment of the present disclosure.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith.

Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present disclosure and the figures, components similar to those previously described with reference to previous figures are denoted by like reference numerals, and detailed explanation thereof may be appropriately omitted. In this disclosure, when an element A is described as being "on" another element B, the element A can be directly on the other element B, or there can be one or more elements between the element A and the other element B.

First Embodiment

Overall Configuration FIG. 1 is a diagram illustrating an overview of an overall configuration of a display device according to a first embodiment of the present disclosure. A display device 1 includes a first panel 2 and a second panel 3 facing the first panel 2. The display device 1 has a display region DA in which an image is displayed and a frame region GD outside the display region DA. In the display region DA, a liquid crystal layer is sealed between the first panel 2 and the second panel 3.

In the first embodiment, the display device 1 is a liquid crystal display device using the liquid crystal layer, but the present disclosure is not limited thereto.

The display device 1 may be an organic electroluminescent (EL) display device using organic EL elements instead of the liquid crystal layer.

In the display region DA, a plurality of pixels Pix are arranged in a matrix (row-column configuration) of N columns (where N is a natural number) arranged in an X-direction parallel to principal surfaces of the first panel 2 and the second panel 3 and M rows (where M is a natural number) arranged in a Y-direction parallel to the principal surfaces of the first panel 2 and the second panel 3 and intersecting the X-direction. An interface circuit 4, a source line drive circuit 5, a common electrode drive circuit 6, an inversion drive circuit 7, and a gate line drive circuit 9 are disposed in the frame region GD. A configuration can be employed in which, of these circuits, the interface circuit 4, the source line drive circuit 5, the common electrode drive circuit 6, and the inversion drive circuit 7 are built into an integrated circuit (IC) chip, and the gate line drive circuit 9 is provided on the first panel 2. Alternatively, a configuration can be employed in which a group of the circuits built into the IC chip is provided in a processor outside the display device 1, and the circuits are coupled to the display device.

Each of the M×N pixels Pix includes a plurality of sub-pixels SPix. In the first embodiment, the sub-pixels SPix are three sub-pixels of red (R), green (G), and blue (B), but the present disclosure is not limited thereto. The sub-pixels SPix may be four sub-pixels including a sub-pixel of white (W) in addition to sub-pixels of red (R), green (G), and blue (B). Alternatively, the sub-pixels SPix may be five or more sub-pixels of different colors.

Since each of the pixels Pix includes the three sub-pixels SPix, M×N×3 sub-pixels SPix are arranged in the display region DA. The three sub-pixels SPix in each of the M×N pixels Pix are arranged in the X-direction. Accordingly, N×3 sub-pixels SPix are arranged in one row of the M×N pixels Pix.

Each of the sub-pixels SPix includes one memory.

Accordingly, M×N×3 memories are arranged in the display region DA, and N×3 memories are arranged in one row of the M×N pixels Pix.

Each of the sub-pixels SPix performs display of the sub-pixel SPix based on sub-pixel data stored in the memory included in the sub-pixel SPix. This means that a set of M×N×3 memories included in the M×N×3 sub-pixels SPix is equivalent to one frame memory.

The interface circuit 4 includes a serial-parallel conversion circuit 4a and a timing controller 4b. The timing controller 4b includes a setting register 4c. The serial-parallel conversion circuit 4a is serially supplied with command data CMD and image data ID from an external circuit. Examples of the external circuit include a host central processing unit (CPU) and an application processor, but the present disclosure is not limited thereto.

The serial-parallel conversion circuit 4a converts the supplied command data CMD into parallel data, and outputs the parallel data to the setting register 4c. Values for controlling the source line drive circuit 5, the inversion drive circuit 7, and the gate line drive circuit 9 are set in the setting register 4c based on the command data CMD.

The serial-parallel conversion circuit 4a converts the supplied image data ID into parallel data, and outputs the parallel data to the timing controller 4b. The timing controller 4b outputs the image data ID to the source line drive circuit 5 based on the values set in the setting register 4c. The timing controller 4b also controls the inversion drive circuit 7 and the gate line drive circuit 9 based on the values set in the setting register 4c.

The common electrode drive circuit 6 and the inversion drive circuit 7 are supplied with a reference clock signal CLK from an external circuit. Examples of the external circuit include a clock generator, but the present disclosure is not limited thereto.

Driving methods such as a common inversion driving method, a column inversion driving method, a line inversion driving method, a dot inversion driving method, and a frame inversion driving method are known as driving methods for preventing the liquid crystal display device from image burn-in.

The display device 1 can employ any one of the above-mentioned driving methods. In the first embodiment, the display device 1 employs the common inversion driving method. Since the display device 1 employs the common inversion driving method, the common electrode drive circuit 6 inverts the potential (common potential) of a common electrode in synchronization with the reference clock signal CLK. The inversion drive circuit 7 inverts the potential of a sub-pixel electrode in synchronization with the reference clock signal CLK under the control of the timing controller 4b. Accordingly, the display device 1 can implement the common inversion driving method. In the first embodiment, the display device 1 employs what is called a normally black system of displaying black when no voltage is applied to liquid crystal and displays white when a voltage is applied to the liquid crystal. The normally black system displays black when the potential of the sub-pixel electrode is in phase with the common potential, and displays white when the potential of the sub-pixel electrode is out of phase with the common potential.

To display the image on the display device 1, the sub-pixel data needs to be stored in the memory of each of the sub-pixels SPix. To store the sub-pixel data in each of the memories, the gate line drive circuit 9 outputs a gate signal for selecting one row of the M×N pixels Pix under the control of the timing controller 4b.

Since each of the sub-pixels SPix includes one memory, one gate line is disposed for each row (pixel row (sub-pixel row)). If the sub-pixels SPix are operated by, in addition to the gate signal, an inverted gate signal inverted from the gate signal, two gate lines are arranged for each of the rows.

The one or two gate lines arranged for each of the rows correspond to a gate line group of the present disclosure. Since the display device 1 includes the M rows of the pixels Pix, M gate line groups are arranged.

The gate line drive circuit 9 includes M output terminals corresponding to the M rows of the pixels Pix. Under the control of the timing controller 4b, the gate line drive circuit 9 sequentially outputs the gate signal for selecting each of the M rows from corresponding one of the M output terminals.

Under the control of the timing controller 4b, the source line drive circuit 5 outputs a source signal (sub-pixel data) to each of the memories selected by the gate signal. Through this process, the sub-pixel data is sequentially stored in the memory of each of the sub-pixels SPix.

The display device 1 line-sequentially scans the M rows of the pixels Pix to store the sub-pixel data of one piece of frame data in the memory of each of the sub-pixels SPix.

Sectional Structure

Figure 2:
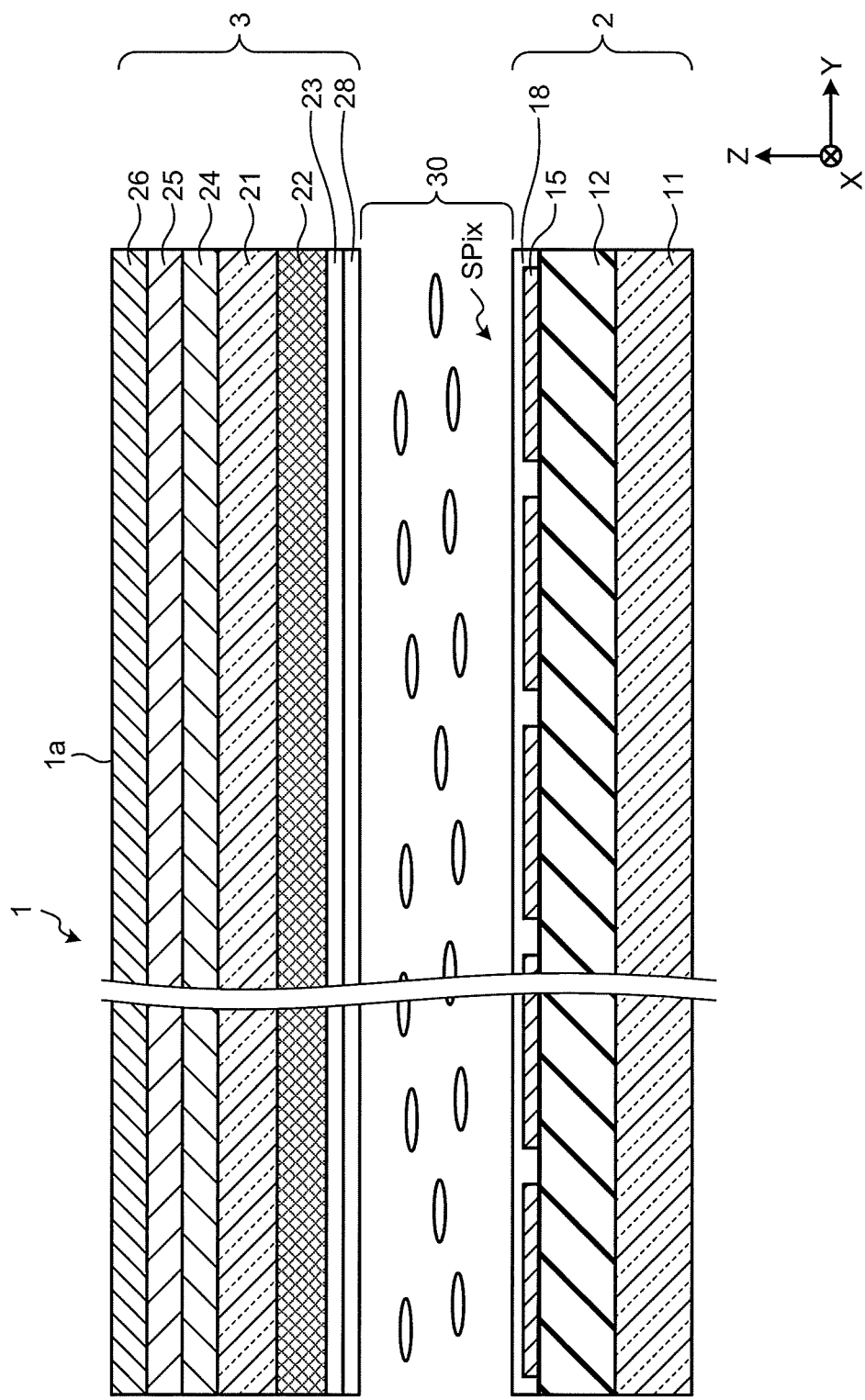
FIG. 2 is a sectional view of the display device according to the first embodiment.

FIG. 2 is a sectional view of the display device according to the first embodiment. As illustrated in FIG. 2, the display device 1 includes the first panel 2, the second panel 3, and a liquid crystal layer 30. The second panel 3 faces the first panel 2. The liquid crystal layer 30 is provided between the first panel 2 and the second panel 3. A principal surface of the second panel 3 serves as a display surface 1a for displaying the image.

Light entering the display surface 1a from the outside is reflected by a sub-pixel electrode (reflective electrode) 15 of the first panel 2, and emitted from the display surface 1a. The display device 1 of the first embodiment is a reflective liquid crystal display device that uses this reflected light to display the image on the display surface 1a. In this specification, the X-direction denotes a direction parallel to the display surface 1a, and the Y-direction denotes a direction intersecting the X-direction in a plane parallel to the display surface 1a. A Z-direction denotes a direction orthogonal to the display surface 1a.

The first panel 2 includes a first substrate 11, an insulating layer 12, the sub-pixel electrode (reflective electrode) 15, and an orientation film 18. Examples of the first substrate 11 include a glass substrate and a resin substrate. A surface of the first substrate 11 is provided with circuit elements and various types of wiring, such as the gate lines and data lines, which are not illustrated. The circuit elements include switching elements, such as thin-film transistors (TFTs), and capacitive elements.

The insulating layer 12 is provided on the first substrate 11, and planarizes surfaces of, for example, the circuit elements and the various types of wiring as a whole. A plurality of sub-pixel electrodes 15 are provided on the insulating layer 12. The orientation film 18 is provided between the sub-pixel electrodes 15 and the liquid crystal layer 30. The sub-pixel electrodes 15 are provided in rectangular shapes corresponding to the respective sub-pixels SPix. The sub-pixel electrodes 15 are made of a metal, such as aluminum (Al) and silver (Ag). The sub-pixel electrodes 15 may have a multilayered configuration of these metal materials and a light-transmitting conductive material, such as indium tin oxide (ITO). The sub-pixel electrodes (reflective electrodes) 15 employ a material having good reflectance, and serve as reflective plates that diffusely reflect the light entering from the outside.

While the light reflected by the sub-pixel electrode 15 is scattered by the diffuse reflection, it travels in a uniform direction toward the display surface 1a. A change in level of a voltage applied to the sub-pixel electrode 15 changes the transmission state of the light in the liquid crystal layer 30 above the reflective electrodes, that is, the transmission state of the light of each of the sub-pixels SPix. In other words, the sub-pixel electrode 15 also has a function as the sub-pixel electrode.

The second panel 3 includes a second substrate 21, a color filter 22, a common electrode 23, an orientation film 28, a quarter wavelength plate 24, a half wavelength plate 25, and a polarizing plate 26. The color filter 22 and the common electrode 23 are sequentially stacked in this order on one of two surfaces of the second substrate 21 facing the first panel 2. The orientation film 28 is provided between the common electrode 23 and the liquid crystal layer 30. The quarter wavelength plate 24, the half wavelength plate 25, and the polarizing plate 26 are sequentially stacked in this order on the other of the two surfaces of the second substrate 21 facing the display surface 1a.

Examples of the second substrate 21 include a glass substrate and a resin substrate. The common electrode 23 is made of a light-transmitting conductive material, such as ITO. The common electrode 23 faces the sub-pixel electrodes 15, and supplies a common potential to each of the sub-pixels SPix. The color filter 22 includes filters having, for example, three colors of red (R), green (G), and blue (B), but the present disclosure is not limited to this example.

The liquid crystal layer 30 includes, for example, nematic liquid crystal. A change in level of a voltage between the common electrode 23 and the sub-pixel electrode (reflective electrode) 15 changes the orientation state of liquid crystal molecules in the liquid crystal layer 30. Through this process, the light passing through the liquid crystal layer 30 is modulated on a per sub-pixel SPix basis.

For example, external light serves as the incident light entering from the display surface 1a of the display device 1, and reaches the sub-pixel electrode 15 through the second panel 3 and the liquid crystal layer 30. The incident light is reflected on the sub-pixel electrode 15 of each of the sub-pixels SPix. The reflected light is modulated on a per sub-pixel SPix basis, and emitted from the display surface 1a. Through this process, the image is displayed.

Circuit Configuration

Figure 3:
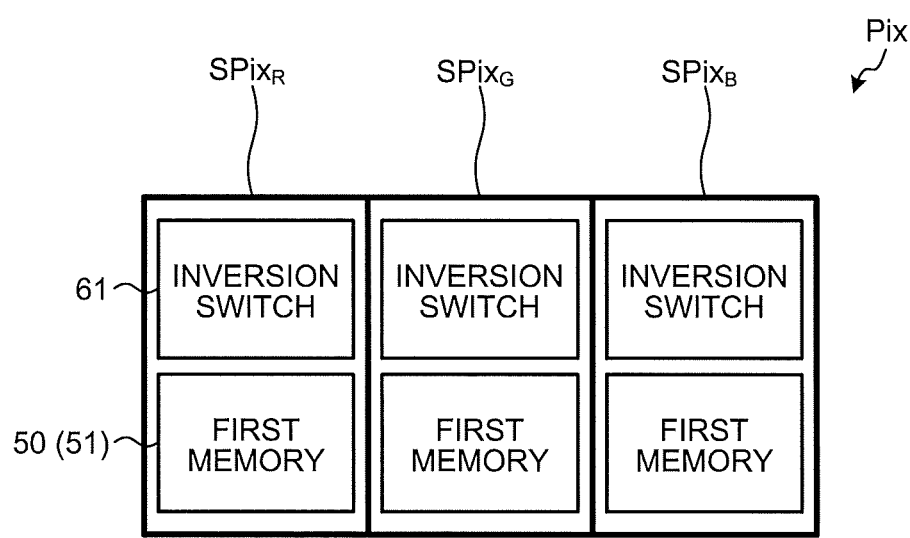
FIG. 3 is a diagram illustrating an arrangement of sub-pixels in a pixel of the display device according to the first embodiment.

FIG. 3 is a diagram illustrating an arrangement of the sub-pixels in each of the pixels of the display device according to the first embodiment. Each of the pixels Pix includes a red (R) sub-pixel $SPix_R$, a green (G) sub-pixel $SPix_G$, and a blue (B) sub-pixel $SPix_B$.

Each of the sub-pixels $SPix_R$, $SPix_G$, and $SPix_B$ includes a memory block 50 and an inversion switch 61. The memory block 50 includes a first memory 51.

The first memory 51 is a memory cell that stores one-bit data, but the present disclosure is not limited thereto. The first memory 51 may be a memory cell that stores data of two or more bits.

The inversion switch 61 is electrically coupled between the first memory 51 and the sub-pixel electrode 15 (refer to FIG. 2). The inversion switch 61 outputs a display signal supplied from the inversion drive circuit 7 as it is or in an inverted form to the sub-pixel electrode 15 based on the sub-pixel data output from the first memory 51.

An inversion cycle of the display signal is the same as an inversion cycle of the potential (common potential) of the common electrode 23.

The inversion switch 61 corresponds to a switch circuit of the present disclosure.

Figure 4:
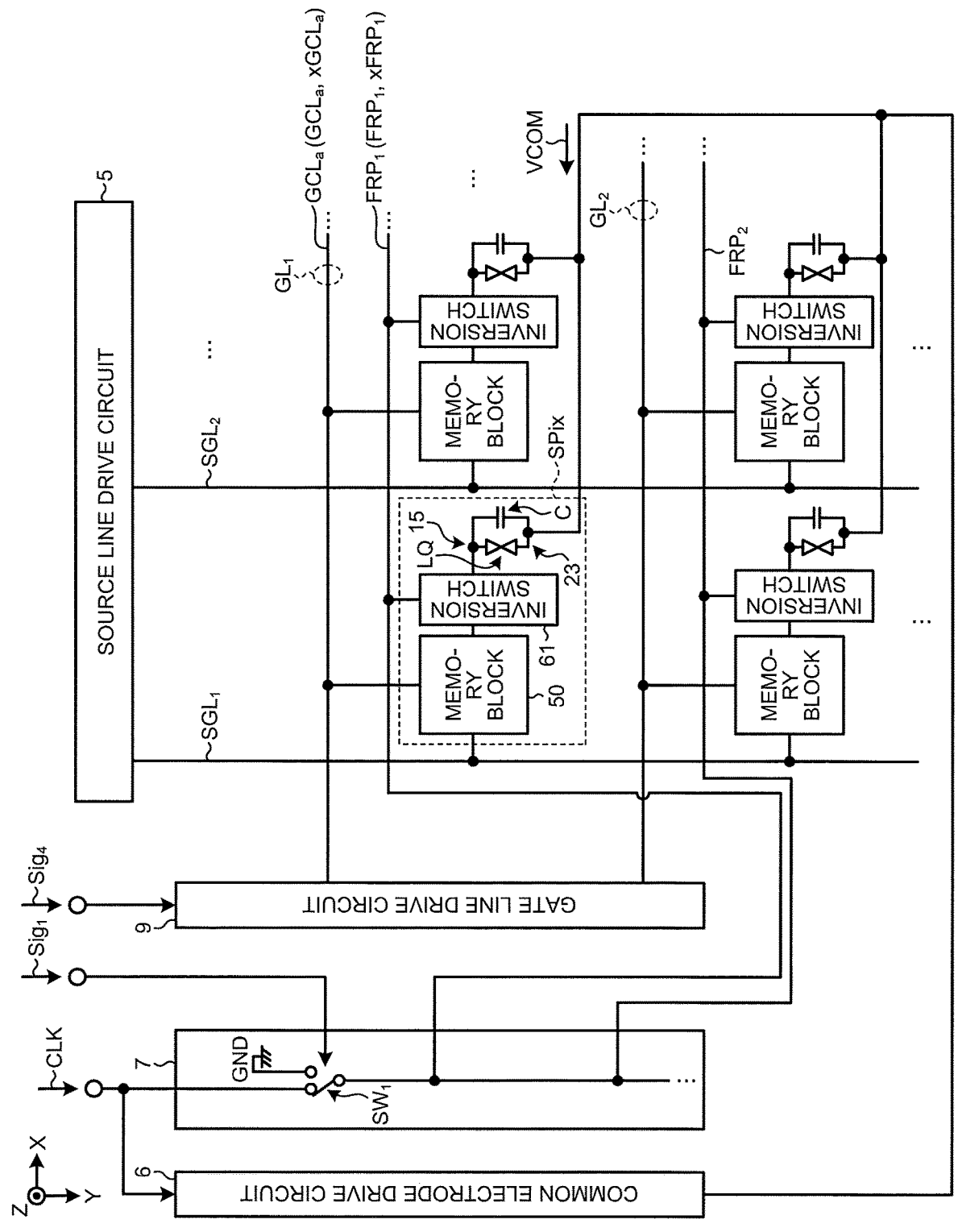
FIG. 4 is a diagram illustrating a circuit configuration of the display device according to the first embodiment.

FIG. 4 is a diagram illustrating a circuit configuration of the display device according to the first embodiment. FIG. 4 illustrates 2×2 sub-pixels SPix out of the sub-pixels SPix of M rows×(N×3) columns.

The sub-pixel SPix includes liquid crystal LQ, a retention capacitor C, and the sub-pixel electrode (reflective electrode) 15 (refer to FIG. 2) in addition to the memory block 50 and the inversion switch 61. A configuration can be employed in which the sub-pixel SPix does not include the retention capacitor C.

The common electrode drive circuit 6 inverts a common potential VCOM common to the sub-pixels SPix in synchronization with the reference clock signal CLK, and outputs the result to the common electrode 23 (refer to FIG. 2). The common electrode drive circuit 6 may output the reference clock signal CLK as it is as the common potential VCOM to the common electrode 23, or may output the reference clock signal CLK as the common potential VCOM through a buffer circuit for amplifying a current driving capacity to the common electrode 23.

The gate line drive circuit 9 includes the M output terminals corresponding to the M rows of the pixels Pix. The gate line drive circuit 9 outputs the gate signal for selecting each of the M rows from corresponding one of the M output terminals based on a control signal $Sig_4$ supplied from the timing controller 4b.

The gate line drive circuit 9 may be a scanner circuit that sequentially outputs the gate signals from the M output terminals based on the control signals $Sig_4$ (a scan start signal and clock pulse signals). Alternatively, the gate line drive circuit 9 may be a decoder circuit that decodes the encoded control signal $Sig_4$, and outputs the gate signal to one of the output terminals specified by the control signal $Sig_4$.

M gate line groups $GL_1$, $GL_2$, . . . corresponding to the M rows of the pixels Pix are arranged on the first panel 2.

Each of the M gate line groups $GL_1$, $GL_2$, . . . includes a first gate line $GCL_a$ electrically coupled to the first memory 51 (refer to FIG. 3) of corresponding one of the rows. Each of the M gate line groups $GL_1$, $GL_2$, . . . extends along the X-direction in the display region DA (refer to FIG. 1).

N×3 source lines $SGL_1, SGL_2, \ldots$ corresponding to the N×3 columns of the sub-pixels SPix are arranged on the first panel 2. Each of the source lines $SGL_1, SGL_2, \ldots$ extends along the Y-direction in the display region DA (refer to FIG. 1). The source line drive circuit 5 outputs the source signal (sub-pixel data) to each of the memories of the sub-pixels SPix selected by the gate signal through the source lines $SGL_1, SGL_2, \ldots$.

The sub-pixels SPix of the row supplied with the gate signal store the sub-pixel data supplied to the source lines SGL into the first memories 51 corresponding to a gate line GCL supplied with the gate signal.

M display signal lines $FRP_1, FRP_2, \ldots$ corresponding to the M rows of the pixels Pix are arranged on the first panel 2. Each of the M display signal lines $FRP_1, FRP_2, \ldots$ extends in the X-direction in the display region DA (refer to FIG. 1). If the inversion switch 61 is operated by, in addition to the display signal, an inverted display signal inverted from the display signal, the display signal line FRP and an inverted display signal line xFRP are provided for each of the rows.

The one or two display signal lines arranged for each of the rows correspond to a display signal line or display signal lines of the present disclosure.

The inversion drive circuit 7 includes a switch $SW_1$. The switch $SW_1$ is controlled by a control signal $Sig_1$ supplied from the timing controller 4b. If the control signal $Sig_1$ has a first value, the switch $SW_1$ supplies the reference clock signal CLK to each of the display signal lines $FRP_1, FRP_2, \ldots$. This operation inverts the potential of the sub-pixel electrode 15 in synchronization with the reference clock signal CLK. If the control signal $Sig_1$ has a second value, the switch $SW_1$ supplies a reference potential (ground potential) GND to each of the display signal lines $FRP_1, FRP_2, \ldots$.

Figure 5:
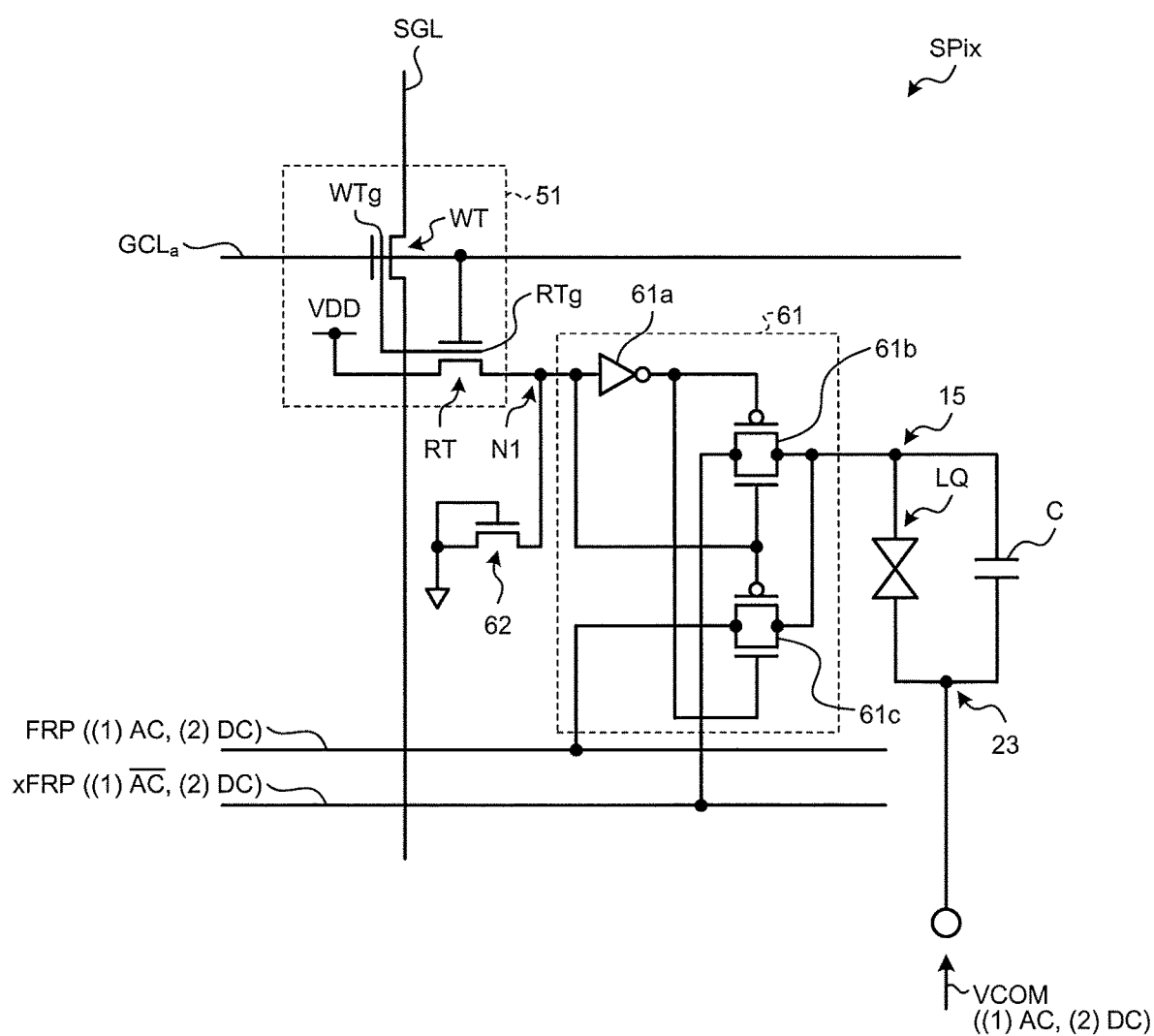
FIG. 5 is a diagram illustrating a circuit configuration of each of the sub-pixels of the display device according to the first embodiment.

FIG. 5 is a diagram illustrating a circuit configuration of each of the sub-pixels of the display device according to the first embodiment. FIG. 5 illustrates one of the sub-pixels SPix.

The sub-pixel SPix includes the first memory 51, the inversion switch 61, a pull-down resistor 62, the liquid crystal LQ, and the retention capacitor C.

The first memory 51 includes a writing transistor WT and a reading transistor RT. Each of the writing transistor WT and the reading transistor RT is a flash memory. In the first embodiment, a floating gate WTg of the writing transistor WT is electrically coupled to a floating gate RTg of the reading transistor RT.

The writing transistor WT corresponds to a first transistor of the present disclosure. The reading transistor RT corresponds to a second transistor of the present disclosure.

The floating gate (first floating gate) WTg of the writing transistor WT and the floating gate (second floating gate) RTg of the reading transistor RT may be integrated with each other. Alternatively, the floating gate WTg of the writing transistor WT and the floating gate RTg of the reading transistor RT may be separately formed and coupled to each other through wiring or the like.

The gate of the writing transistor WT is coupled to the first gate line $GCL_a$. A source-drain path of the writing transistor WT is inserted in each of the source lines SGL.

The gate of the reading transistor RT is coupled to the first gate line $GCL_a$. One of the drain and the source (source in the present embodiment) of the reading transistor RT is coupled to a power supply potential VDD. The other of the drain and the source (drain in the present embodiment) of the reading transistor RT is coupled to a node N1.

In the state where electrons are injected into the floating gate WTg, the writing transistor WT stores the sub-pixel data of 0. In contrast, in the state where electrons are released from the floating gate WTg, the writing transistor WT stores the sub-pixel data of 1.

The floating gate WTg is electrically coupled to the floating gate RTg. Accordingly, when electrons are injected into the floating gate WTg, electrons are also injected into the floating gate RTg. On the other hand, when electrons are released from the floating gate WTg, electrons are also released from the floating gate RTg. Accordingly, the reading transistor RT can read the one-bit sub-pixel data depending on whether electrons are present in the floating gate RTg.

The pull-down resistor 62 is electrically coupled between the node N1 and the reference potential, and pulls down the node N1. In the first embodiment, the pull-down resistor 62 is an n-type field-effect transistor with the source and the gate coupled to the reference potential and the drain coupled to the node N1, but is not limited to this example. A drain current $Ioff_{62}$ of the pull-down resistor 62 when being switched off is preferably larger than a drain current $Ioff_{RT}$ of the reading transistor RT when being switched off. In other words, a relation $Ioff_{62} \gg Ioff_{RT}$ is preferably satisfied. This relation allows the pull-down resistor 62 to sufficiently pull down the node N1.

The inversion switch 61 includes an inverter 61a and transfer gates 61b and 61c.

An input terminal of the inverter 61a is electrically coupled to the node N1. An output terminal of the inverter 61a is electrically coupled to an inverting input terminal of the transfer gate 61b and a non-inverting input terminal of the transfer gate 61c. A non-inverting input terminal of the transfer gate 61b and an inverting input terminal of the transfer gate 61c are electrically coupled to the node N1.

When the voltage of the node N1 is at a high level, that is, when the first memory 51 stores the sub-pixel data of 1, the transfer gate 61b outputs the inverted display signal (first display signal) on the inverted display signal line (first display signal line) xFRP to the sub-pixel electrode 15.

When the voltage of the node N1 is at a low level, that is, when the first memory 51 stores the sub-pixel data of 0, the transfer gate 61c outputs the display signal (second display signal) on the display signal line (second display signal line) FRP to the sub-pixel electrode 15.

The display signal supplied to the display signal line FRP is inverted in synchronization with the reference clock signal CLK. The common potential supplied to the common electrode 23 is also inverted in phase with the display signal in synchronization with the reference clock signal CLK. When the display signal is in phase with the common potential, no voltage is applied to the liquid crystal LQ, so that the orientation of the liquid crystal molecules does not change. As a result, the sub-pixel SPix is placed in a black display state (a state of not transmitting the reflected light, that is, a state where the reflected light does not pass through the color filter and no color is displayed). Accordingly, the display device 1 can implement the common inversion driving method.

The inverted display signal supplied to the inverted display signal line xFRP is inverted in synchronization with the reference clock signal CLK. The common potential supplied to the common electrode 23 is inverted out of phase with the display signal in synchronization with the reference clock signal CLK. As an example of the out-of-phase inversion, an opposite phase inversion is preferable in which only the phase is inverted. When the display signal is out of phase with the common potential, a voltage is applied to the liquid crystal LQ, so that the orientation of the liquid crystal molecules changes. As a result, the sub-pixel SPix is placed in a white display state (a state of transmitting the reflected light, that is, a state where the reflected light passes through the color filter and a color is displayed). Accordingly, the display device 1 can implement the common inversion driving method.

The above-described embodiment employs alternating-current drive (AC) in which the common potential (common signal) and the display signal periodically change between two potentials based on the reference signal, and the inverted display signal periodically changes out of phase (in opposite phase) with the common signal (indicated by (1) in FIG. 5). In contrast, a configuration of the alternating-current drive (AC) can be employed in which the common signal and the display signal are direct-current fixed potentials (DC) and the inverted display signal is inverted in polarity based on the fixed potentials (indicated by (2) in FIG. 5)

Operations

Figure 6:
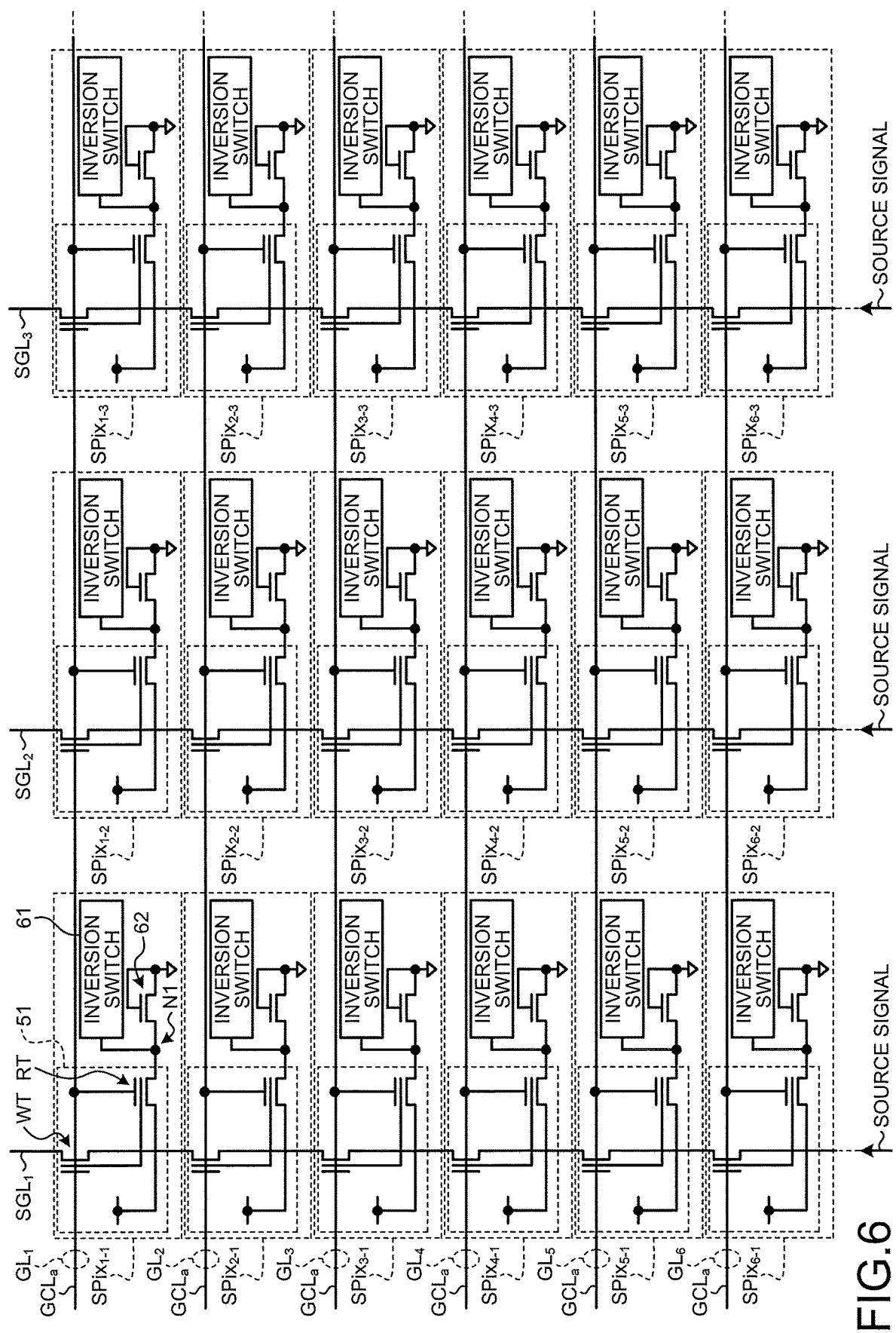
FIG. 6 is a diagram illustrating a configuration of the sub-pixels of the display device according to the first embodiment.

FIG. 6 is a diagram illustrating a configuration of the sub-pixels of the display device according to the first embodiment. FIG. 6 illustrates 18 sub-pixels SPix of 6 rows×3 columns out of the sub-pixels SPix of M rows×(N× 3) columns. FIG. 6 does not illustrate the display signal lines FRP, the inverted display signal lines xFRP, the liquid crystal LQ, and the retention capacitors C.

The source-drain paths of the writing transistors WT of the sub-pixels SPix in each column are coupled in series. In other words, the writing transistors WT of the sub-pixels SPix in each column of the display device 1 are coupled in what is called a NAND architecture.

Figure 8:
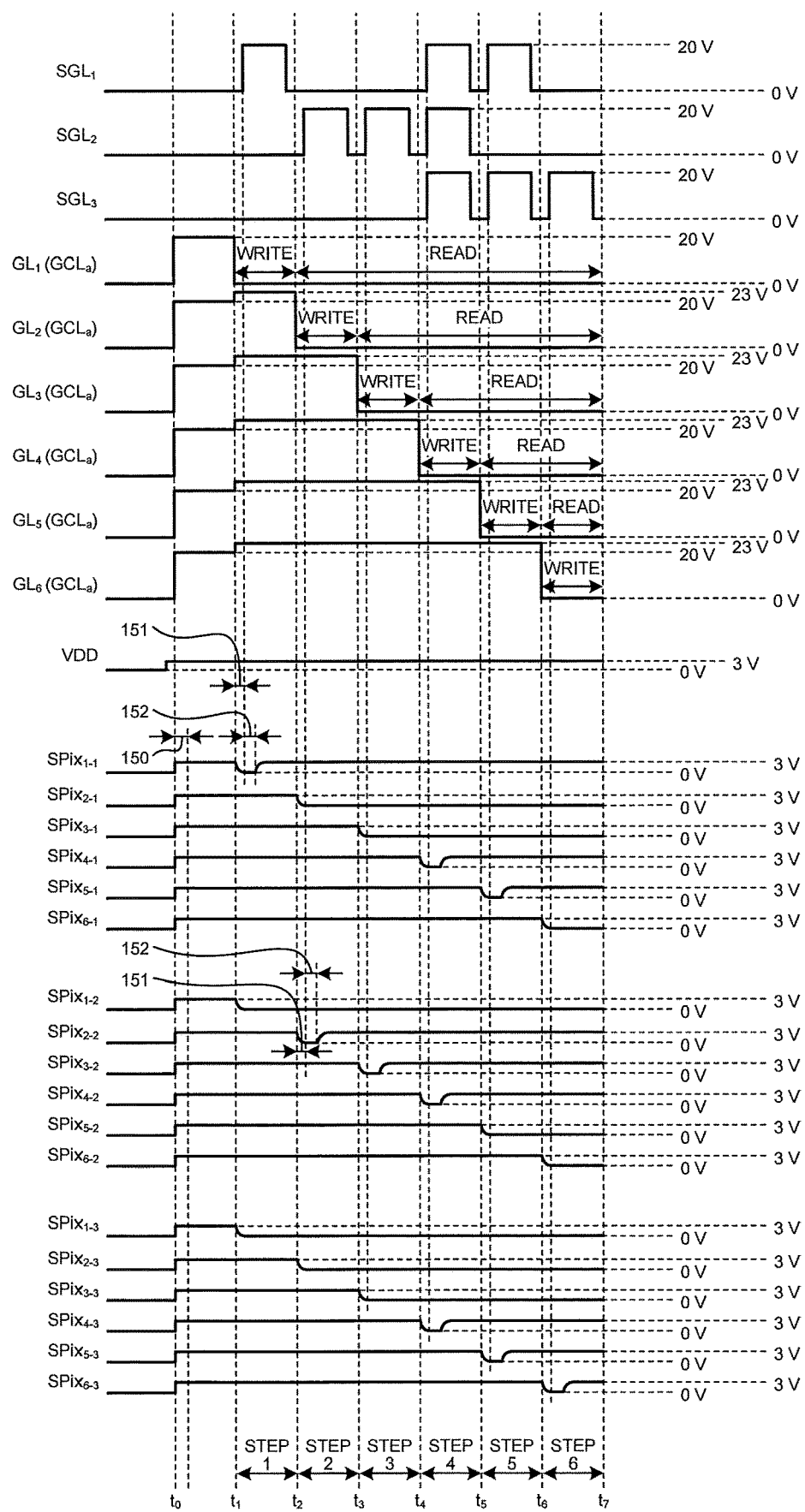
FIG. 8 is a timing diagram illustrating operation timing when the writing is performed to the sub-pixels of the display device according to the first embodiment.

FIG. 7 is a diagram illustrating the sub-pixel data written to the sub-pixels of the display device according to the first embodiment. FIG. 8 is a timing diagram illustrating operation timing when the writing is performed to the sub-pixels of the display device according to the first embodiment. FIG. 9 is a diagram illustrating potentials of various parts when the writing is performed to the sub-pixels of the display device according to the first embodiment.

With reference to FIGS. 6 to 9, the following describes operations when the writing is performed to the sub-pixels SPix of the display device 1.

The writing transistor WT serving as the flash memory needs to be erased before being written with the sub-pixel data. In FIGS. 8 and 9, a period from time $t_0$ to time $t_1$ is an erasing period.

A period from time $t_1$ to time $t_7$ after the erasing period is a writing period. The writing period includes step 1 from time $t_1$ to time $t_2$, step 2 from time $t_2$ to time $t_3$, step 3 from time $t_3$ to time $t_4$, step 4 from time $t_4$ to time to, step 5 from time $t_0$ to time $t_6$, and step 6 from time $t_6$ to time $t_7$.

Step 1 is a period of writing to sub-pixels $SPix_{1-1}$, $SPix_{1-7}$, and $SPix_{1-3}$ in the first row. Step 2 is a period of writing to sub-pixels $SPix_{2-1}$, $SPix_{2-2}$, and $SPix_{2-3}$ in the second row. Step 3 is a period of writing to sub-pixels $SPix_{3-1}$, $SPix_{3-2}$, and $SPix_{3-3}$ in the third row.

Step 4 is a period of writing to sub-pixels $SPix_{4-1}$, $SPix_{4-2}$, and $SPix_{4-3}$ in the fourth row. Step 5 is a period of writing to sub-pixels $SPix_{5-1}$, $SPix_{5-2}$, and $SPix_{5-3}$ in the fifth row. Step 6 is a period of writing to sub-pixels $SPix_{6-1}$, $SPix_{6-2}$, and $SPix_{6-3}$ in the sixth row.

Referring to FIGS. 8 and 9, at time to when the erasing period begins, the gate line drive circuit 9 outputs the gate signals of 20 V to the first gate line $GCL_a$ of the gate line group $GL_1$ to the first gate line $GCL_a$ of the gate line group $GL_6$. The source line drive circuit 5 outputs the source signals of 0 V to the source lines $SGL_1$, $SGL_2$, and $SGL_3$. Accordingly, a high electric field is applied between each of the gates of the writing transistors WT in the first memories 51 of all the sub-pixels SPix and the semiconductor substrate. As a result, a tunneling effect causes electrons to be injected from the semiconductor substrate into the floating gates WTg of the writing transistors WT in the first memories 51 of all the sub-pixels SPix.

After an erasing delay time 150 has elapsed from time to, threshold voltages of the writing transistors WT and the reading transistors RT in the first memories 51 of all the sub-pixels SPix shift in the positive voltage direction (to, for example, +2 V). This means that the sub-pixel data in the first memories 51 of all the sub-pixels SPix is collectively erased to be 0. At this time, the first gate line $GCL_a$ of the gate line group $GL_1$ to the first gate line $GCL_a$ of the gate line group $GL_6$ are supplied with the gate signals of 20 V. Accordingly, the reading transistors RT in the first memories 51 of all the sub-pixels SPix are turned on. This operation sets the potentials of the nodes N1 of all the sub-pixels SPix to 3 V (power supply potential VDD). During the erasing delay time 150 from time to, the threshold voltages are, for example, 0 V before the erasure, but the reading transistors RT are also in the on-state during this period. Therefore, the potentials of the nodes N1 do not change.

The power supply potential VDD is 3 V during the erasing period, but is not limited to 3 V, and may be 0 V. If the power supply potential VDD is 0 V, the reading transistors RT also perform the erasing operation, and sufficient electrons are injected into the floating gates RTg. If the reading transistors RT are excessively erased (injected with excessive electrons), the power supply potential VDD is preferably set to 3 V to weaken the electric field.

The writing of the sub-pixel data to the first memories 51 of the sub-pixels SPix is sequentially performed from the sub-pixels SPix in the first row, which are at a farther side from the supply side of the source signals (lower side in FIG. 6), to the sub-pixels SPix in the sixth row, which are at a closer side to the supply side of the source signals. In other words, the writing of the sub-pixel data to the first memories 51 of the sub-pixels SPix is performed in the following order: the writing of the sub-pixel data to the first memories 51 of the sub-pixels SPix in the first row (step 1); the writing of the sub-pixel data to the first memories 51 of the sub-pixels SPix in the second row (step 2); the writing of the sub-pixel data to the first memories 51 of the sub-pixels SPix in the third row (step 3); the writing of the sub-pixel data to the first memories 51 of the sub-pixels SPix in the fourth row (step 4); the writing of the sub-pixel data to the first memories 51 of the sub-pixels SPix in the fifth row (step 5); and the writing of the sub-pixel data to the first memories 51 of the sub-pixels SPix in the sixth row (step 6). The reason for this order is that the sub-pixels SPix in a row closer to the supply side of the source signals than a row of a writing target may be in the erased state.

At time $t_1$ when step 1 of the writing period begins, the gate line drive circuit 9 applies the gate signal of 0 V to the first gate line $GCL_a$ of the gate line group $GL_1$, and applies the gate signals of 23 V to the first gate line $GCL_a$ of the gate line group $GL_2$ to the first gate line $GCL_a$ of the gate line group $GL_6$.

The reading transistors RT in the first memories 51 of the sub-pixels $SPix_{1-1}$, $SPix_{1-2}$, and $SPix_{1-3}$ in the first row have a threshold of +2 V, and are therefore turned off. Accordingly, the potentials of the nodes N1 of the sub-pixels $SPix_{1-1}$, $SPix_{1-2}$, and $SPix_{1-3}$ in the first row are pulled down to 0 V by the pull-down resistors 62.

After a delay time 151 has elapsed from time $t_1$, the source line drive circuit 5 outputs the source signal of 20 V in positive logic to the source line $SGL_1$, and maintains the source signals of 0 V of the source lines $SGL_2$ and $SGL_3$.

The threshold voltage of the writing transistors WT in the first memories 51 of the sub-pixels $SPix_{2-1}$ to $SPix_{6-1}$ in the first row is +2 V. A voltage of 3 V (=23 V−20 V) is applied between the gate and the drain (or the source) of the writing transistor WT in the first memory 51 of each of the sub-pixels $SPix_{2-1}$ to $SPix_{6-1}$. Accordingly, the writing transistors WT in the first memories 51 of the sub-pixels $SPix_{2-1}$ to $SPix_{6-1}$ are turned on. As a result, the voltage of the source signal of 20 V supplied to the source line $SGL_1$ reaches the drain (or the source) of the writing transistor WT in the first memory 51 of the sub-pixel $SPix_{1-1}$ through the sub-pixels $SPix_{2-1}$ to $SPix_{6-1}$.

Accordingly, a voltage of −20 V (=0 V−20 V) is applied between the gate and the drain (or the source) of the writing transistor WT in the first memory 51 of the sub-pixel $SPix_{1-1}$. As a result, the tunneling effect causes electrons in the floating gate WTg of the writing transistor WT in the first memory 51 of the sub-pixel $SPix_{1-1}$ to be released to the semiconductor substrate (semiconductor layer). Accordingly, the threshold voltages of the writing transistor WT and the reading transistor RT in the first memory 51 of the sub-pixel $SPix_{1-1}$ shift in the negative voltage direction (to, for example, −2 V). After the delay time 151 and a writing delay time 152 have elapsed from time $t_1$, the sub-pixel data of the first memory 51 of the sub-pixel $SPix_{1-1}$ is set to 1. Accordingly, the potential of the node N1 of the sub-pixel $SPix_{1-1}$ is set to 3 V (power supply potential VDD).

At time $t_1$, the gate line drive circuit 9 applies the gate signals of 23 V to the first gate line $GCL_a$ of the gate line group $GL_2$ to the first gate line $GCL_a$ of the gate line group $GL_6$, but the voltage is not limited thereto. The voltage between the gate and the drain (or the source) of the writing transistor WT of each of the sub-pixels $SPix_{2-1}$ to $SPix_{6-1}$ only needs to be higher than +2 V that is the threshold voltage of the writing transistors WT of the sub-pixels $SPix_{2-1}$ to $SPix_{6-1}$. Accordingly, at time $t_1$, the gate line drive circuit 9 may apply, for example, the gate signals of 22.5 V to the first gate line $GCL_a$ of the gate line group $GL_2$ to the first gate line $GCL_a$ of the gate line group $GL_6$.

A voltage of 23 V (=23 V−0 V) is applied between the gate and the drain (or the source) of the writing transistor WT in the first memory 51 of each of the sub-pixels $SPix_{2-2}$ to $SPix_{6-2}$ in the second row. Accordingly, the sub-pixel data of 0 is written once again to the writing transistors WT in the first memories 51 of the sub-pixels $SPix_{2-2}$ to $SPix_{6-2}$ in the same manner as during the erasing period. This operation causes no problem because the sub-pixel data has not yet been written to the writing transistors WT in the first memories 51 of the sub-pixels $SPix_{2-2}$ to $SPix_{6-2}$.

Since the source signal of the source line $SGL_2$ is maintained at 0 V, the tunneling effect does not occur in the writing transistor WT in the first memory 51 of the sub-pixel $SPix_{1-2}$. Accordingly, the sub-pixel data of 0 in the first memory 51 of the sub-pixel $SPix_{1-2}$ written during the erasing period is maintained. Accordingly, the potential of the node N1 of the sub-pixel $SPix_{1-2}$ is maintained at 0 V.

A voltage of 23 V (=23 V−0 V) is applied between the gate and the drain (or the source) of the writing transistor WT in the first memory 51 of each of the sub-pixels $SPix_{2-3}$ to $SPix_{6-3}$ in the third row. Accordingly, the sub-pixel data of 0 is written once again to the writing transistors WT in the first memories 51 of the sub-pixels $SPix_{1-3}$ to $SPix_{6-3}$ in the same manner as during the erasing period. This operation causes no problem because the sub-pixel data has not yet been written to the writing transistors WT in the first memories 51 of the sub-pixels $SPix_{2-3}$ to $SPix_{6-3}$.

Since the source signal of the source line $SGL_3$ is maintained at 0 V, the tunneling effect does not occur in the writing transistor WT in the first memory 51 of the sub-pixel $SPix_{1-3}$. Accordingly, the sub-pixel data of 0 in the first memory 51 of the sub-pixel $SPix_{1-3}$ written during the erasing period is maintained. Accordingly, the potential of the node N1 of the sub-pixel $SPix_{1-3}$ is maintained at 0 V.

At time $t_2$ when step 2 begins, the gate line drive circuit 9 maintains the gate signal of 0 V of the first gate line $GCL_a$ of the gate line group $GL_1$, outputs the gate signal of 0 V to the first gate line $GCL_a$ of the gate line group $GL_2$, and maintains the gate signals of 23 V of the first gate line $GCL_a$ of the gate line group $GL_3$ to the first gate line $GCL_a$ of the gate line group $GL_6$.

From time $t_2$ onward, since the gate signal of the first gate line $GCL_a$ of the gate line group $GL_1$ is at 0 V, the sub-pixel data stored in the first memories 51 of the sub-pixels $SPix_{1-1}$, $SPix_{1-2}$, and $SPix_{1-3}$ in the first row is read out. When the sub-pixel data stored in the first memory 51 of each of the sub-pixels SPix in the first row is 0, the reading transistor RT is in the off-state and the potential of the node N1 is 0 V because the threshold voltage of the reading transistor RT is +2 V. When the sub-pixel data stored in the first memory 51 of each of the sub-pixels SPix in the first row is 1, the reading transistor RT is in the on-state and the potential of the node N1 is set to 3 V (power supply potential VDD) because the threshold voltage of the reading transistor RT is −2 V.

Since the gate signal of 0 V is applied to the first gate line $GCL_a$ of the gate line group $GL_2$, there is no conduction between the source and the drain of the writing transistor WT in the first memory 51 of each of the sub-pixels $SPix_{2-1}$, $SPix_{2-2}$, and $SPix_{2-3}$ in the second row. Accordingly, the writing of the sub-pixel data to the first memories 51 of the sub-pixels $SPix_{2-1}$, $SPix_{2-2}$, and $SPix_{2-3}$ in the second row does not affect the sub-pixel data written in the first memories 51 of the sub-pixels $SPix_{1-1}$, $SPix_{1-2}$, and $SPix_{1-3}$ in the first row.

The reading transistors RT in the first memories 51 of the sub-pixels $SPix_{2-1}$, $SPix_{2-2}$, and $SPix_{2-3}$ in the second row has a threshold of +2 V, and are therefore turned off. Accordingly, the potentials of the nodes N1 of the sub-pixels $SPix_{2-1}$, $SPix_{2-2}$, and $SPix_{2-3}$ in the second row are pulled down to 0 V by the pull-down resistors 62.

After the delay time 151 has elapsed from time $t_2$, the source line drive circuit 5 outputs the source signal of 0 V to the source line $SGL_1$, outputs the source signal of 20 V in positive logic to the source line $SGL_2$, and maintains the source signal of 0 V of the source line $SGL_3$.

A voltage of 23 V (=23 V−0 V) is applied between the gate and the drain (or the source) of the writing transistor WT in the first memory 51 of each of the sub-pixels $SPix_{31}$ to $SPix_{61}$ in the first row. Accordingly, the sub-pixel data of 0 is written once again to the writing transistors WT in the first memories 51 of the sub-pixels $SPix_{3-1}$ to $SPix_{6-1}$ in the same manner as during the erasing period. This operation causes no problem because the sub-pixel data has not yet been written to the writing transistors WT in the first memories 51 of the sub-pixels $SPix_{3-1}$ to $SPix_{6-1}$.

Since the source signal of the source line $SGL_1$ is maintained at 0 V, the tunneling effect does not occur in the writing transistor WT in the first memory 51 of the sub-pixel $SPix_{2-1}$. Accordingly, the sub-pixel data of 0 in the first memory 51 of the sub-pixel $SPix_{2-1}$ written during the erasing period is maintained. Accordingly, the potential of the node N1 of the sub-pixel SPix$_{2\text{-}1}$ is maintained at 0 V.

The threshold voltage of the writing transistors WT in the first memories 51 of the sub-pixels SPix$_{3\text{-}2}$ to SPix$_{6g2}$ in the second row is +2 V. A voltage of 3 V (=23 V−20 V) is applied between the gate and the drain (or the source) of the writing transistor WT in the first memory 51 of each of the sub-pixels SPix$_{3\text{-}2}$ to SPix$_{6\text{-}2}$. Accordingly, the writing transistors WT in the first memories 51 of the sub-pixels SPix$_{3\text{-}2}$ to SPix$_{6\text{-}2}$ are turned on. As a result, the voltage of the source signal of 20 V supplied to the source line SGL$_2$ reaches the drain (or the source) of the writing transistor WT in the first memory 51 of the sub-pixel SPix$_{2\text{-}2}$ through the sub-pixels SPix$_{3\text{-}2}$ to SPix$_{6\text{-}2}$.

Accordingly, a voltage of −20 V (=0 V−20 V) is applied between the gate and the drain (or the source) of the writing transistor WT in the first memory 51 of the sub-pixel SPix$_{2\text{-}2}$. As a result, the tunneling effect causes electrons in the floating gate WTg of the writing transistor WT in the first memory 51 of the sub-pixel SPix$_{2\text{-}2}$ to be released to the semiconductor substrate (the drain (or the source) of the writing transistor WT). Accordingly, the threshold voltages of the writing transistor WT and the reading transistor RT in the first memory 51 of the sub-pixel SPix$_{2\text{-}2}$ shift in the negative voltage direction (to, for example, −2 V). After the delay time 151 and the writing delay time 152 have elapsed from time t$_2$, the sub-pixel data of the first memory 51 of the sub-pixel SPix$_{2\text{-}2}$ is set to 1. Accordingly, the potential of the node N1 of the sub-pixel SPix$_{2\text{-}2}$ is set to 3 V (power supply potential VDD).

A voltage of 23 V (=23 V−0 V) is applied between the gate and the drain (or the source) of the writing transistor WT in the first memory 51 of each of the sub-pixels SPix$_{3\text{-}3}$ to SPix$_{6\text{-}3}$ in the third row. Accordingly, the sub-pixel data of 0 is written once again to the writing transistors WT in the first memories 51 of the sub-pixels SPix$_{3\text{-}3}$ to SPix$_{6\text{-}3}$ in the same manner as during the erasing period. This operation causes no problem because the sub-pixel data has not yet been written to the writing transistors WT in the first memories 51 of the sub-pixels SPix$_{3\text{-}3}$ to SPix$_{6\text{-}3}$.

Since the source signal of the source line SGL$_3$ is maintained at 0 V, the tunneling effect does not occur in the writing transistor WT in the first memory 51 of the sub-pixel SPix$_{2\text{-}3}$. Accordingly, the sub-pixel data of 0 in the first memory 51 of the sub-pixel SPix$_{2\text{-}3}$ written during the erasing period is maintained. Accordingly, the potential of the node N1 of the sub-pixel SPi$_{2\text{-}3}$ is maintained at 0 V.

The same operations as those at step 1 and step 2 described above are performed from step 3 to step 6. As a result, the sub-pixel data illustrated in FIG. 7 is written to the sub-pixels SPix$_{1\text{-}1}$ to SPix$_{6\text{-}3}$.

FIG. 10 is a diagram illustrating the numbers of transistors and the numbers of wires in each of the sub-pixels of the display device according to the first embodiment and the numbers of transistors and the numbers of wires in the display element of JP-A-S58-196582.

Regarding the inversion switch 61, the display device 1 of the first embodiment has the same basic configuration as that of the display element of JP-A-S58-196582. However, the display element of JP-A-S58-196582 (refer to FIG. 7) needs no inverter because a memory circuit also generates an inverted signal of a potential signal of a memory cell. Accordingly, in the display element of JP-A-S58-196582, the number of transistors of an inversion switch is four (transfer gates 20 and 21). In contrast, the inversion switch 61 of the display device 1 of the first embodiment includes the inverter 61a (refer to FIG. 5). Accordingly, in the display device 1 of the first embodiment, the number of transistors of the inversion switch 61 is six (the inverter 61a and the transfer gates 61b and 61c).

Regarding the memory, in the display device 1 of the first embodiment, the number of transistors in the first memory 51 is two, that is, the writing transistor WT and the reading transistor RT. In contrast, in the display element of JP-A-S58-196582, the number of transistors in the memory is six (transistors 5 and 6 and inverters 14 and 15).

The display device 1 of the first embodiment includes one transistor as the pull-down resistor 62 for the node N1.

Regarding the number of signal wires, the display device 1 of the first embodiment includes four wires, including one wire (source line SGL) in the vertical direction (Y-direction) and three wires (gate signal line GCL, display signal line FRP, and inverted display signal line xFRP) in the horizontal direction (X-direction). In contrast, the display element of JP-A-S58-196582 includes five wires, including two wires (yi and yi with an overline) in the vertical direction and three wires (xi, display signal line, and inverted display signal line) in the horizontal direction.

Regarding the number of power supply wires, both the display device 1 of the first embodiment and the display element of JP-A-S58-196582 include two wires.

Consequently, the display device 1 of the first embodiment has a total of nine transistors and a total of six wires, while the display element of JP-A-S58-196582 has a total of ten transistors and seven wires.

In this way, the display device 1 of the first embodiment can reduce the number of transistors and the number of wires. This reduction allows the display device 1 to be smaller in circuit scale and higher in resolution.

The reduction in transistor density and wiring density allows the display device 1 to have a lower risk of short circuits caused by, for example, foreign matter, and to have a higher yield rate.

A conventional MIP display device that uses an SRAM needs to maintain the power supply to maintain the sub-pixel data. In contrast, the display device 1 can maintain the sub-pixel data even after the power supply is stopped. As a result, the display device 1 can reduce the power consumption.

Second Embodiment

A display device according to a second embodiment of the present disclosure has the same overall configuration as that of the display device 1 of the first embodiment (refer to FIG. 1), and therefore will not be illustrated or described.

Figure 11:
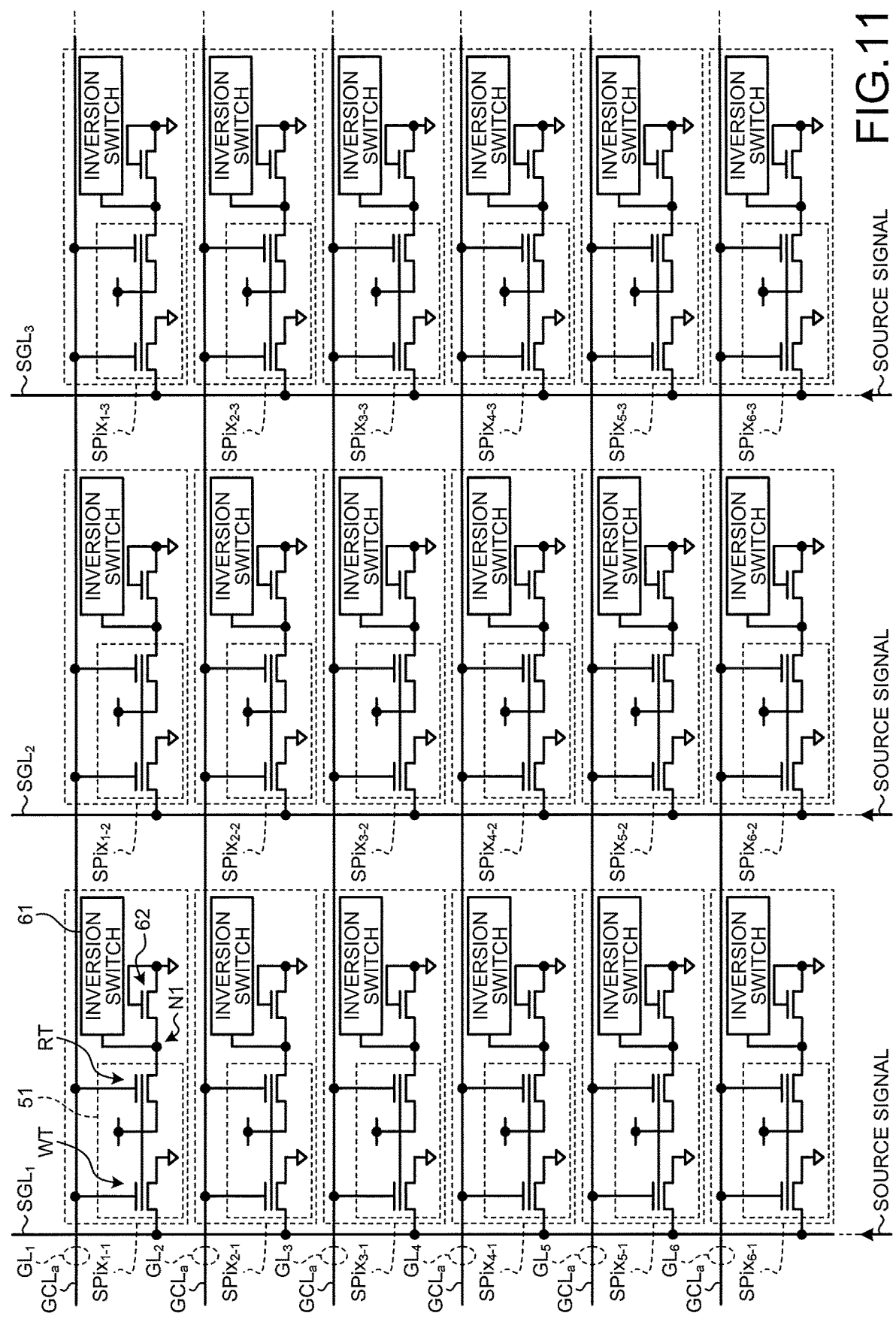
FIG. 11 is a diagram illustrating a configuration of the sub-pixels of a display device according to a second embodiment of the present disclosure.

FIG. 11 is a diagram illustrating a configuration of the sub-pixels of the display device according to the second embodiment. FIG. 11 illustrates 18 sub-pixels SPix of 6 rows×3 columns out of the sub-pixels SPix of M rows×(N× 3) columns. FIG. 11 does not illustrate the display signal lines FRP, the inverted display signal lines xFRP, the liquid crystal LQ, and the retention capacitors C.

The configuration of the sub-pixels SPix of the second embodiment differs from that of the sub-pixels SPix of the first embodiment (refer to FIG. 6) in the coupling of the writing transistors WT. One of the drain and the source of the writing transistor WT in each of the sub-pixels SPix is coupled to the reference potential. The other of the drain and the source of the writing transistor WT in each of the sub-pixels SPix is coupled to the source line SGL. In other words, the source-drain paths of the writing transistors WT of the sub-pixels SPix in each column are coupled in parallel. Accordingly, the writing transistors WT of the sub-pixels SPix in each column are coupled in what is called a NOR architecture.

Figure 13:
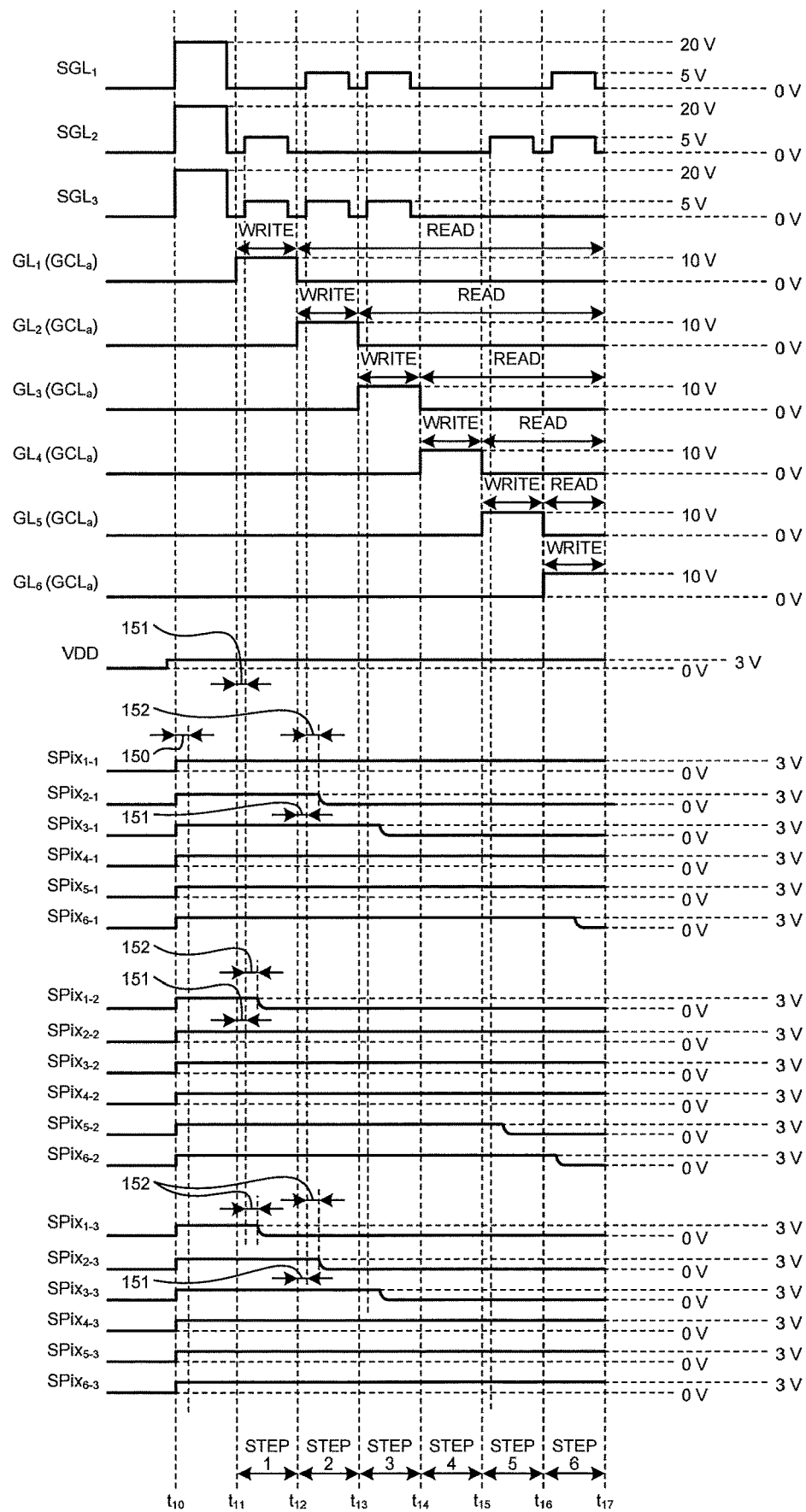
FIG. 13 is a timing diagram illustrating operation timing when the writing is performed to the sub-pixels of the display device according to the second embodiment.

FIG. 12 is a diagram illustrating the sub-pixel data written to the sub-pixels of the display device according to the second embodiment. FIG. 13 is a timing diagram illustrating operation timing when the writing is performed to the sub-pixels of the display device according to the second embodiment. FIG. 14 is a diagram illustrating the potentials of the various parts when the writing is performed to the sub-pixels of the display device according to the second embodiment.

With reference to FIGS. 11 to 14, the following describes operations when the writing is performed to the sub-pixels SPix of the display device of the second embodiment.

The writing transistor WT serving as the flash memory needs to be erased before being written with the sub-pixel data. In FIGS. 13 and 14, a period from time $t_{10}$ to time $t_{11}$ is the erasing period.

A period from time $t_{11}$ to time $t_{17}$ after the erasing period is the writing period. The writing period includes step 1 from time $t_{11}$ to time $t_{12}$, step 2 from time $t_{12}$ to time $t_{13}$, step 3 from time $t_{13}$ to time $t_{14}$, step 4 from time $t_{14}$ to time $t_{15}$, step 5 from time $t_{15}$ to time $t_{16}$, and step 6 from time $t_{16}$ to time $t_{17}$.

Step 1 is a period of writing to the sub-pixels $SPix_{1-1}$, $SPix_{1-2}$, and $SPix_{1-3}$ in the first row. Step 2 is a period of writing to the sub-pixels $SPix_{2-1}$, $SPix_{2-2}$, and $SPix_{2-3}$ in the second row. Step 3 is a period of writing to the sub-pixels $SPix_{3-1}$, $SPix_{3-2}$, and $SPix_{3-3}$ in the third row.

Step 4 is a period of writing to the sub-pixels $SPix_{4-1}$, $SPix_{4-2}$, and $SPix_{4-3}$ in the fourth row. Step 5 is a period of writing to the sub-pixels $SPix_{5-1}$, $SPix_{5-2}$, and $SPix_{5-3}$ in the fifth row. Step 6 is a period of writing to the sub-pixels $SPix_{6-1}$, $SPix_{6-2}$, and $SPix_{6-3}$ in the sixth row.

Referring to FIGS. 13 and 14, at time $t_{10}$ when the erasing period begins, the gate line drive circuit 9 outputs the gate signals of 0 V to the first gate line $GCL_a$ of the gate line group $GL_1$ to the first gate line $GCL_a$ of the gate line group $GL_6$. The source line drive circuit 5 outputs the source signals of 20 V to the source lines $SGL_1$, $SGL_2$, and $SGL_3$. Accordingly, the high electric field is applied between each of the gates of the writing transistors WT in the first memories 51 of all the sub-pixels SPix and the semiconductor substrate. As a result, the tunneling effect causes electrons in the floating gates WTg of the writing transistors WT in the first memories 51 of all the sub-pixels SPix to be released to the semiconductor substrate.

After the erasing delay time 150 has elapsed from time $t_{10}$, the threshold voltages of the writing transistors WT and the reading transistors RT in the first memories 51 of all the sub-pixels SPix shift in the negative voltage direction (to, for example, −2 V). This means that the sub-pixel data in the first memories 51 of all the sub-pixels SPix is collectively erased to be 1. During the erasing delay time 150 from time $t_{10}$, the threshold voltages are, for example, 0 V before the erasure, but the reading transistors RT are also in the on-state during this period. Therefore, the potentials of the nodes N1 do not change.

The power supply potential VDD is 3 V during the erasing period, but is not limited to 3 V, and may be 0 V. If the power supply potential VDD is 0 V, the reading transistors RT also perform the erasing operation, and sufficient electrons are released from the floating gates RTg. If the reading transistors RT are excessively erased (release of excessive electrons), the power supply potential VDD is preferably set to 3 V to weaken the electric field.

In the same manner as in the first embodiment, the writing of the sub-pixel data to the first memories 51 of the sub-pixels SPix is sequentially performed from the sub-pixels SPix in the first row, which are which are at a farther side from the supply side of the source signals (lower side in FIG. 11), to the sub-pixels SPix in the sixth row, which are at a closer side to the supply side of the source signals.

In the second embodiment, the order of writing of the sub-pixel data may not be fixed as is in the first embodiment, and the sub-pixel data can be written at random. However, since the sub-pixel data needs to be collectively erased (or erased block by block) before the writing operation, partial rewriting (rewriting of optional sub-pixel SPix) is practically difficult.

At time $t_{11}$ when step 1 of the writing period begins, the gate line drive circuit 9 outputs the gate signal of 10 V to the first gate line $GCL_a$ of the gate line group $GL_1$, and maintains the gate signals of 0 V of the first gate line $GCL_a$ of the gate line group $GL_2$ to the first gate line $GCL_a$ of the gate line group $GL_6$.

After the delay time 151 has elapsed from time $t_1$, the source line drive circuit 5 maintains the source signal of 0 V of the source line $SGL_1$, and outputs the source signals of 5 V in negative logic to the source lines $SGL_2$ and $SGL_3$.

Accordingly, the voltage between the drain and the source of the writing transistor WT in the first memory 51 of the sub-pixel $SPix_{1-1}$ is 0 V. As a result, no current flows between the drain and the source of the writing transistor WT in the first memory 51 of the sub-pixel $SPix_{1-1}$. Accordingly, a hot electron effect does not occur between the gate of the writing transistor WT in the first memory 51 of the sub-pixel $SPix_{1-1}$ and the semiconductor substrate. As a result, the threshold voltages of the writing transistor WT and the reading transistor RT in the first memory 51 of the sub-pixel $SPix_{1-1}$ are maintained at the voltages in the negative voltage direction (at, for example, −2 V). Accordingly, the sub-pixel data of the first memory 51 of the sub-pixel $SPix_{11}$ is maintained at 1.

A voltage of 5 V is applied between the drain and the source of the writing transistor WT in the first memory 51 of the sub-pixel $SPix_{1-2}$. The first gate line $GCL_a$ of the gate line group $GL_1$ is supplied with 10 V. Accordingly, a current flows between the drain and the source of the writing transistor WT in the first memory 51 of the sub-pixel $SPix_{1-2}$. This current generates the hot electron effect between the gate of the writing transistor WT in the first memory 51 of the sub-pixel $SPix_{1-2}$ and the semiconductor substrate.

Accordingly, electrons are injected from a drain end (or source end) of the semiconductor substrate to the floating gate WTg of the writing transistor WT in the first memory 51 of the sub-pixel $SPix_{1-2}$. This electron injection shifts the threshold voltages of the writing transistor WT and the reading transistor RT in the first memory 51 of the sub-pixel $SPix_{1-2}$ in the positive voltage direction (to, for example, +2 V). After the delay time 151 and the writing delay time 152 have elapsed from time $t_{11}$, the sub-pixel data of the first memory 51 of the sub-pixel $SPix_{1-2}$ is set to 0.

The gate line drive circuit 9 outputs the gate signal of 10 V to the first gate line $GCL_a$ of the gate line group $GL_1$, and the source line drive circuit 5 outputs the source signals of 5 V to the source lines $SGL_2$ and $SGL_3$. The voltages of the gate signal and the source signals are, however, not limited thereto. The gate signal output to the first gate line $GCL_a$ of the gate line group $GL_1$ by the gate line drive circuit 9 and the source signals output to the source lines $SGL_2$ and $SGL_3$ by the source line drive circuit 5 only need to have voltages at which the hot electron effect occurs between the gate of the writing transistor WT of the sub-pixel $SPix_{1-2}$ and the semiconductor substrate.

A voltage of 5 V is applied between the drain and the source of the writing transistor WT in the first memory 51 of the sub-pixel $SPix_{1-3}$. The first gate line $GCL_a$ of the gate line group $GL_1$ is supplied with 10 V. Accordingly, a current flows between the drain and the source of the writing transistor WT in the first memory 51 of the sub-pixel $SPix_{1-3}$. This current generates the hot electron effect between the gate of the writing transistor WT in the first memory 51 of the sub-pixel $SPix_{1-3}$ and the semiconductor substrate.

Accordingly, electrons are injected from the drain end (or source end) of the semiconductor substrate to the floating gate WTg of the writing transistor WT in the first memory 51 of the sub-pixel $SPix_{1-3}$. Accordingly, the threshold voltages of the writing transistor WT and the reading transistor RT in the first memory 51 of the sub-pixel $SPix_{1-3}$ shift in the positive voltage direction (to, for example, +2 V). After the delay time 151 and the writing delay time 152 have elapsed from time $t_{11}$, the sub-pixel data of the first memory 51 of the sub-pixel $SPix_{1-3}$ is set to 0.

The gate signals of the first gate line $GCL_a$ of the gate line group $GL_2$ to the first gate line $GCL_a$ of the gate line group $GL_6$ are maintained at 0 V. As a result, no current flows between the drain and the source of each of the writing transistors WT in the first memories 51 of the sub-pixels SPix in the second to sixth rows. Accordingly, the hot electron effect does not occur between the gate of each of the writing transistors WT in the first memories 51 of the sub-pixels SPix in the second to sixth rows and the semiconductor substrate. Accordingly, the sub-pixel data of 1 in the first memories 51 of the sub-pixels SPix in the second to sixth rows written during the erasing period is maintained.

At time $t_{12}$ when step 2 begins, the gate line drive circuit 9 outputs the gate signal of 0 V to the first gate line $GCL_a$ of the gate line group $GL_1$, outputs the gate signal of 10 V to the first gate line $GCL_a$ of the gate line group $GL_2$, and maintains the gate signals of 0 V of the first gate line $GCL_a$ of the gate line group $GL_3$ to the first gate line $GCL_a$ of the gate line group $GL_6$.

From time $t_{12}$ onward, since the gate signal of the first gate line $GCL_a$ of the gate line group $GL_1$ is at 0 V, the sub-pixel data stored in the first memories 51 of the sub-pixels $SPix_{1-1}$, $SPix_{1-2}$, and $SPix_{1-3}$ in the first row is read out. When the sub-pixel data stored in the first memory 51 of each of the sub-pixels SPix in the first row is 0, the reading transistor RT is in the off-state because the threshold voltage of the reading transistor RT is +2 V. Accordingly, the potential of the node N1 is pulled down to 0 V by the pull-down resistor 62. When the sub-pixel data stored in the first memory 51 of each of the sub-pixels SPix in the first row is 1, the reading transistor RT is in the on-state because the threshold voltage of the reading transistor RT is −2 V. Accordingly, the potential of the node N1 is set to 3 V (power supply potential VDD).

After the delay time 151 has elapsed from time $t_{12}$, the source line drive circuit 5 supplies the source signal of 5 V in negative logic to the source lines $SGL_1$ and $SGL_3$, and maintains the source signal of 0 V of the source line $SGL_2$.

Accordingly, a voltage of 5 V is applied between the drain and the source of the writing transistor WT in the first memory 51 of the sub-pixel $SPix_{2-1}$. The first gate line $GCL_a$ of the gate line group $GL_2$ is supplied with 10 V. Accordingly, a current flows between the drain and the source of the writing transistor WT in the first memory 51 of the sub-pixel $SPix_{2-1}$. This current generates the hot electron effect between the gate of the writing transistor WT in the first memory 51 of the sub-pixel $SPix_{2-1}$ and the semiconductor substrate.

Accordingly, electrons are injected from the drain end (or source end) of the semiconductor substrate to the floating gate WTg of the writing transistor WT in the first memory 51 of the sub-pixel $SPix_{2-1}$. This electron injection shifts the threshold voltages of the writing transistor WT and the reading transistor RT in the first memory 51 of the sub-pixel $SPix_{2-1}$ in the positive voltage direction (to, for example, +2 V). After the delay time 151 and the writing delay time 152 have elapsed from time $t_{19}$, the sub-pixel data of the first memory 51 of the sub-pixel $SPix_{2-1}$ is set to 0.

The voltage between the drain and the source of the writing transistor WT in the first memory 51 of the sub-pixel $SPix_{2-2}$ is 0 V. As a result, no current flows between the drain and the source of the writing transistor WT in the first memory 51 of the sub-pixel $SPix_{2-2}$. Accordingly, the hot electron effect does not occur between the gate of the writing transistor WT in the first memory 51 of the sub-pixel $SPix_{2-2}$ and the semiconductor substrate. As a result, the threshold voltages of the writing transistor WT and the reading transistor RT in the first memory 51 of the sub-pixel $SPix_{2-2}$ are maintained at the voltages in the negative voltage direction (at, for example, −2 V). Accordingly, the sub-pixel data of the first memory 51 of the sub-pixel $SPix_{2-2}$ is maintained at 1.

A voltage of 5 V is applied between the drain and the source of the writing transistor WT in the first memory 51 of the sub-pixel $SPix_{2-3}$. The first gate line $GCL_a$ of the gate line group $GL_2$ is supplied with 10 V. Accordingly, a current flows between the drain and the source of the writing transistor WT in the first memory 51 of the sub-pixel $SPix_{2-3}$. This current generates the hot electron effect between the gate of the writing transistor WT in the first memory 51 of the sub-pixel $SPix_{2-3}$ and the semiconductor substrate.

Accordingly, electrons are injected from the drain end (or source end) of the semiconductor substrate to the floating gate WTg of the writing transistor WT in the first memory 51 of the sub-pixel $SPix_{2-3}$. This electron injection shifts the threshold voltages of the writing transistor WT and the reading transistor RT in the first memory 51 of the sub-pixel $SPix_{2-3}$ in the positive voltage direction (to, for example, +2 V). After the delay time 151 and the writing delay time 152 have elapsed from time $t_{12}$, the sub-pixel data of the first memory 51 of the sub-pixel $SPix_{1-3}$ is set to 0.

The same operations as those at step 1 and step 2 described above are performed from step 3 to step 6. As a result, the sub-pixel data illustrated in FIG. 12 is written to the sub-pixels $SPix_{1-1}$ to $SPix_{6-3}$.

The display device of the second embodiment provides the same effect as that of the display device 1 of the first embodiment.

Third Embodiment

Overall Configuration

Figure 15:
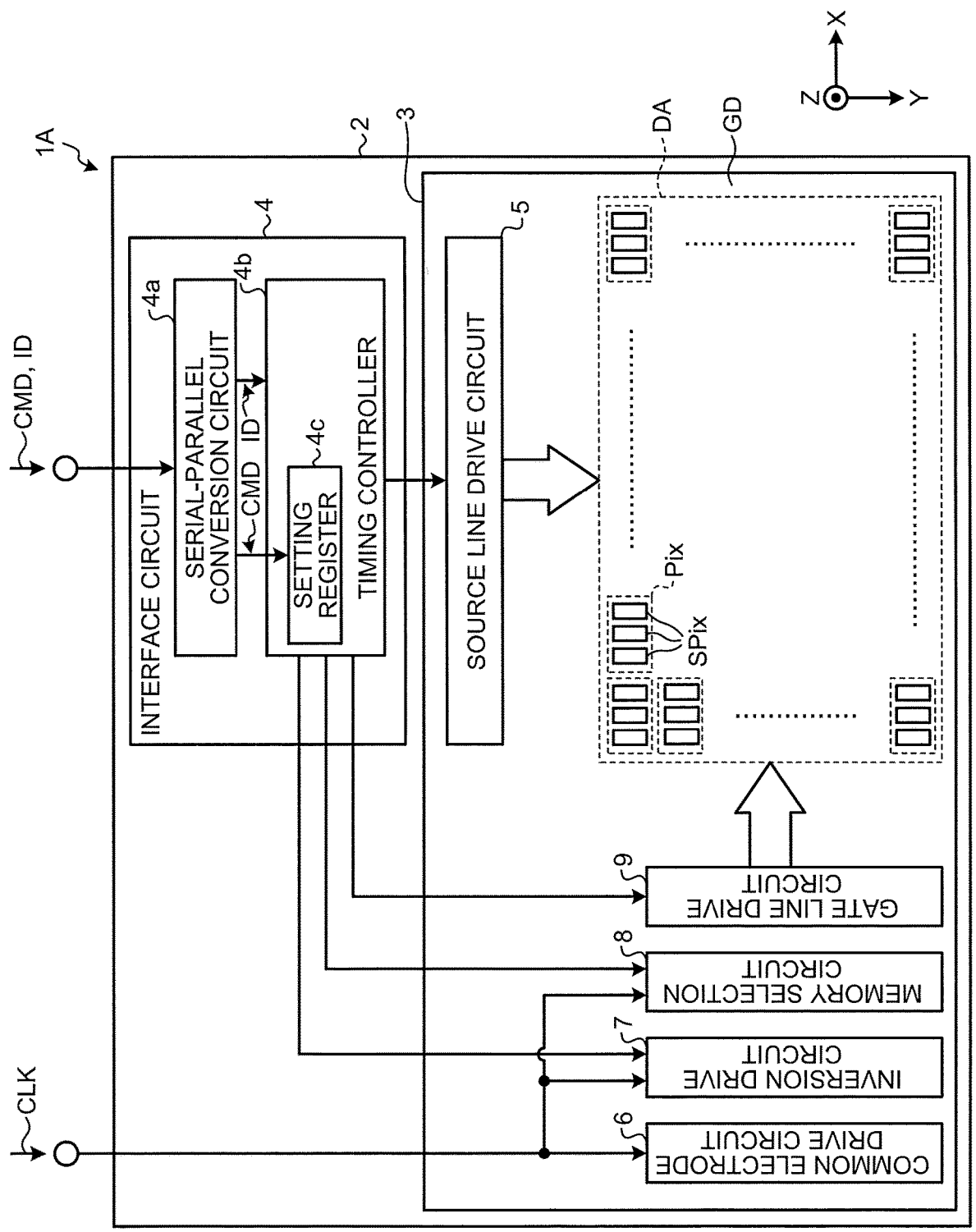
FIG. 15 is a diagram illustrating an overview of an overall configuration of a display device according to a third embodiment of the present disclosure.

FIG. 15 is a diagram illustrating an overview of an overall configuration of a display device according to a third embodiment of the present disclosure. A display device 1A of the third embodiment differs from the display device 1 of the first embodiment in further including a memory selection circuit 8.

The interface circuit 4, the source line drive circuit 5, the common electrode drive circuit 6, the inversion drive circuit 7, the memory selection circuit 8, and the gate line drive circuit 9 are disposed in the frame region GD. A configuration can also be employed in which, of these circuits, the interface circuit 4, the source line drive circuit 5, the common electrode drive circuit 6, the inversion drive circuit 7, and the memory selection circuit 8 are built into an integrated circuit (IC) chip, and the gate line drive circuit 9 is provided on the first panel. Alternatively, a configuration can be employed in which a group of the circuits built into the IC chip is provided in a processor outside the display device 1A, and the circuits are coupled to the display device 1A.

Each of the sub-pixels SPix includes a plurality of memories. In the third embodiment, the memories are three memories of a first memory to a third memory, but the present disclosure is not limited thereto. The memories may be two memories, or may be four or more memories.

In the third embodiment, since the number of the memories is three, M×N×3×3 memories are arranged in the display region DA. In the third embodiment, since each of the sub-pixels SPix includes the three memories, N×3×3 memories are arranged in one row of the M×N pixels Pix.

The display of each of the sub-pixels SPix is performed based on the sub-pixel data stored in selected one of the first to third memories included in the sub-pixel SPix. This means that a set of M×N×3×3 memories included in the M×N×3 sub-pixels SPix is equivalent to three frame memories.

A value for controlling the memory selection circuit 8 is set in the setting register 4c based on the command data CMD. The timing controller 4b controls the memory selection circuit 8 based on the value set in the setting register 4c.

The memory selection circuit 8 is supplied with the reference clock signal CLK from the external circuit.

In the MIP liquid crystal display device with each of the sub-pixels having one memory, one gate line is disposed for each row (pixel row (sub-pixel row), where the arrangement in the row direction and the column direction is defined on a sub-pixel by sub-pixel basis). In the third embodiment, however, each of the sub-pixels SPix includes the three memories of the first to third memories. Accordingly, in the third embodiment, three gate lines are arranged for each of the rows. The three gate lines are electrically coupled to the respective first to third memories of each of the sub-pixels SPix included in corresponding one of the rows. If the sub-pixels SPix are operated by, in addition to the gate signal, the inverted gate signal inverted from the gate signal, six gate lines are arranged for each of the rows.

The three or six gate lines arranged for each of the rows correspond to a gate line group of the present disclosure. In the third embodiment, since the display device 1A includes the M rows of the pixels Pix, M gate line groups are arranged therein.

The display device 1A line-sequentially scans the M rows of the pixels Pix to store the sub-pixel data of one piece of the frame data in the first memory of each of the sub-pixels SPix. The display device 1A performs the line-sequential scanning three times to store three pieces of the frame data in the first to third memories of each of the sub-pixels SPix.

In this operation, the display device 1A can employ a procedure of writing to the first memory, writing to the second memory, and writing to the third memory for each scanning operation of one row. By performing the above-described scanning on the first row to the M-th row, the display device 1A can store the sub-pixel data in the first to third memories of the respective sub-pixels SPix in single line-sequential scanning operation.

In the third embodiment, three memory selection lines are arranged for each row. The three memory selection lines are electrically coupled to the respective first to third memories of each of the N×3 sub-pixels SPix included in one row. If the sub-pixels SPix are operated by, in addition to a memory selection signal, an inverted memory selection signal inverted from the memory selection signal, six memory selection lines are arranged for each row.

The three or six memory selection lines arranged for each row correspond to a memory selection line group of the present disclosure. In the third embodiment, the display device 1A includes the M rows of the pixels Pix, and therefore, includes M memory selection line groups arranged therein.

Under the control of the timing controller 4b, the memory selection circuit 8 simultaneously selects one of the first to third memories of each of the sub-pixels SPix in synchronization with the reference clock signal CLK. More specifically, the first memories of all the sub-pixels SPix are simultaneously selected. Alternatively, the second memories of all the sub-pixels SPix are simultaneously selected. Alternatively, the third memories of all the sub-pixels SPix are simultaneously selected. Accordingly, the display device 1A can display one of three images by switching the selection of the first to third memories of each of the sub-pixels SPix. As a result, the display device 1A can change the image at once, and can change the image in a short period of time. The display device 1A can also perform animation display (moving image display) by sequentially switching the selection of the first to third memories of each of the sub-pixels SPix.

Circuit Configuration

Figure 16:
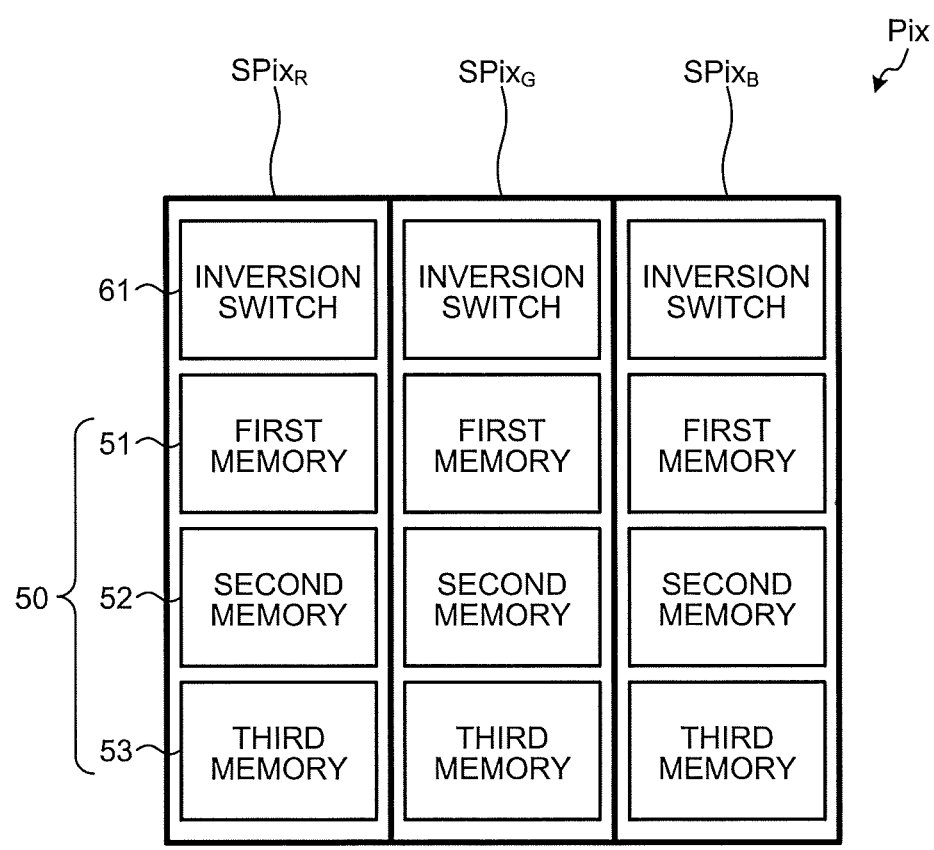
FIG. 16 is a diagram illustrating an arrangement of the sub-pixels in the pixel of the display device according to the third embodiment.

FIG. 16 is a diagram illustrating an arrangement of the sub-pixels in each of the pixels of the display device according to the third embodiment. Each of the pixels Pix includes the red (R) sub-pixel $SPix_R$, the green (G) sub-pixel $SPix_G$, and the blue (B) sub-pixel $SPix_B$.

Each of the sub-pixels $SPix_R$, $SPix_G$, and $SPix_B$ includes the memory block 50 and the inversion switch 61. The memory block 50 includes the first memory 51, a second memory 52, and a third memory 53.

Each of the first memory 51, the second memory 52, and the third memory 53 is a memory cell that stores one-bit data, but the present disclosure is not limited thereto. Each of the first memory 51, the second memory 52, and the third memory 53 may be a memory cell that stores data of two or more bits.

The inversion switch 61 is electrically coupled between the first memory 51, the second memory 52, and the third memory 53 and the sub-pixel electrode 15 (refer to FIG. 2). The inversion switch 61 outputs the display signal supplied from the inversion drive circuit 7 as it is or in an inverted form, in other words, either of the first display signal and the second display signal, to the sub-pixel electrode 15, based on the sub-pixel data output from one memory selected from the first memory 51, the second memory 52, and the third memory 53.

An inversion cycle of the display signal is the same as an inversion cycle of the potential (common potential) of the common electrode 23.

Figure 17:
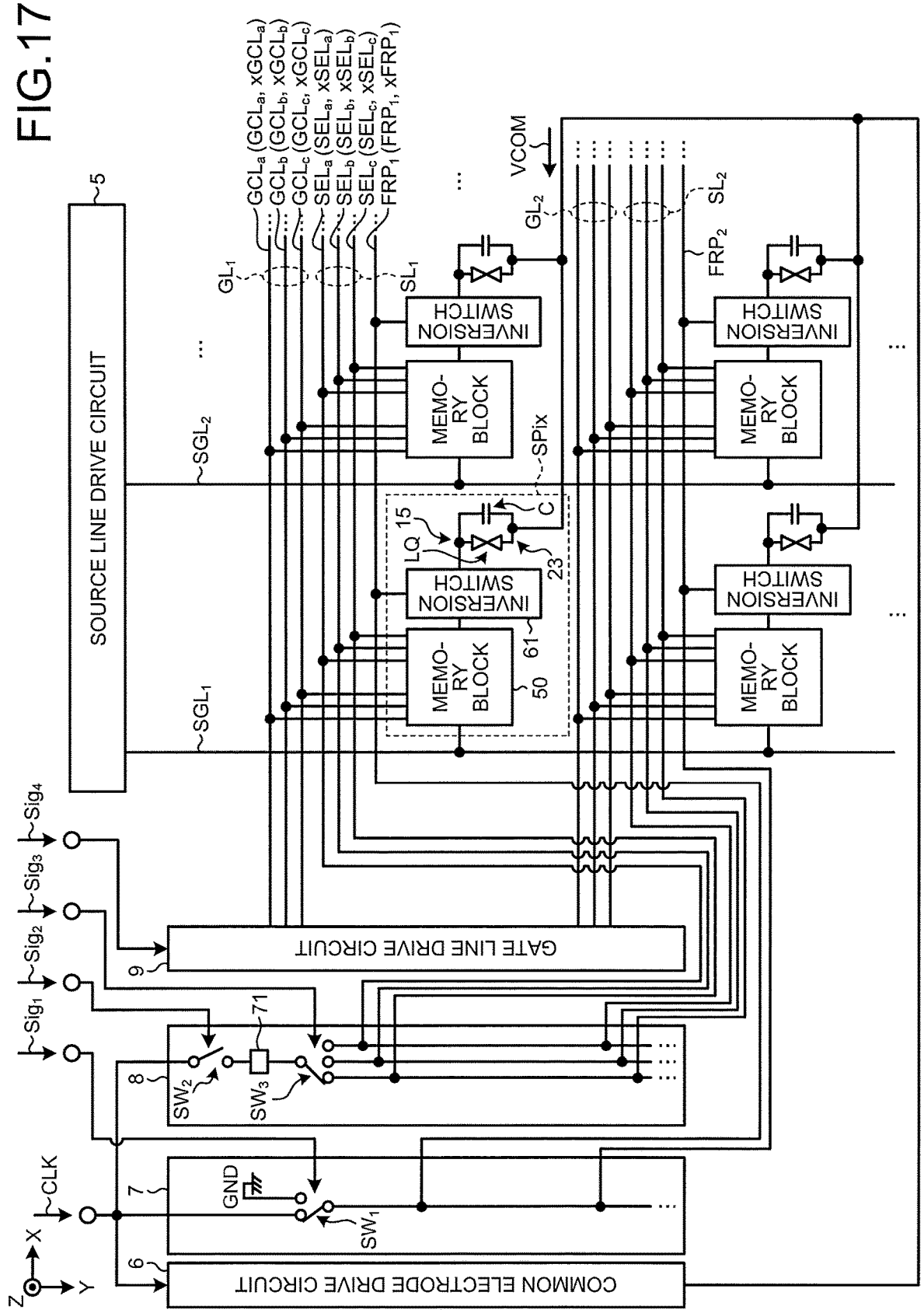
FIG. 17 is a diagram illustrating a circuit configuration of the display device according to the third embodiment.

FIG. 17 is a diagram illustrating a circuit configuration of the display device according to the third embodiment. FIG. 17 illustrates 2×2 sub-pixels SPix out of the sub-pixels SPix of M rows×(N×3) columns.

The gate line drive circuit 9 includes M×3 output terminals in accordance with the sub-pixels of the M rows each including the three memories. The gate line drive circuit 9 outputs the gate signal from each of the M×3 output terminals based on the control signal $Sig_4$ supplied from the timing controller 4b.

The M gate line groups $GL_1, GL_2, \ldots$ corresponding to the M rows of the sub-pixels SPix are arranged on the first panel 2. Each of the M gate line groups $GL_1, GL_2, \ldots$ includes the first gate line $GCL_a$ electrically coupled to the first memory 51 (refer to FIG. 16) of corresponding one of the rows, a second gate line $GCL_b$ electrically coupled to the second memory 52 (refer to FIG. 16) thereof, a third gate line $GCL_c$ electrically coupled to the third memory 53 (refer to FIG. 16) thereof. Each of the M gate line groups $GL_1, GL_2, \ldots$ extends along the X-direction in the display region DA (refer to FIG. 1).

The N×3 source lines $SGL_1, SGL_2, \ldots$ corresponding to the N×3 columns of the sub-pixels SPix are arranged on the first panel 2. Each of the source lines $SGL_1, SGL_2, \ldots$ extends along the Y-direction in the display region DA (refer to FIG. 1). The source line drive circuit 5 outputs the sub-pixel data to the three memories of each of the sub-pixels SPix selected by the gate signal through the source lines $SGL_1, SGL_2, \ldots$.

Each of the sub-pixels SPix of the row supplied with the gate signal stores the sub-pixel data supplied to the source lines SGL into one of the first memory 51 to the third memory 53 corresponding to the gate line GCL supplied with the gate signal.

The memory selection circuit 8 includes a switch $SW_2$, a latch 71, and a switch $SW_3$. The switch $SW_2$ is controlled by a control signal $Sig_2$ supplied from the timing controller 4b.

The following describes a case of displaying the image, that is, a case of reading the image data from any of the M×N×3 first memories 51, the M×N×3 second memories 52, and the M×N×3 third memories 53. In this case, the timing controller 4b outputs the control signal $Sig_2$ having the first value to the switch $SW_2$. The switch $SW_2$ is turned on based on the control signal $Sig_2$ having the first value supplied from the timing controller 4b. This operation supplies the reference clock signal CLK to the latch 71.

The following describes a case of not displaying the image, that is, a case of not reading the image data from any of the M×N×3 first memories 51, the M×N×3 second memories 52, and the M×N×3 third memories 53. In this case, the timing controller 4b outputs the control signal $Sig_2$ having the second value to the switch $SW_2$. The switch $SW_2$ is turned off based on the control signal $Sig_2$ having the second value supplied from the timing controller 4b. This operation prevents the reference clock signal CLK from being supplied to the latch 71.

When the switch $SW_2$ is on and the reference clock signal CLK is supplied, the latch 71 keeps the reference clock signal CLK at a high level for one cycle of the reference clock signal CLK. When the switch $SW_2$ is off and the reference clock signal CLK is not supplied, the latch 71 keeps the high level.

M memory selection line groups $SL_1, SL_2, \ldots$ corresponding to the M rows of the sub-pixels SPix are arranged on the first panel 2. Each of the M memory selection line groups $SL_1, SL_2, \ldots$ includes: a first memory selection line $SEL_a$ electrically coupled to the first memory 51 of corresponding one of the rows; a second memory selection line $SEL_b$ electrically coupled to the second memory 52 thereof; and a third memory selection line $SEL_c$ electrically coupled to the third memory 53 thereof. Each of the M memory selection line groups $SL_1, SL_2, \ldots$ extends along the X-direction in the display region DA (refer to FIG. 1).

The switch $SW_3$ is controlled by a control signal $Sig_3$ supplied from the timing controller 4b. If the control signal $Sig_3$ has the first value, the switch $SW_3$ electrically couples an output terminal of the latch 71 to the first memory selection line $SEL_a$ of each of the M memory selection line groups $SL_1, SL_2, \ldots$. If the control signal $Sig_3$ has the second value, the switch $SW_3$ electrically couples the output terminal of the latch 71 to the second memory selection line $SEL_b$ of each of the M memory selection line groups $SL_1, SL_2, \ldots$. If the control signal $Sig_3$ has a third value, the switch $SW_3$ electrically couples the output terminal of the latch 71 to the third memory selection line $SEL_c$ of each of the M memory selection line groups $SL_1, SL_2, \ldots$.

Each of the sub-pixels SPix modulates the liquid crystal layer based on the sub-pixel data stored in one of the first memory 51 to the third memory 53 corresponding to a memory selection line SEL supplied with the memory selection signal. As a result, the image (frame) is displayed on the display surface.

Operations

Figure 18:
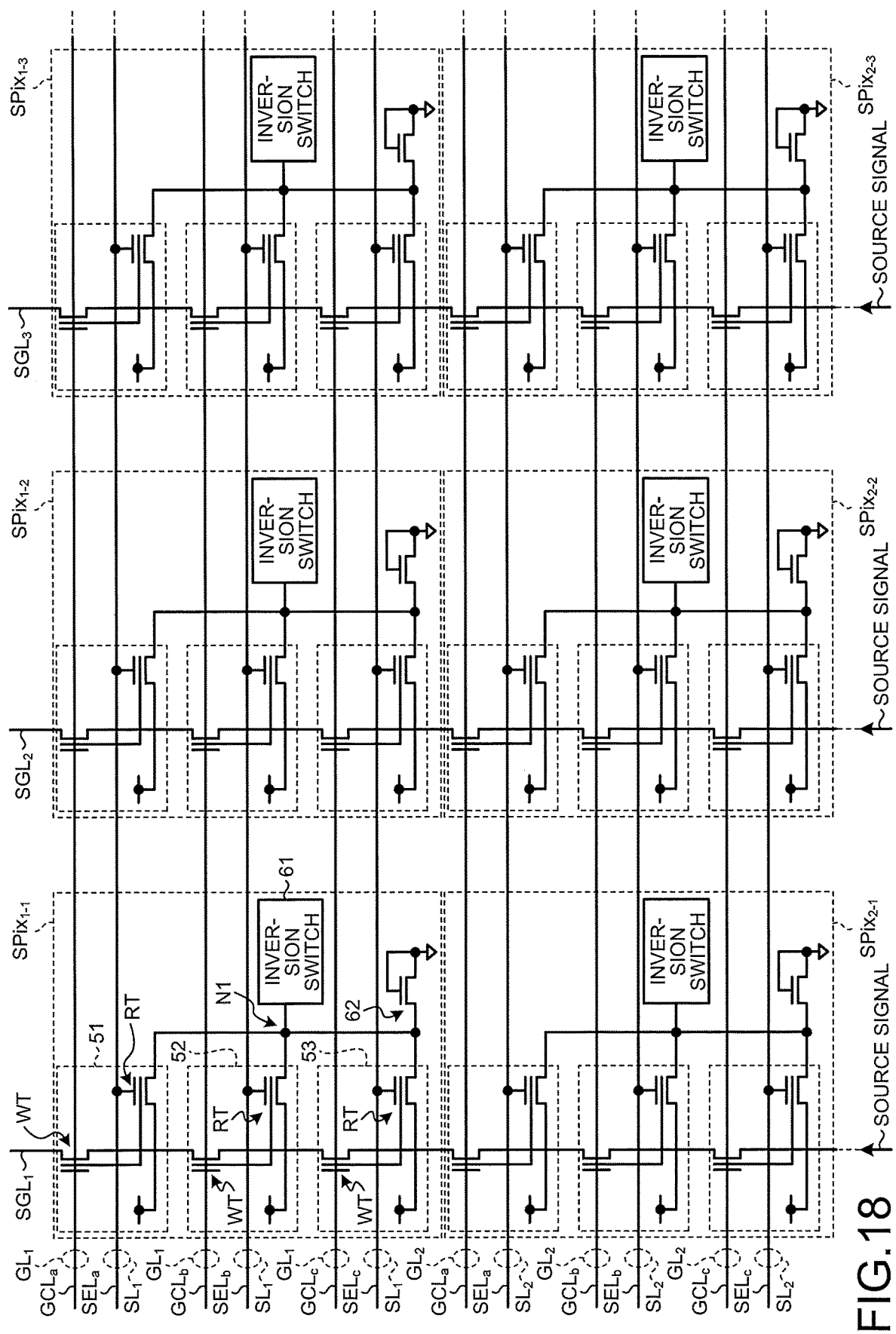
FIG. 18 is a diagram illustrating a configuration of the sub-pixels of the display device according to the third embodiment.

FIG. 18 is a diagram illustrating a configuration of the sub-pixels of the display device according to the third embodiment. FIG. 18 illustrates six sub-pixels SPix of 2 rows×3 columns out of the sub-pixels SPix of M rows×(N× 3) columns. FIG. 18 does not illustrate the display signal lines FRP, the inverted display signal lines xFRP, the liquid crystal LQ, and the retention capacitors C.

The source-drain paths of the writing transistors WT of the sub-pixels SPix in each column are coupled in series. In other words, the writing transistors WT of the sub-pixels SPix in each column are coupled in what is called the NAND architecture.

The configuration of the sub-pixels of the third embodiment differs from the configuration of the sub-pixels of the first embodiment (refer to FIG. 6) in that each of the sub-pixels SPix includes three memories. The gate of the reading transistor RT of each of the sub-pixels SPix is coupled to the memory selection line SEL.

Figure 20:
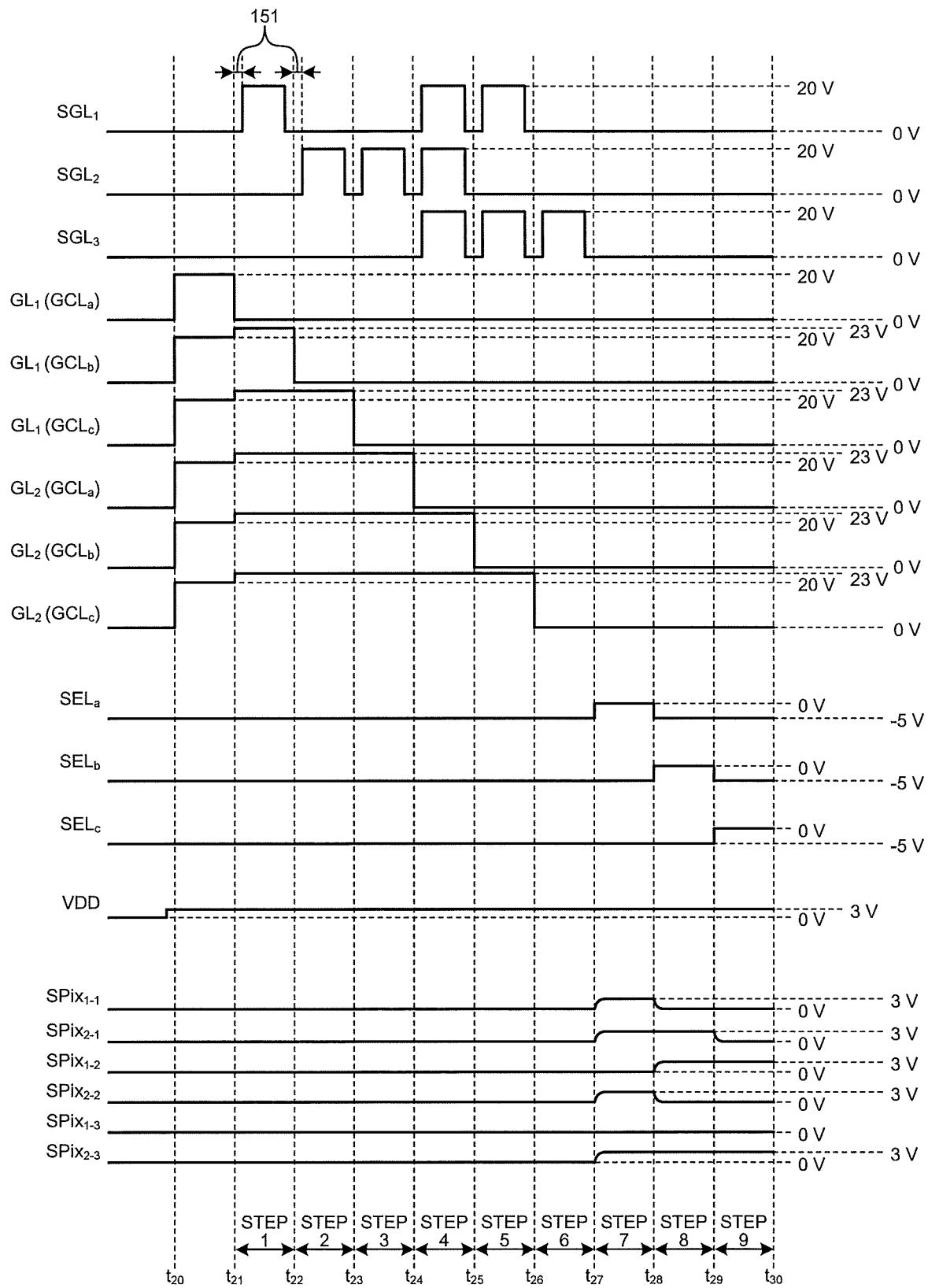
FIG. 20 is a timing diagram illustrating operation timing when the sub-pixel data is written to and read from the sub-pixels of the display device according to the third embodiment.

FIG. 19 is a diagram illustrating the sub-pixel data written to the sub-pixels of the display device according to the third embodiment. FIG. 20 is a timing diagram illustrating operation timing when the sub-pixel data is written to and read from the sub-pixels of the display device according to the third embodiment. FIG. 21 is a diagram illustrating potentials of various parts when the writing is performed to the sub-pixels of the display device according to the third embodiment. FIG. 22 is a diagram illustrating potentials of various parts when the reading is performed from the sub-pixels of the display device according to the third embodiment.

With reference to FIGS. 18 to 22, the following describes operations when the sub-pixel data is written to and read from the sub-pixels SPix of the display device 1A.

The writing transistor WT serving as the flash memory needs to be erased before being written with the sub-pixel data. In FIGS. 20 to 22, a period from time $t_{20}$ to time $t_{21}$ is the erasing period.

A period from time $t_{21}$ to time $t_{27}$ after the erasing period is the writing period. The writing period includes step 1 from time $t_{21}$ to time $t_{22}$, step 2 from time $t_{22}$ to time $t_{23}$, step 3 from time $t_{23}$ to time $t_{24}$, step 4 from time $t_{24}$ to time $t_2$, step 5 from time $t_{25}$ to time $t_{26}$, and step 6 from time $t_{26}$ to time $t_{27}$.

A period from time $t_{27}$ to time $t_{30}$ after the writing period is a reading period. The reading period includes step 7 from time $t_{27}$ to time $t_{28}$, step 8 from time $t_{28}$ to time $t_{29}$, and step 9 from time $t_{29}$ to time $t_{30}$.

Step 1 is a period of writing to the first memories 51 of the respective sub-pixels $SPix_{1-1}$, $SPix_{1-2}$, and $SPix_{1-3}$ in the first row. Step 2 is a period of writing to the second memories 52 of the respective sub-pixels $SPix_{1-1}$, $SPix_{1-2}$, and $SPix_{1-3}$ in the first row. Step 3 is a period of writing to the third memories 53 of the respective sub-pixels $SPix_{1-1}$, $SPix_{1-2}$, and $SPix_{1-3}$ in the first row.

Step 4 is a period of writing to the first memories 51 of the respective sub-pixels $SPix_{2-1}$, $SPix_{2-2}$, and $SPix_{2-3}$ in the second row. Step 5 is a period of writing to the second memories 52 of the respective sub-pixels $SPix_{2-1}$, $SPix_{2-2}$, and $SPix_{2-3}$ in the second row. Step 6 is a period of writing to the third memories 53 of the respective sub-pixels $SPix_{2-1}$, $SPix_{2-2}$, and $SPix_{2-3}$ in the second row.

Step 7 is a period of reading from the first memories 51 of the respective sub-pixels SPix. Step 8 is a period of reading from the second memories 52 of the respective sub-pixels SPix. Step 9 is a period of reading from the third memories 53 of the respective sub-pixels SPix.

Referring to FIGS. 20 and 21, at time $t_{20}$ when the erasing period begins, the gate line drive circuit 9 outputs the gate signals of 20 V to the first gate line $GCL_a$, the second gate line $GCL_b$, and the third gate line $GCL_c$ of the gate line group $GL_1$ and to the first gate line $GCL_a$, the second gate line $GCL_b$, and the third gate line $GCL_c$ of the gate line group $GL_2$. The source line drive circuit 5 outputs the source signals of 0 V to the source lines $SGL_1$, $SGL_2$, and $SGL_3$. Accordingly, the high electric field is applied between each of the gates of the writing transistors WT of all the sub-pixels SPix and the semiconductor substrate. As a result, the tunneling effect causes electrons to be injected from the semiconductor substrate into the floating gates WTg of the writing transistors WT in all the memories of all the sub-pixels SPix. The threshold voltages of the writing transistors WT and the reading transistors RT of all the sub-pixels SPix shift in the positive voltage direction (to, for example, +2 V). This means that the sub-pixel data in all the memories of all the sub-pixels SPix is collectively erased to be 0.

The power supply potential VDD is 3 V during the erasing period, but is not limited to 3 V, and may be 0 V. If the power supply potential VDD is 0 V, the reading transistors RT also perform the erasing operation, and sufficient electrons are injected into the floating gates RTg. If the reading transistors RT are excessively erased (injected with excessive electrons), the power supply potential VDD is preferably set to 3 V to weaken the electric field.

The writing of the sub-pixel data to the memories of the respective sub-pixels SPix is sequentially performed from the first memories 51 of the sub-pixels SPix in the first row, which are at a farther side from the supply side of the source signals (lower side in FIG. 18), to the third memories 53 of the sub-pixels SPix in the second row, which are at a closer side to the supply side of the source signals. In other words, the writing of the sub-pixel data to the memories of the respective sub-pixels SPix is performed in the following order: the writing of the sub-pixel data to the first memories 51 of the sub-pixels SPix in the first row (step 1); the writing of the sub-pixel data to the second memories 52 of the sub-pixels SPix in the first row (step 2); the writing of the sub-pixel data to the third memories 53 of the sub-pixels SPix in the first row (step 3); the writing of the sub-pixel data to the first memories 51 of the sub-pixels SPix in the second row (step 4); the writing of the sub-pixel data to the second memories 52 of the sub-pixels SPix in the second row (step 5); and the writing of the sub-pixel data to the third memories 53 of the sub-pixels SPix in the second row (step 6). The reason for this order is that the memories in a row closer to the supply side of the source signals than a row of a writing target may be in the erased state.

At time $t_{21}$ when step 1 of the writing period begins, the gate line drive circuit 9 outputs the gate signal of 0 V to the first gate line $GCL_a$ of the gate line group $GL_1$, and applies the gate signals of 23 V to the second gate line $GCL_b$ and the third gate line $GCL_c$ of the gate line group $GL_1$ and to the first gate line $GCL_a$, the second gate line $GCL_b$, and the third gate line $GCL_c$ of the gate line group $GL_2$.

After the delay time 151 has elapsed from time $t_{21}$, the source line drive circuit 5 outputs the source signal of 20 V in positive logic to the source line $SGL_1$, and maintains the source signals of 0 V of the source lines $SGL_2$ and $SGL_3$.

The threshold voltage of the writing transistor WT in each of the second memory 52 and the third memory 53 of the sub-pixel $SPix_{1-1}$ and the first memory 51, the second memory 52, and the third memory 53 of the sub-pixel $SPix_{2-1}$ is +2 V. A voltage of 3 V (=23 V−20 V) is applied between the gate and the drain (or the source) of the writing transistor WT in each of the second memory 52 and the third memory 53 of the sub-pixel $SPix_{1-1}$ and the first memory 51, the second memory 52, and the third memory 53 of the sub-pixel $SPix_{2-1}$. Accordingly, the writing transistor WT in each of the second memory 52 and the third memory 53 of the sub-pixel $SPix_{1-1}$ and the first memory 51, the second memory 52, and the third memory 53 of the sub-pixel $SPix_{2-1}$ is turned on. As a result, the voltage of the source signal of 20 V supplied to the source line $SGL_1$ reaches the drain (or the source) of the writing transistor WT in the first memory 51 of the sub-pixel $SPix_{1-1}$ through the writing transistor WT in each of the second memory 52 and the third memory 53 of the sub-pixel $SPix_{1-1}$ and the first memory 51, the second memory 52, and the third memory 53 of the sub-pixel $SPix_{2-1}$.

Accordingly, a voltage of −20 V (=0 V−20 V) is applied between the gate and the drain (or the source) of the writing transistor WT of the sub-pixel $SPix_{1-1}$. As a result, the tunneling effect causes electrons in the floating gate WTg of the writing transistor WT in the first memory 51 of the sub-pixel $SPix_{1-1}$ to be released to the semiconductor substrate. Accordingly, the threshold voltages of the writing transistor WT and the reading transistor RT in the first memory 51 of the sub-pixel $SPix_{1-1}$ shift in the negative voltage direction (to, for example, −2 V). As a result, the sub-pixel data of the first memory 51 of the sub-pixel $SPix_{1-1}$ is set to 1.

A voltage of 23 V (=23 V−0 V) is applied between the gate and the drain (or the source) of the writing transistor WT in each of the second memory 52 and the third memory 53 of the sub-pixel $SPix_{1-2}$ and the first memory 51, the second memory 52, and the third memory 53 of the sub-pixel $SPix_{2-2}$. Accordingly, the sub-pixel data of 0 is written once again to the writing transistor WT in each of the second memory 52 and the third memory 53 of the sub-pixel $SPix_{1-2}$ and the first memory 51, the second memory 52, and the third memory 53 of the sub-pixel $SPix_{2-2}$ in the same manner as during the erasing period. This operation causes no problem because the sub-pixel data has not yet been written to the writing transistor WT in each of the second memory 52 and the third memory 53 of the sub-pixel $SPix_{1-2}$ and the first memory 51, the second memory 52, and the third memory 53 of the sub-pixel $SPix_{2-2}$.

Since the source signal of the source line $SGL_2$ is maintained at 0 V, the tunneling effect does not occur in the writing transistor WT in the first memory 51 of the sub-pixel SPix$_{1-2}$. Accordingly, the sub-pixel data of 0 in the first memory 51 of the sub-pixel SPix$_{1-2}$ written during the erasing period is maintained.

A voltage of 23 V (=23 V−0 V) is applied between the gate and the drain (or the source) of the writing transistor WT in each of the second memory 52 and the third memory 53 of the sub-pixel SPix$_{1-3}$ and the first memory 51, the second memory 52, and the third memory 53 of the sub-pixel SPix$_{2-3}$. Accordingly, the sub-pixel data of 0 is written once again to the writing transistor WT in each of the second memory 52 and the third memory 53 of the sub-pixel SPix$_{1-3}$ and the first memory 51, the second memory 52, and the third memory 53 of the sub-pixel SPix$_{2-3}$ in the same manner as during the erasing period. This operation causes no problem because the sub-pixel data has not yet been written to the writing transistor WT in each of the second memory 52 and the third memory 53 of the sub-pixel SPix$_{1-3}$, and the first memory 51, the second memory 52, and the third memory 53 of the sub-pixel SPix$_{2-3}$.

Since the source signal of the source line SGL$_3$ is maintained at 0 V, the tunneling effect does not occur in the writing transistor WT in the first memory 51 of the sub-pixel SPix$_{1-3}$. Accordingly, the sub-pixel data of 0 in the first memory 51 of the sub-pixel SPix$_{1-3}$ written during the erasing period is maintained.

At time $t_{22}$ when step 2 begins, the gate line drive circuit 9 maintains the gate signal of 0 V of the first gate line GCL$_a$ of the gate line group GL$_1$, outputs the gate signal of 0 V to the second gate line GCL$_b$ of the gate line group GL$_1$, and maintains the gate signals of 23 V of the third gate line GCL$_c$ of the gate line group GL$_1$ and the first gate line GCL$_a$, the second gate line GCL$_b$, and the third gate line GCL$_c$ of the gate line group GL$_2$.

Since the gate signal of 0 V is applied to the second gate line GCL$_b$ of the gate line group GL$_1$, there is no conduction between the source and the drain of the writing transistor WT in the second memory 52 of each of the sub-pixels SPix$_{11}$, SPix$_{1-2}$, and SPix$_{1-3}$. Accordingly, the writing of the sub-pixel data to the second memory 52 of each of the sub-pixels SPix$_{1-1}$, SPix$_{1-2}$, and SPix$_{1-3}$ does not affect the sub-pixel data written in the first memory 51 of each of the sub-pixels SPix$_{1-1}$, SPix$_{1-2}$, and SPix$_{1-3}$.

After the delay time 151 has elapsed from time $t_{22}$, the source line drive circuit 5 outputs the source signal of 0 V to the source line SGL$_1$, outputs the source signal of 20 V in positive logic to the source line SGL$_2$, and maintains the source signal of 0 V of the source line SGL$_3$.

A voltage of 23 V (=23 V−0 V) is applied between the gate and the drain (or the source) of the writing transistor WT in each of the third memory 53 of the sub-pixel SPix$_{1-1}$ and the first memory 51, the second memory 52, and the third memory 53 of the sub-pixel SPix$_{2-1}$.

Accordingly, the sub-pixel data of 0 is written once again to the writing transistor WT in each of the third memory 53 of the sub-pixel SPix$_{1-1}$ and the first memory 51, the second memory 52, and the third memory 53 of the sub-pixel SPix$_{2-1}$ in the same manner as during the erasing period. This operation causes no problem because the sub-pixel data has not yet been written to the writing transistor WT in each of the third memory 53 of the sub-pixel SPix$_{1-1}$ and the first memory 51, the second memory 52, and the third memory 53 of the sub-pixel SPix$_{2-1}$.

Since the source signal of the source line SGL$_1$ is maintained at 0 V, the tunneling effect does not occur in the writing transistor WT in the second memory 52 of the sub-pixel SPix$_{1-1}$. Accordingly, the sub-pixel data of 0 of the second memory 52 of the sub-pixel SPix$_{1-1}$ written during the erasing period is maintained.

The threshold voltage of the writing transistor WT in each of the third memory 53 of the sub-pixel SPix$_{1-2}$ and the first memory 51, the second memory 52, and the third memory 53 of the sub-pixel SPix$_{2-2}$ is +2 V. A voltage of 3 V (=23 V−20 V) is applied between the gate and the drain (or the source) of the writing transistor WT in each of the third memory 53 of the sub-pixel SPix$_{1-2}$ and the first memory 51, the second memory 52, and the third memory 53 of the sub-pixel SPix$_{2-2}$. Accordingly, the writing transistor WT in each of the third memory 53 of the sub-pixel SPix$_{1-2}$ and the first memory 51, the second memory 52, and the third memory 53 of the sub-pixel SPix$_{2-2}$ is turned on. As a result, the voltage of the source signal of 20 V supplied to the source line SGL$_2$ reaches the drain (or the source) of the writing transistor WT in the second memory 52 of the sub-pixel SPix$_{1-2}$ through the writing transistor WT in each of the third memory 53 of the sub-pixel SPix$_{1-2}$ and the first memory 51, the second memory 52, and the third memory 53 of the sub-pixel SPix$_{2-2}$.

Accordingly, a voltage of −20 V (=0 V−20 V) is applied between the gate and the drain (or the source) of the writing transistor WT of the sub-pixel SPix$_{1-2}$. As a result, the tunneling effect causes electrons in the floating gate WTg of the writing transistor WT in the second memory 52 of the sub-pixel SPix$_{1-2}$ to be released to the semiconductor substrate. Accordingly, the threshold voltages of the writing transistor WT and the reading transistor RT in the second memory 52 of the sub-pixel SPix$_{1-2}$ shift in the negative voltage direction (to, for example, −2 V). Accordingly, the sub-pixel data of the second memory 52 of the sub-pixel SPix$_{1-2}$ is set to 1.

A voltage of 23 V (=23 V−0 V) is applied between the gate and the drain (or the source) of the writing transistor WT in each of the third memory 53 of the sub-pixel SPix$_{1-3}$ and the first memory 51, the second memory 52, and the third memory 53 of the sub-pixel SPix$_{2-3}$.

Accordingly, the sub-pixel data of 0 is written once again to the writing transistor WT in each of the third memory 53 of the sub-pixel SPix$_{1-3}$ and the first memory 51, the second memory 52, and the third memory 53 of the sub-pixel SPix$_{2-3}$ in the same manner as during the erasing period. This operation causes no problem because the sub-pixel data has not yet been written to the writing transistor WT in each of the third memory 53 of the sub-pixel SPix$_{1-3}$ and the first memory 51, the second memory 52, and the third memory 53 of the sub-pixel SPix$_{2-3}$.

Since the source signal of the source line SGL$_3$ is maintained at 0 V, the tunneling effect does not occur in the writing transistor WT in the second memory 52 of the sub-pixel SPix$_{1-3}$. Accordingly, the sub-pixel data of 0 in the second memory 52 of the sub-pixel SPix$_{1-3}$ written during the erasing period is maintained.

The same operations as those at step 1 and step 2 described above are performed from step 3 to step 6. As a result, the sub-pixel data illustrated in FIG. 19 is written to the sub-pixels SPix$_{1-1}$ to SPix$_{2-3}$.

At time $t_2$, when step 7 of the reading period begins, the memory selection circuit 8 outputs the memory selection signal of 0 V to the first memory selection line SEL$_a$ of each of the memory selection line groups SL$_1$ and SL$_2$, and outputs the memory selection signals of −5 V to the second memory selection line SEL$_b$ and the third memory selection line SEL$_c$ of each of the memory selection line groups SL$_1$ and SL$_2$.

The memory selection circuit 8 outputs the memory selection signals of −5 V to the second memory selection line $SEL_b$ and the third memory selection line $SEL_c$ of each of the memory selection line groups $SL_1$ and $SL_2$, but the voltage of the memory selection signals is not limited thereto. The voltage of the memory selection signals output by the memory selection circuit 8 to the second memory selection line $SEL_b$ and the third memory selection line $SEL_c$ of each of the memory selection line groups $SL_1$ and $SL_2$ only needs to be lower than the threshold voltage in the negative voltage direction (for example, −2 V). Accordingly, the memory selection circuit 8 may output, for example, the memory selection signals of −4.5 V to the second memory selection line $SEL_b$ and the third memory selection line $SEL_c$ of each of the memory selection line groups $SL_1$ and $SL_2$.

The memory selection signal of 0 V output to the first memory selection line $SEL_a$ of each of the memory selection line groups $SL_1$ and $SL_2$ is supplied to the gate of the reading transistor RT in the first memory 51 of each of the corresponding ones of the sub-pixels SPix. The memory selection signals of −5 V output to the second memory selection line SELb and the third memory selection line SELc of each of the memory selection line groups $SL_1$ and $SL_2$ are supplied to the gates of the reading transistors RT in the second memory 52 and the third memory 53, respectively, of each of the corresponding ones of the sub-pixels SPix.

The threshold voltage of the reading transistor RT in the first memory 51 of the sub-pixel $SPix_{1-1}$ is −2 V. Accordingly, the reading transistor RT in the first memory 51 of the sub-pixel $SPix_{1-1}$ is turned on. This operation sets the potential of the node N1 of the sub-pixel $SPix_{1-1}$ to 3 V (power supply potential VDD).

The threshold voltage of the reading transistor RT in the first memory 51 of the sub-pixel $SPix_{2-1}$ is −2 V. Accordingly, the reading transistor RT in the first memory 51 of the sub-pixel $SPix_{2-1}$ is turned on. This operation sets the potential of the node N1 of the sub-pixel $SPix_{2-1}$ to 3 V (power supply potential VDD).

The threshold voltage of the reading transistor RT in the first memory 51 of the sub-pixel $SPix_{1-2}$ is +2 V. Accordingly, the reading transistor RT in the first memory 51 of the sub-pixel $SPix_{1-2}$ is turned off. Accordingly, the potential of the node N1 of the sub-pixel $SPix_{1-2}$ is pulled down to 0 V by the pull-down resistor 62.

The threshold voltage of the reading transistor RT in the first memory 51 of the sub-pixel $SPix_{2-2}$ is −2 V. Accordingly, the reading transistor RT in the first memory 51 of the sub-pixel $SPix_{2-2}$ is turned on. This operation sets the potential of the node N1 of the sub-pixel $SPix_{2-2}$ to 3 V (power supply potential VDD).

The threshold voltage of the reading transistor RT in the first memory 51 of the sub-pixel $SPix_{1-3}$ is +2 V. Accordingly, the reading transistor RT in the first memory 51 of the sub-pixel $SPix_{1-3}$ is turned off. Accordingly, the potential of the node N1 of the sub-pixel $SPix_{1-3}$ is pulled down to 0 V by the pull-down resistor 62.

The threshold voltage of the reading transistor RT in the first memory 51 of the sub-pixel $SPix_{2-3}$ is −2 V. Accordingly, the reading transistor RT in the first memory 51 of the sub-pixel $SPix_{2-3}$ is turned on. This operation sets the potential of the node N1 of the sub-pixel $SPix_{2-3}$ to 3 V (power supply potential VDD).

The same operation as that at step 7 described above is performed at step 8 and step 9. As a result, the sub-pixel data illustrated in FIG. 19 is read from the first memory 51, the second memory 52, and the third memory 53 of each of the sub-pixels $SPix_{1-1}$ to $SPix_{2-3}$.

The display device 1A of the third embodiment provides the same effect as that of the display device 1 of the first embodiment.

Furthermore, in the display device 1A of the third embodiment, each of the sub-pixels SPix can store three pieces of sub-pixel data. The display device 1A can read the three pieces of sub-pixel data one piece by one piece for each of the sub-pixels SPix. As a result, the display device 1A can perform the animation display (moving image display).

Fourth Embodiment

A display device according to a fourth embodiment of the present disclosure has the same overall configuration as that of the display device 1A of the third embodiment, and therefore will not be illustrated or described.

Figure 23:
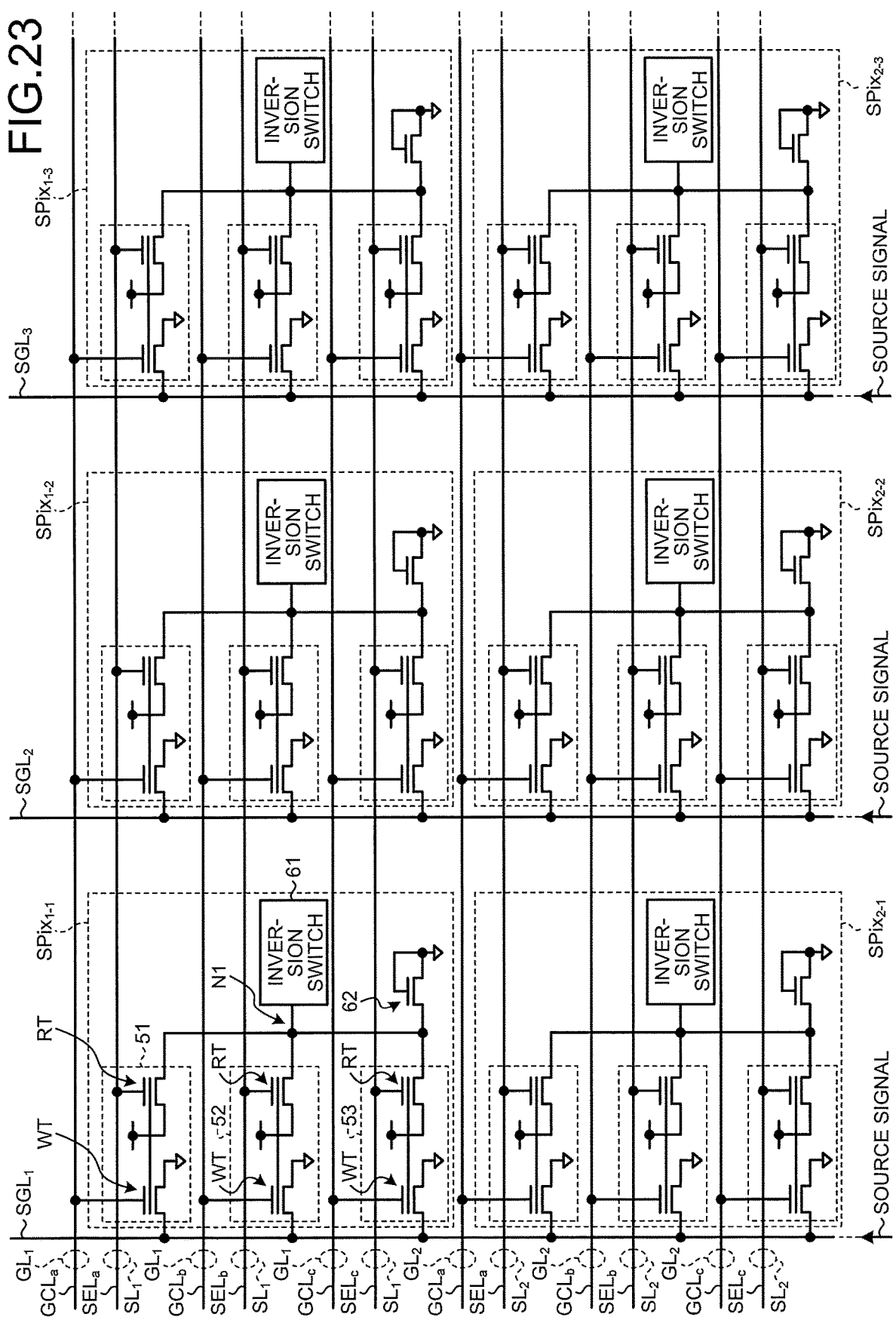
FIG. 23 is a diagram illustrating a configuration of the sub-pixels of a display device according to a fourth embodiment of the present disclosure.

FIG. 23 is a diagram illustrating a configuration of the sub-pixels of the display device according to the fourth embodiment. FIG. 23 illustrates six sub-pixels SPix of 2 rows×3 columns out of the sub-pixels SPix of M rows×(N× 3) columns. FIG. 23 does not illustrate the display signal lines FRP, the inverted display signal lines xFRP, the liquid crystal LQ, and the retention capacitors C.

The configuration of the sub-pixels of the fourth embodiment differs from the configuration of the sub-pixels of the third embodiment (refer to FIG. 18) in the coupling of the writing transistors WT. One of the drain and the source of the writing transistor WT in each of the sub-pixels SPix is coupled to the reference potential. The other of the drain and the source of the writing transistor WT in each of the sub-pixels SPix is coupled to the source line SGL. In other words, the source-drain paths of the writing transistors WT of the sub-pixels SPix in each column are coupled in parallel. Accordingly, the writing transistors WT of the sub-pixels SPix in each column are coupled in what is called the NOR architecture.

Figure 25:
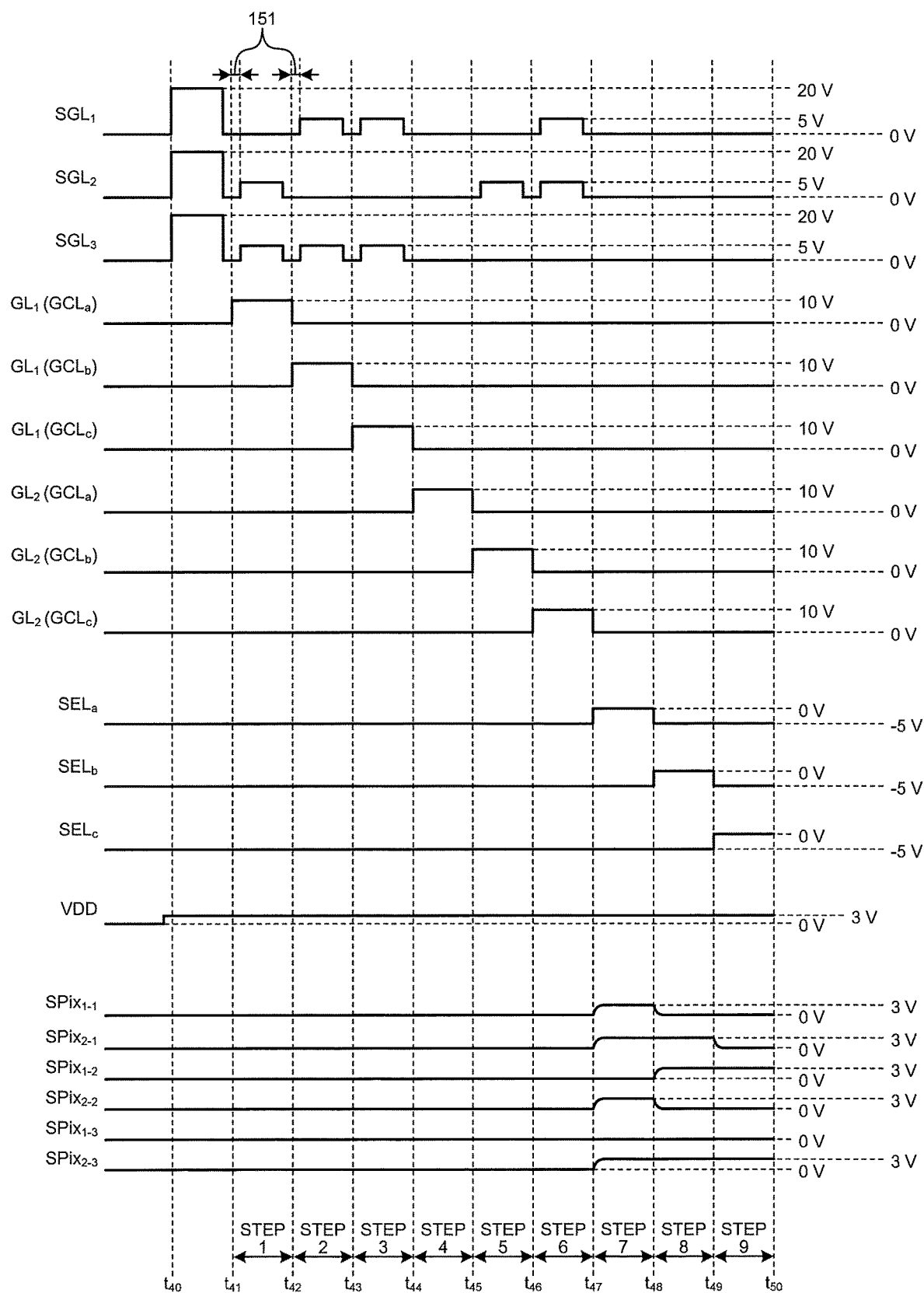
FIG. 25 is a timing diagram illustrating operation timing when the sub-pixel data is written to and read from the sub-pixels of the display device according to the fourth embodiment.

FIG. 24 is a diagram illustrating the sub-pixel data written to the sub-pixels of the display device according to the fourth embodiment. FIG. 25 is a timing diagram illustrating operation timing when the sub-pixel data is written to and read from the sub-pixels of the display device according to the fourth embodiment. FIG. 26 is a diagram illustrating the potentials of the various parts when the writing is performed to the sub-pixels of the display device according to the fourth embodiment. FIG. 27 is a diagram illustrating the potentials of the various parts when the reading is performed from the sub-pixels of the display device according to the fourth embodiment.

With reference to FIGS. 24 to 27, the following describes operations when the sub-pixel data is written to and read from the sub-pixels SPix of the display device of the fourth embodiment.

The writing transistor WT serving as the flash memory needs to be erased before being written with the sub-pixel data. In FIGS. 25 to 27, a period from time $t_{40}$ to time $t_{41}$ is the erasing period.

A period from time $t_{41}$ to time $t_{47}$ after the erasing period is the writing period. The writing period includes step 1 from time $t_{41}$ to time $t_{42}$, step 2 from time $t_{42}$ to time $t_{43}$, step 3 from time $t_{43}$ to time $t_{44}$, step 4 from time $t_{44}$ to time $t_{45}$, step 5 from time $t_{45}$ to time $t_{46}$, and step 6 from time $t_{46}$ to time $t_{47}$.

A period from time $t_{47}$ to time $t_{50}$ after the writing period is the reading period. The reading period includes step 7 from time $t_{47}$ to time $t_{48}$, step 8 from time $t_{40}$ to time $t_{49}$, and step 9 from time $t_{49}$ to time $t_{50}$.

Step 1 is a period of writing to the first memories 51 of the respective sub-pixels $SPix_{1-1}$, $SPix_{1-2}$, and $SPix_{1-3}$ in the first row. Step 2 is a period of writing to the second memories 52 of the respective sub-pixels $SPix_{1-1}$, $SPix_{1-2}$, and $SPix_{1-3}$ in the first row. Step 3 is a period of writing to the third memories 53 of the respective sub-pixels $SPix_{1-1}$, $SPix_{1-2}$, and $SPix_{1-3}$ in the first row.

Step 4 is a period of writing to the first memories 51 of the respective sub-pixels $SPix_{2-1}$, $SPix_{2-2}$, and $SPix_{2-3}$ in the second row. Step 5 is a period of writing to the second memories 52 of the respective sub-pixels $SPix_{2-1}$, $SPix_{2-2}$, and $SPix_{2-3}$ in the second row. Step 6 is a period of writing to the third memories 53 of the respective sub-pixels $SPix_{2-1}$, $SPix_{2-2}$, and $SPix_{2-3}$ in the second row.

Step 7 is a period of reading from the first memories 51 of the respective sub-pixels SPix. Step 8 is a period of reading from the second memories 52 of the respective sub-pixels SPix. Step 9 is a period of reading from the third memories 53 of the respective sub-pixels SPix.

Referring to FIGS. 25 and 26, at time $t_{40}$ when the erasing period begins, the gate line drive circuit 9 outputs the gate signals of 0 V to the first gate line $GCL_a$, the second gate line $GCL_b$, and the third gate line $GCL_c$ of the gate line group $GL_1$ and to the first gate line $GCL_a$, the second gate line $GCL_b$, and the third gate line $GCL_c$ of the gate line group $GL_2$. The source line drive circuit 5 outputs the source signals of 20 V to the source lines $SGL_1$, $SGL_2$, and $SGL_3$. Accordingly, the high electric field is applied between each of the gates of the writing transistors WT of all the sub-pixels SPix and the semiconductor substrate. As a result, the tunneling effect causes electrons in the floating gates WTg of all the sub-pixels SPix to be released to the semiconductor substrate. Accordingly, the threshold voltages of the writing transistors WT and the reading transistors RT of all the sub-pixels SPix shift in the negative voltage direction (to, for example, −2 V). This means that the sub-pixel data in the first memory 51, the second memory 52, and the third memory 53 of all the sub-pixels SPix is collectively erased to be 1.

The power supply potential VDD is 3 V during the erasing period, but is not limited to 3 V, and may be 0 V. If the power supply potential VDD is 0 V, the reading transistors RT also perform the erasing operation, and sufficient electrons are released from the floating gates RTg. If the reading transistors RT are excessively erased (release of excessive electrons), the power supply potential VDD is preferably set to 3 V to weaken the electric field.

The writing of the sub-pixel data to the memories of the respective sub-pixels SPix is sequentially performed from the first memories 51 of the sub-pixels SPix in the first row, which are at a farther side from the supply side of the source signals (lower side in FIG. 23), to the third memories 53 of the sub-pixels SPix in the second row, which are at a closer side to the supply side of the source signals. In other words, the writing of the sub-pixel data to the memories of the respective sub-pixels SPix is performed in the following order: the writing of the sub-pixel data to the first memories 51 of the sub-pixels SPix in the first row (step 1); the writing of the sub-pixel data to the second memories 52 of the sub-pixels SPix in the first row (step 2); the writing of the sub-pixel data to the third memories 53 of the sub-pixels SPix in the first row (step 3); the writing of the sub-pixel data to the first memories 51 of the sub-pixels SPix in the second row (step 4); the writing of the sub-pixel data to the second memories 52 of the sub-pixels SPix in the second row (step 5); and the writing of the sub-pixel data to the third memories 53 of the sub-pixels SPix in the second row (step 6). The reason for this order is that the memories in a row closer to the supply side of the source signals than a row of a writing target may be in the erased state.

In the four embodiment, the order of writing of the sub-pixel data may not be fixed as is in the third embodiment, and can be written at random. However, since the sub-pixel data needs to be collectively erased (or erased block by block), partial rewriting (rewriting of optional sub-pixel SPix) is practically difficult.

At time $t_{41}$ when step 1 of the writing period begins, the gate line drive circuit 9 outputs the gate signal of 10 V to the first gate line $GCL_a$ of the gate line group $GL_1$, and maintains the gate signals of 0 V of the second gate line $GCL_b$ and the third gate line $GCL_c$ of the gate line group $GL_1$ and the first gate line $GCL_a$, the second gate line $GCL_b$, and the third gate line $GCL_c$ of the gate line group $GL_2$.

After the delay time 151 has elapsed from time $t_{41}$, the source line drive circuit 5 maintains the source signal of 0 V of the source line $SGL_1$, and outputs the source signals of 5 V in negative logic to the source lines $SGL_2$ and $SGL_3$.

Accordingly, the voltage between the drain and the source of the writing transistor WT in the first memory 51 of the sub-pixel $SPix_{1-1}$ is 0 V. As a result, no current flows between the drain and the source of the writing transistor WT in the first memory 51 of the sub-pixel $SPix_{1-1}$. Accordingly, the hot electron effect does not occur between the gate of the writing transistor WT in the first memory 51 of the sub-pixel $SPix_{1-1}$ and the semiconductor substrate. As a result, the threshold voltages of the writing transistor WT and the reading transistor RT in the first memory 51 of the sub-pixel $SPix_{1-1}$ are maintained at the voltages in the negative voltage direction (to, for example, −2 V). Consequently, the sub-pixel data of the first memory 51 of the sub-pixel $SPix_{1-1}$ is maintained at 1.

A voltage of 5 V is applied between the drain and the source of the writing transistor WT in the first memory 51 of the sub-pixel $SPix_{1-2}$. The first gate line $GCL_a$ of the gate line group $GL_1$ is supplied with 10 V. Accordingly, a current flows between the drain and the source of the writing transistor WT in the first memory 51 of the sub-pixel $SPix_{1-2}$. This current generates the hot electron effect between the gate of the writing transistor WT in the first memory 51 of the sub-pixel $SPix_{1-2}$ and the semiconductor substrate.

Accordingly, electrons are injected from the drain end (or source end) of the semiconductor substrate to the floating gate WTg of the writing transistor WT in the first memory 51 of the sub-pixel $SPix_{1-2}$. This electron injection shifts the threshold voltages of the writing transistor WT and the reading transistor RT in the first memory 51 of the sub-pixel $SPix_{1-2}$ in the positive voltage direction (to, for example, +2 V). Accordingly, the sub-pixel data of the first memory 51 of the sub-pixel $SPix_{1-2}$ is set to 0.

A voltage of 5 V is applied between the drain and the source of the writing transistor WT in the first memory 51 of the sub-pixel $SPix_{13}$. The first gate line $GCL_a$ of the gate line group $GL_1$ is supplied with 10 V. Accordingly, a current flows between the drain and the source of the writing transistor WT in the first memory 51 of the sub-pixel $SPix_{1-3}$. This current generates the hot electron effect between the gate of the writing transistor WT in the first memory 51 of the sub-pixel $SPix_{1-3}$ and the semiconductor substrate.

Accordingly, electrons are injected from the drain end (or source end) of the semiconductor substrate to the floating gate WTg of the writing transistor WT in the first memory 51 of the sub-pixel $SPix_{1-3}$. This electron injection shifts the threshold voltages of the writing transistor WT and the reading transistor RT in the first memory 51 of the sub-pixel $SPix_{1-3}$ in the positive voltage direction (to, for example, +2 V). Accordingly, the sub-pixel data of the first memory 51 of the sub-pixel $SPix_{1-3}$ is set to 0.

The gate signals of the second gate line $GCL_b$ and the third gate line $GCL_c$ of the gate line group $GL_1$ and the first gate line $GCL_a$, the second gate line $GCL_b$, and the third gate line $GCL_c$ of the gate line group $GL_2$ are maintained at 0 V. Accordingly, no current flows between the drain and the source of the writing transistor WT in each of the second memory 52 and the third memory 53 of the sub-pixel $SPix_{1-1}$, the second memory 52 and the third memory 53 of the sub-pixel $SPix_{1-2}$, the second memory 52 and the third memory 53 of the sub-pixel $SPix_{1-3}$, the first memory 51, the second memory 52, and the third memory 53 of the sub-pixel $SPix_{2-1}$, the first memory 51, the second memory 52, and the third memory 53 of the sub-pixel $SPix_{2-2}$, and the first memory 51, the second memory 52, and the third memory 53 of the sub-pixel $SPix_{2-3}$.

Accordingly, the hot electron effect does not occur between the gate of the writing transistor WT in each of the second memory 52 and the third memory 53 of the sub-pixel $SPix_{1-1}$, the second memory 52 and the third memory 53 of the sub-pixel $SPix_{1-2}$, the second memory 52 and the third memory 53 of the sub-pixel $SPix_{1-3}$, the first memory 51, the second memory 52, and the third memory 53 of the sub-pixel $SPix_{2-1}$, the first memory 51, the second memory 52, and the third memory 53 of the sub-pixel $SPix_{2-2}$, and the first memory 51, the second memory 52, and the third memory 53 of the sub-pixel $SPix_{2-3}$ and the semiconductor substrate.

Accordingly, the sub-pixel data of each of the second memory 52 and the third memory 53 of the sub-pixel $SPix_{1-1}$, the second memory 52 and the third memory 53 of the sub-pixel $SPix_{1-2}$, the second memory 52 and the third memory 53 of the sub-pixel $SPix_{1-3}$, the first memory 51, the second memory 52, and the third memory 53 of the sub-pixel $SPix_{2-1}$, the first memory 51, the second memory 52, and the third memory 53 of the sub-pixel $SPix_{2-2}$, and the first memory 51, the second memory 52, and the third memory 53 of the sub-pixel $SPix_{2-3}$ that has been written during the erasing period is maintained at 1.

At time $t_4$, when step 2 begins, the gate line drive circuit 9 outputs the gate signal of 0 V to the first gate line $GCL_a$ of the gate line group $GL_1$, outputs the gate signal of 10 V to the second gate line $GCL_b$ of the gate line group $GL_1$, and maintains the gate signals of 0 V of the third gate line $GCL_c$ of the gate line group $GL_1$ and the first gate line $GCL_a$, the second gate line $GCL_b$, and the third gate line $GCL_c$ of the gate line group $GL_2$.

After the delay time 151 has elapsed from time $t_{42}$, the source line drive circuit 5 supplies the source signal of 5 V in negative logic to the source lines $SGL_1$ and $SGL_3$, and maintains the source signal of 0 V of the source line $SGL_2$.

Accordingly, a voltage of 5 V is applied between the drain and the source of the writing transistor WT in the second memory 52 of the sub-pixel $SPix_{1-1}$. The second gate line $GCL_b$ of the gate line group $GL_1$ is supplied with 10 V. Accordingly, a current flows between the drain and the source of the writing transistor WT in the second memory 52 of the sub-pixel $SPix_{1-1}$. This current generates the hot electron effect between the gate of the writing transistor WT in the second memory 52 of the sub-pixel $SPix_{1-1}$ and the semiconductor substrate.

Accordingly, electrons are injected from the drain end (or source end) of the semiconductor substrate to the floating gate WTg of the writing transistor WT in the second memory 52 of the sub-pixel $SPix_{1-1}$. This electron injection shifts the threshold voltages of the writing transistor WT and the reading transistor RT in the second memory 52 of the sub-pixel $SPix_{1-1}$ in the positive voltage direction (to, for example, +2 V). Accordingly, the sub-pixel data of the second memory 52 of the sub-pixel $SPix_{1-1}$ is set to 0.

The voltage between the drain and the source of the writing transistor WT in the second memory 52 of the sub-pixel $SPix_{1-2}$ is 0 V. As a result, no current flows between the drain and the source of the writing transistor WT in the second memory 52 of the sub-pixel $SPix_{1-2}$. Accordingly, the hot electron effect does not occur between the gate of the writing transistor WT in the second memory 52 of the sub-pixel $SPix_{1-2}$ and the semiconductor substrate. As a result, the threshold voltages of the writing transistor WT and the reading transistor RT in the second memory 52 of the sub-pixel $SPix_{1-2}$ are maintained at the voltages in the negative voltage direction (at, for example, −2 V). Consequently, the sub-pixel data of the second memory 52 of the sub-pixel $SPix_{1-2}$ is maintained at 1.

A voltage of 5 V is applied between the drain and the source of the writing transistor WT in the second memory 52 of the sub-pixel $SPix_{1-3}$. The second gate line $GCL_b$ of the gate line group $GL_1$ is supplied with 10 V. Accordingly, a current flows between the drain and the source of the writing transistor WT in the second memory 52 of the sub-pixel $SPix_{1-3}$. This current generates the hot electron effect between the gate of the writing transistor WT in the second memory 52 of the sub-pixel $SPix_{1-3}$ and the semiconductor substrate.

Accordingly, electrons are injected from the drain end (or source end) of the semiconductor substrate to the floating gate WTg of the writing transistor WT in the second memory 52 of the sub-pixel $SPix_{1-3}$. This electron injection shifts the threshold voltages of the writing transistor WT and the reading transistor RT in the second memory 52 of the sub-pixel $SPix_{1-3}$ in the positive voltage direction (to, for example, +2 V). Accordingly, the sub-pixel data of the second memory 52 of the sub-pixel $SPix_{1-3}$ is set to 0.

The same operations as those at step 1 and step 2 described above are performed from step 3 to step 6. As a result, the sub-pixel data illustrated in FIG. 24 is written to the sub-pixels $SPix_{1-1}$ to $SPix_{2-3}$.

At time $t_{47}$ when step 7 of the reading period begins, the memory selection circuit 8 outputs the memory selection signal of 0 V to the first memory selection line $SEL_a$ of each of the memory selection line groups $SL_1$ and $SL_2$, and outputs the memory selection signals of −5 V to the second memory selection line $SEL_b$ and the third memory selection line $SEL_c$ of each of the memory selection line groups $SL_1$ and $SL_2$.

The memory selection signal of 0 V output to the first memory selection line $SEL_a$ of each of the memory selection line groups $SL_1$ and $SL_2$ is supplied to the gate of the reading transistor RT in the first memory 51 of each of the corresponding ones of the sub-pixels SPix. The memory selection signals of −5 V output to the second memory selection line $SEL_b$ and the third memory selection line $SEL_c$ of each of the memory selection line groups $SL_1$ and $SL_2$ are supplied to the gates of the reading transistors RT in the second memory 52 and the third memory 53, respectively, of each of the corresponding ones of the sub-pixels SPix.

The threshold voltage of the reading transistor RT in the first memory 51 of the sub-pixel SPix$_{1-1}$ is in the negative voltage direction (for example, −2 V).

Accordingly, the reading transistor RT in the first memory 51 of the sub-pixel SPix$_{1-1}$ is turned on. This operation sets the potential of the node N1 of the sub-pixel SPix$_{1-1}$ to 3 V (power supply potential VDD).

The threshold voltage of the reading transistor RT in the first memory 51 of the sub-pixel SPix$_{2-1}$ is in the negative voltage direction (for example, −2 V).

Accordingly, the reading transistor RT in the first memory 51 of the sub-pixel SPix$_{2-1}$ is turned on. This operation sets the potential of the node N1 of the sub-pixel SPix$_{2-1}$ to 3 V (power supply potential VDD).

The threshold voltage of the reading transistor RT in the first memory 51 of the sub-pixel SPix$_{1-2}$ is in the positive direction (for example, +2 V). Accordingly, the reading transistor RT in the first memory 51 of the sub-pixel SPix$_{1-2}$ is turned off. Accordingly, the potential of the node N1 of the sub-pixel SPix$_{1-2}$ is pulled down to 0 V by the pull-down resistor 62.

The threshold voltage of the reading transistor RT in the first memory 51 of the sub-pixel SPix$_{2-2}$ is in the negative voltage direction (for example, −2 V).

Accordingly, the reading transistor RT in the first memory 51 of the sub-pixel SPix$_{2-2}$ is turned on. This operation sets the potential of the node N1 of the sub-pixel SPix$_{2-2}$ to 3 V (power supply potential VDD).

The threshold voltage of the reading transistor RT in the first memory 51 of the sub-pixel SPix$_{1-3}$ is in the positive direction (for example, +2 V). Accordingly, the reading transistor RT in the first memory 51 of the sub-pixel SPix$_{1-3}$ is turned off. Accordingly, the potential of the node N1 of the sub-pixel SPix$_{1-3}$ is pulled down to 0 V by the pull-down resistor 62.

The threshold voltage of the reading transistor RT in the first memory 51 of the sub-pixel SPix$_{2-3}$ is in the negative voltage direction (for example, −2 V).

Accordingly, the reading transistor RT in the first memory 51 of the sub-pixel SPix$_{2-3}$ is turned on. This operation sets the potential of the node N1 of the sub-pixel SPix$_2$-3 to 3 V (power supply potential VDD) The same operation as that at step 7 described above is performed at step 8 and step 9. As a result, the sub-pixel data illustrated in FIG. 24 is read from the first memory 51, the second memory 52, and the third memory 53 of each of the sub-pixels SPix$_{1-1}$ to SPix$_{2-3}$.

The display device of the fourth embodiment provides the same effect as that of the display device 1A of the third embodiment.

Fifth Embodiment

A display device according to a fifth embodiment of the present disclosure has the same overall configuration as that of the display device 1 of the first embodiment (refer to FIG. 1), and therefore will not be illustrated or described.

Figure 28:
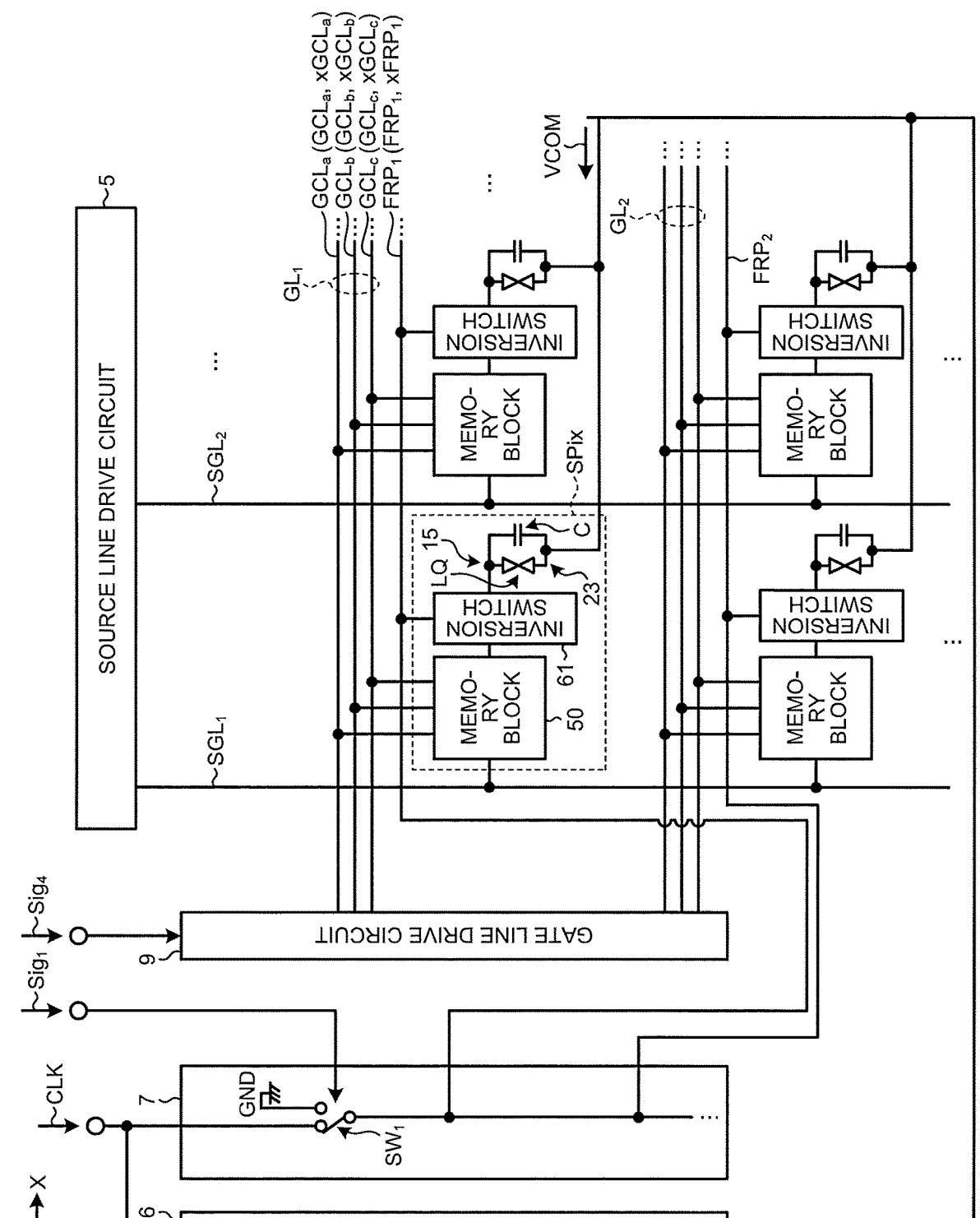
FIG. 28 is a diagram illustrating a circuit configuration of a display device according to a fifth embodiment of the present disclosure.

FIG. 28 is a diagram illustrating a circuit configuration of a display device according to the fifth embodiment. FIG. 28 illustrates 2×2 sub-pixels SPix out of the sub-pixels SPix of M rows×(N×3) columns.

The display device of the fifth embodiment differs from the display device 1A of the third embodiment (refer to FIG. 17) in not including the memory selection circuit 8 and the memory selection line groups SL$_1$, SL$_2$ . . . . .

In the display device 1A of the third embodiment, the memory selection circuit 8 and the memory selection line groups SL$_1$, SL$_2$, . . . play the role of reading the sub-pixel data from each of the sub-pixels SPix. In contrast, in the display device of the fifth embodiment, the gate line drive circuit 9 and the gate line groups GL$_1$, GL$_2$, . . . also play the role of reading the sub-pixel data from each of the sub-pixels SPix, in addition to the role of writing the sub-pixel data to each of the sub-pixels SPix.

Figure 29:
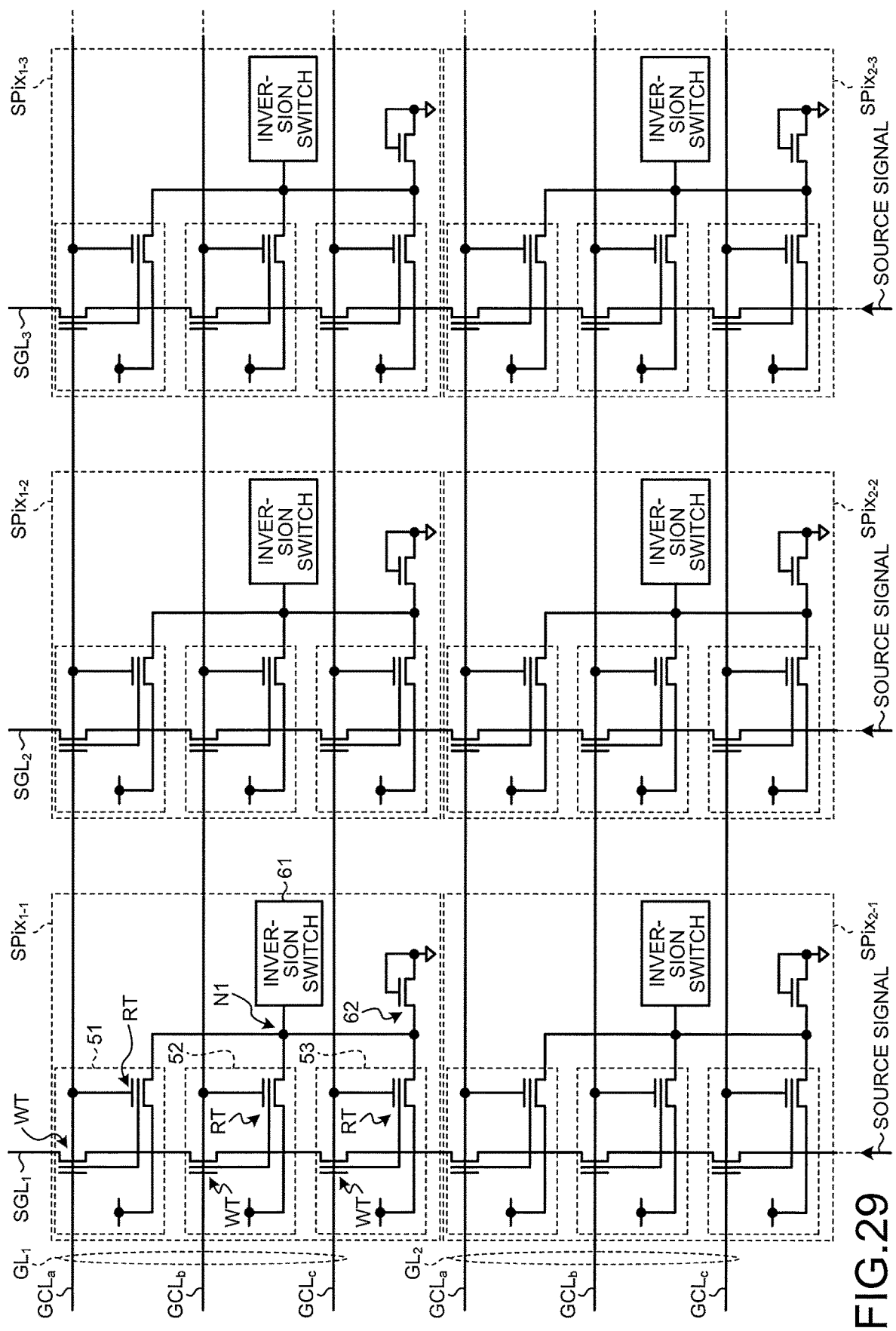
FIG. 29 is a diagram illustrating a configuration of the sub-pixels of the display device according to the fifth embodiment.

FIG. 29 is a diagram illustrating a configuration of the sub-pixels of the display device according to the fifth embodiment. FIG. 29 illustrates six sub-pixels SPix of 2 rows×3 columns out of the sub-pixels SPix of M rows×(N× 3) columns. FIG. 29 does not illustrate the display signal lines FRP, the inverted display signal lines xFRP, the liquid crystal LQ, and the retention capacitors C.

The source-drain paths of the writing transistors WT of the sub-pixels SPix in each column are coupled in series. In other words, the writing transistors WT of the sub-pixels SPix in each column are coupled in what is called the NAND architecture.

The configuration of the sub-pixels of the fifth embodiment differs from the configuration of the sub-pixels of the third embodiment (refer to FIG. 18) in the coupling of the reading transistors RT. The gate of the reading transistor RT of each of the sub-pixels SPix is coupled to the gate line GCL. Consequently, the display device of the fifth embodiment does not include the memory selection lines SEL of the third embodiment.

Figure 31:
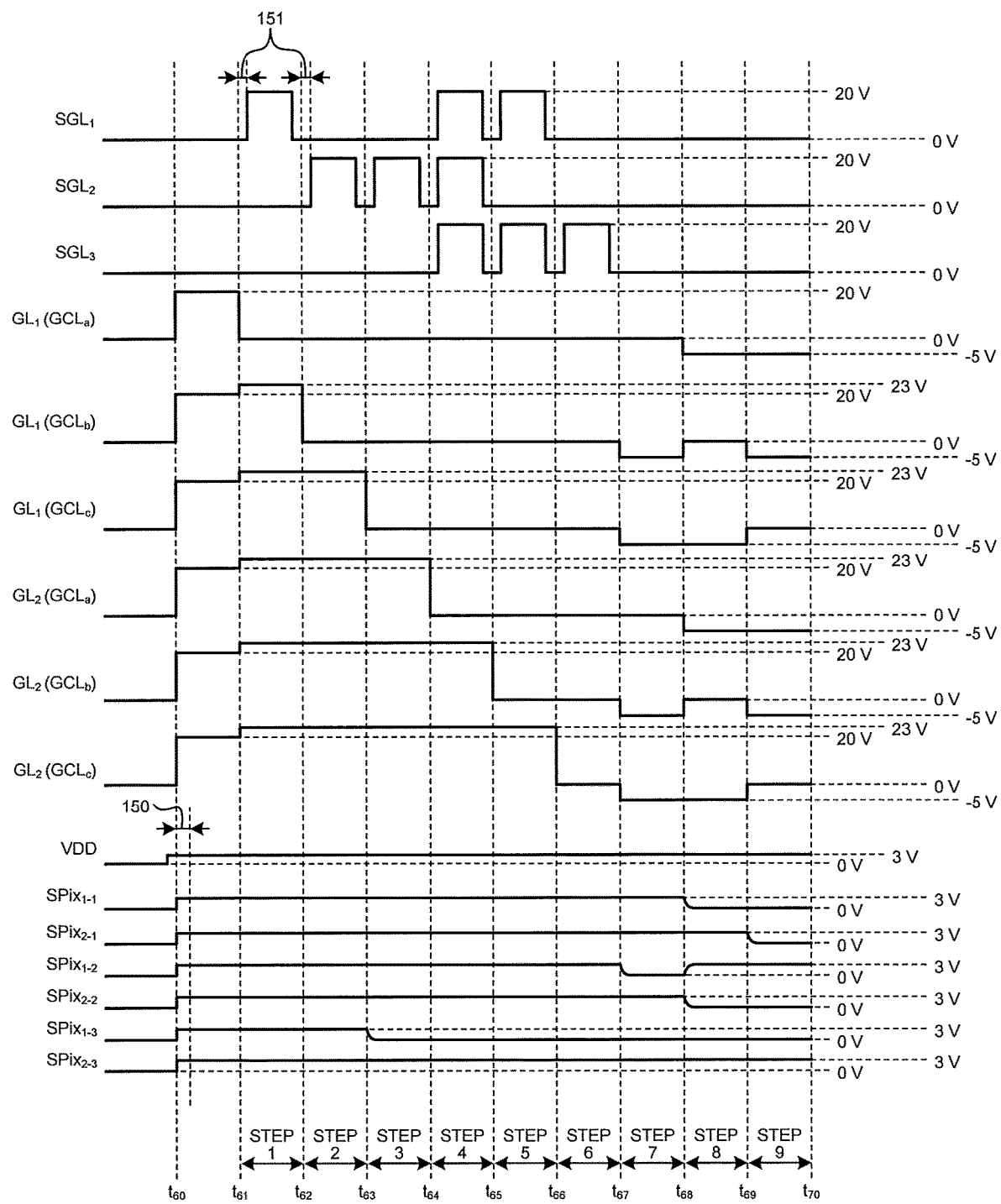
FIG. 31 is a timing diagram illustrating operation timing when the sub-pixel data is written to and read from the sub-pixels of the display device according to the fifth embodiment.

FIG. 30 is a diagram illustrating the sub-pixel data written to the sub-pixels of the display device according to the fifth embodiment. FIG. 31 is a timing diagram illustrating operation timing when the sub-pixel data is written to and read from the sub-pixels of the display device according to the fifth embodiment. FIG. 32 is a diagram illustrating the potentials of the various parts when the writing is performed to the sub-pixels of the display device according to the fifth embodiment. FIG. 33 is a diagram illustrating the potentials of the various parts when the reading is performed from the sub-pixels of the display device according to the fifth embodiment.

With reference to FIGS. 29 to 33, the following describes operations when the sub-pixel data is written to and read from the sub-pixels SPix of the display device of the fifth embodiment.

The writing transistor WT serving as the flash memory needs to be erased before being written with the sub-pixel data. In FIGS. 31 to 33, a period from time $t_{60}$ to time $t_{61}$ is the erasing period.

A period from time $t_{61}$ to time $t_{67}$ after the erasing period is the writing period. The writing period includes step 1 from time $t_{61}$ to time $t_{62}$, step 2 from time $t_{62}$ to time $t_{63}$, step 3 from time $t_{63}$ to time $t_{64}$, step 4 from time $t_{64}$ to time $t_{65}$, step 5 from time $t_{65}$ to time $t_{66}$, and step 6 from time $t_{66}$ to time $t_{67}$.

A period from time $t_{67}$ to time $t_{70}$ after the writing period is the reading period. The reading period includes step 7 from time $t_{67}$ to time t68, step 8 from time t68 to time $t_6$, and step 9 from time $t_{69}$ to time $t_{70}$.

Step 1 is a period of writing to the first memories 51 of the respective sub-pixels SPix$_{1-1}$, SPix$_{1-2}$, and SPix$_{1-3}$ in the first row. Step 2 is a period of writing to the second memories 52 of the respective sub-pixels SPix$_{1-1}$, SPix$_{1-2}$, and SPix$_{1-3}$ in the first row. Step 3 is a period of writing to the third memories 53 of the respective sub-pixels SPix$_{1-1}$, SPix$_{1-2}$, and SPix$_{1-3}$ in the first row.

Step 4 is a period of writing to the first memories 51 of the respective sub-pixels SPix$_{2-1}$, SPix$_{2-2}$, and SPix$_{2-3}$ in the second row. Step 5 is a period of writing to the second memories 52 of the respective sub-pixels SPix$_{2-1}$, SPix$_{2-2}$, and SPix$_{2-3}$ in the second row. Step 6 is a period of writing to the third memories 53 of the respective sub-pixels SPix$_{2-1}$, SPix$_{2-2}$, and SPix$_{2-3}$ in the second row.

Step 7 is a period of reading from the first memories 51 of the respective sub-pixels SPix. Step 8 is a period of reading from the second memories 52 of the respective sub-pixels SPix. Step 9 is a period of reading from the third memories 53 of the respective sub-pixels SPix.

Referring to FIGS. 31 and 32, at time to when the erasing period begins, the gate line drive circuit 9 outputs the gate signals of 20 V to the first gate line GCL$_a$, the second gate line GCL$_b$, and the third gate line GCL$_c$ of the gate line group GL$_1$ and to the first gate line GCL$_a$, the second gate line GCL$_b$, and the third gate line GCL$_c$ of the gate line group GL$_2$. The source line drive circuit 5 outputs the source signals of 0 V to the source lines SGL$_1$, SGL$_2$, and SGL$_3$. Accordingly, the high electric field is applied between each of the gates of the writing transistors WT of all the sub-pixels SPix and the semiconductor substrate. As a result, the tunneling effect causes electrons to be injected from the semiconductor substrate into the floating gates WTg of the writing transistors WT in all the memories of all the sub-pixels SPix.

After the erasing delay time 150 has elapsed from time t$_{60}$, the threshold voltages of the writing transistors WT and the reading transistors RT in all the memories of all the sub-pixels SPix shift in the positive voltage direction (to, for example, +2 V). This means that the sub-pixel data in all the memories of all the sub-pixels SPix is collectively erased to be 0. At this time, the gate signals of 20 V are supplied to the first gate line GCL$_a$, the second gate line GCL$_b$, and the third gate line GCL$_c$ of the gate line group GL$_1$ and to the first gate line GCL$_a$, the second gate line GCL$_b$, and the third gate line GCL$_c$ of the gate line group GL$_2$. Accordingly, the reading transistors RT in all the memories of all the sub-pixels SPix are turned on. This operation sets the potentials of the nodes N1 of all the sub-pixels SPix to 3 V (power supply potential VDD). Although the period during the erasing delay time 150 from time t$_{60}$ is a period before the erasure in which the threshold voltages are, for example, 0 V, the reading transistors RT are also in the on-state during this period. Therefore, the potentials of the nodes N1 do not change.

Step 1 and step 2 of the writing period are the same as step 1 and step 2 of the third embodiment, and therefore will not be described.

At time t$_{63}$, the gate line drive circuit 9 maintains the gate signals of the first gate line GCL$_a$ and the second gate line GCL$_b$ of the gate line group GL$_1$ at 0 V, outputs the gate signal of 0 V to the third gate line GCL$_c$ of the gate line group GL$_1$, and maintains the gate signals of 23 V of the first gate line GCL$_a$, the second gate line GCL$_b$, and the third gate line GCL$_c$ of the gate line group GL$_2$. At this time, the sub-pixel data of the first memory 51, the second memory 52, and the third memory 53 of the sub-pixel SPix$_{1-3}$ is all 0. In other words, the threshold voltages of the reading transistors RT in the first memory 51, the second memory 52, and the third memory 53 of the sub-pixel SPix$_{1-3}$ are +2 V. The first gate line GCL$_a$, the second gate line GCL$_b$, and the third gate line GCL$_a$, of the gate line group GL$_1$ are supplied with 0 V. As a result, the reading transistors RT in the first memory 51, the second memory 52, and the third memory 53 of the sub-pixel SPix$_{1-3}$ are turned off. Accordingly, the potential of the node N1 of the sub-pixel SPix$_{1-3}$ is pulled down to 0 V by the pull-down resistor 62.

The same operations as those at step 1 and step 2 described above are performed from step 3 to step 6. As a result, the sub-pixel data illustrated in FIG. 30 is written to the sub-pixels SPix$_{1-1}$ to SPix$_{2-3}$.

At time t$_{67}$ when step 7 of the reading period begins, the gate line drive circuit 9 maintains the gate signal of 0 V of the first gate line GCL$_a$ of each of the gate line groups GL$_1$ and GL$_2$, and outputs the gate signals of −5 V to the second gate line GCL$_b$ and the third gate line GCL$_c$ of each of the gate line groups GL$_1$ and GL$_2$.

The gate line drive circuit 9 outputs the gate signals of −5 V to the second gate line GCL$_b$ and the third gate line GCL$_c$ of each of the gate line groups GL$_1$ and GL$_2$, but the voltage of the signals is not limited thereto. The voltage of the gate signals output by the gate line drive circuit 9 to the second gate line GCL$_b$ and the third gate line GCL$_a$ of each of the gate line groups GL$_1$ and GL$_2$ only needs to be lower than the threshold voltage in the negative voltage direction (for example, −2 V).

Accordingly, the gate line drive circuit 9 may output, for example, the gate signals of −4.5 V to the second gate line GCL$_b$ and the third gate line GCL$_c$ of each of the gate line groups GL$_1$ and GL$_2$.

The gate signal of 0 V output to first gate line GCL$_a$ of each of the gate line groups GL$_1$ and GL$_2$ is supplied to the gate of the reading transistor RT in the first memory 51 of each of the corresponding ones of the sub-pixels SPix. The gate signals of −5 V output to the second gate line GCL$_b$ and the third gate line GCL$_c$ of each of the gate line groups GL$_1$ and GL$_2$ are supplied to the gates of the reading transistors RT in the second memory 52 and the third memory 53, respectively, of each of the corresponding ones of the sub-pixels SPix.

The threshold voltage of the reading transistor RT in the first memory 51 of the sub-pixel SPix$_{11}$ is −2 V. Accordingly, the reading transistor RT in the first memory 51 of the sub-pixel SPix$_{1-1}$ is turned on. This operation sets the potential of the node N1 of the sub-pixel SPix$_{1-1}$ to 3 V (power supply potential VDD).

The threshold voltage of the reading transistor RT in the first memory 51 of the sub-pixel SPix$_{2-1}$ is −2 V. Accordingly, the reading transistor RT in the first memory 51 of the sub-pixel SPix$_{2-1}$ is turned on. This operation sets the potential of the node N1 of the sub-pixel SPix$_{2-1}$ to 3 V (power supply potential VDD).

The threshold voltage of the reading transistor RT in the first memory 51 of the sub-pixel SPix$_{1-2}$ is +2 V. Accordingly, the reading transistor RT in the first memory 51 of the sub-pixel SPix$_{1-2}$ is turned off. Accordingly, the potential of the node N1 of the sub-pixel SPix$_{1-2}$ is pulled down to 0 V by the pull-down resistor 62.

The threshold voltage of the reading transistor RT in the first memory 51 of the sub-pixel SPix$_{2-2}$ is −2 V. Accordingly, the reading transistor RT in the first memory 51 of the sub-pixel SPix$_{2-2}$ is turned on. This operation sets the potential of the node N1 of the sub-pixel SPix$_{2-2}$ to 3 V (power supply potential VDD).

The threshold voltage of the reading transistor RT in the first memory 51 of the sub-pixel SPix$_{1-3}$ is +2 V. Accordingly, the reading transistor RT in the first memory 51 of the sub-pixel SPix$_{1-3}$ is turned off. Accordingly, the potential of the node N1 of the sub-pixel SPix$_{1-3}$ is pulled down to 0 V by the pull-down resistor 62.

The threshold voltage of the reading transistor RT in the first memory 51 of the sub-pixel SPix$_{2-3}$ is −2 V. Accordingly, the reading transistor RT in the first memory 51 of the sub-pixel SPix$_{2-3}$ is turned on. This operation sets the potential of the node N1 of the sub-pixel SPix$_{2-3}$ to 3 V (power supply potential VDD).

The same operation as that at step 7 described above is performed at step 8 and step 9. As a result, the sub-pixel data illustrated in FIG. 30 is read from the first memory 51, the second memory 52, and the third memory 53 of each of the sub-pixels $SPix_{1-1}$ to $SPix_{2-3}$.

Layout of Sub-Pixel

Figure 34:
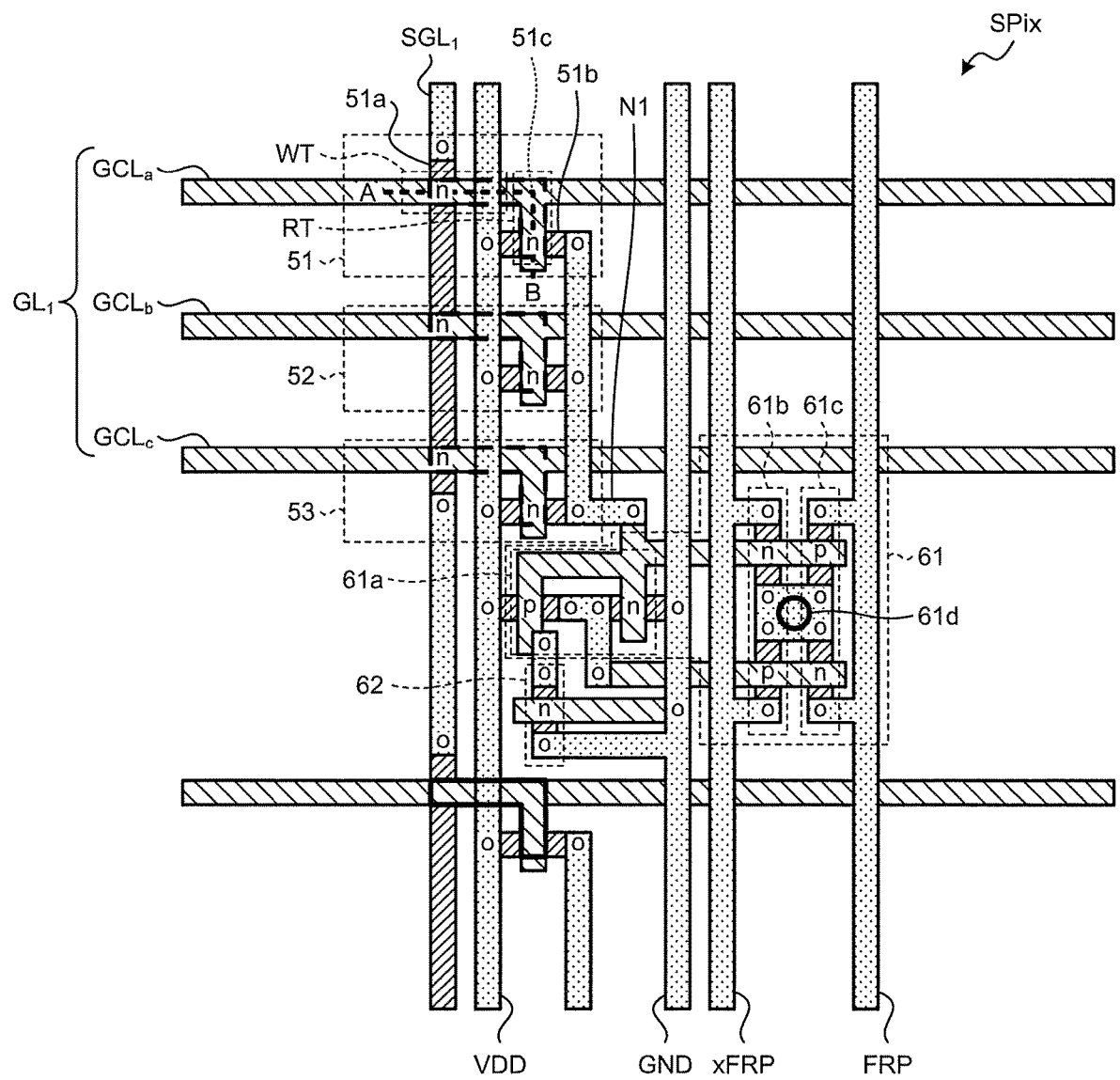
FIG. 34 is a diagram illustrating a layout of a sub-pixel of the display device according to the fifth embodiment.

FIG. 34 is a diagram illustrating a layout of a sub-pixel of the display device according to the fifth embodiment. FIG. 34 illustrates one of the sub-pixels SPix.

The sub-pixel SPix includes the first memory 51, the second memory 52, the third memory 53, the inversion switch 61, and the pull-down resistor 62. The inversion switch 61 includes the inverter 61a and the transfer gates 61b and 61c. A coupling part between the transfer gate 61b and the transfer gate 61c is coupled to the sub-pixel electrode 15 (refer to FIG. 2) through a contact 61d.

Each of the first memory 51, the second memory 52, the third memory 53, the inverter 61a, the transfer gates 61b and 61c, and the pull-down resistor 62 is constituted by a semiconductor layer, wiring of a first wiring layer, and wiring of a second wiring layer.

The first memory 51 includes the writing transistor WT and the reading transistor RT. The writing transistor WT includes an n-type semiconductor layer 51a and a floating gate 51c. The reading transistor RT includes an n-type semiconductor layer 51b and the floating gate 51c.

Figure 35:
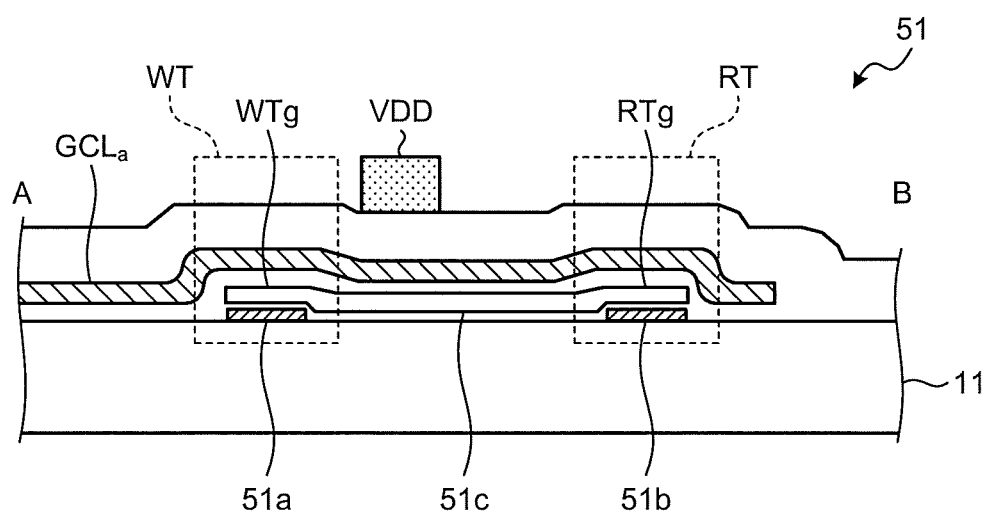
FIG. 35 is a sectional view of the sub-pixel of the display device according to the fifth embodiment.

FIG. 35 is a sectional view of the sub-pixel of the display device according to the fifth embodiment. More specifically, FIG. 35 is a sectional view taken along line A-B in FIG. 34. In this example, one floating gate 51c extends across the writing transistor WT and the reading transistor RT. In other words, the writing transistor WT and the reading transistor RT share one floating gate 51c. An end on the A side of the floating gate 51c serves as the floating gate WTg of the writing transistor WT. An end on the B side of the floating gate 51c serves as the floating gate RTg of the reading transistor RT.

The writing transistor WT and the reading transistor RT are not limited to the configuration of sharing one floating gate 51c. The floating gate WTg of the writing transistor WT and the floating gate RTg of the reading transistor RT may be separately formed and coupled to each other through wiring of a wiring layer.

The display device of the fifth embodiment provides the same effect as that of the display device 1A of the third embodiment. In addition, the display device of the fifth embodiment can eliminate the need for the memory selection line groups $SL_1$, $SL_2$, . . . . As a result, the display device of the fifth embodiment can further lower the risk of short circuits caused by, for example, foreign matter, and can have a still higher yield rate.

Sixth Embodiment

A display device according to a sixth embodiment of the present disclosure has the same overall configuration as that of the display device 1 of the first embodiment (refer to FIG. 1), and therefore will not be illustrated or described.

Figure 36:
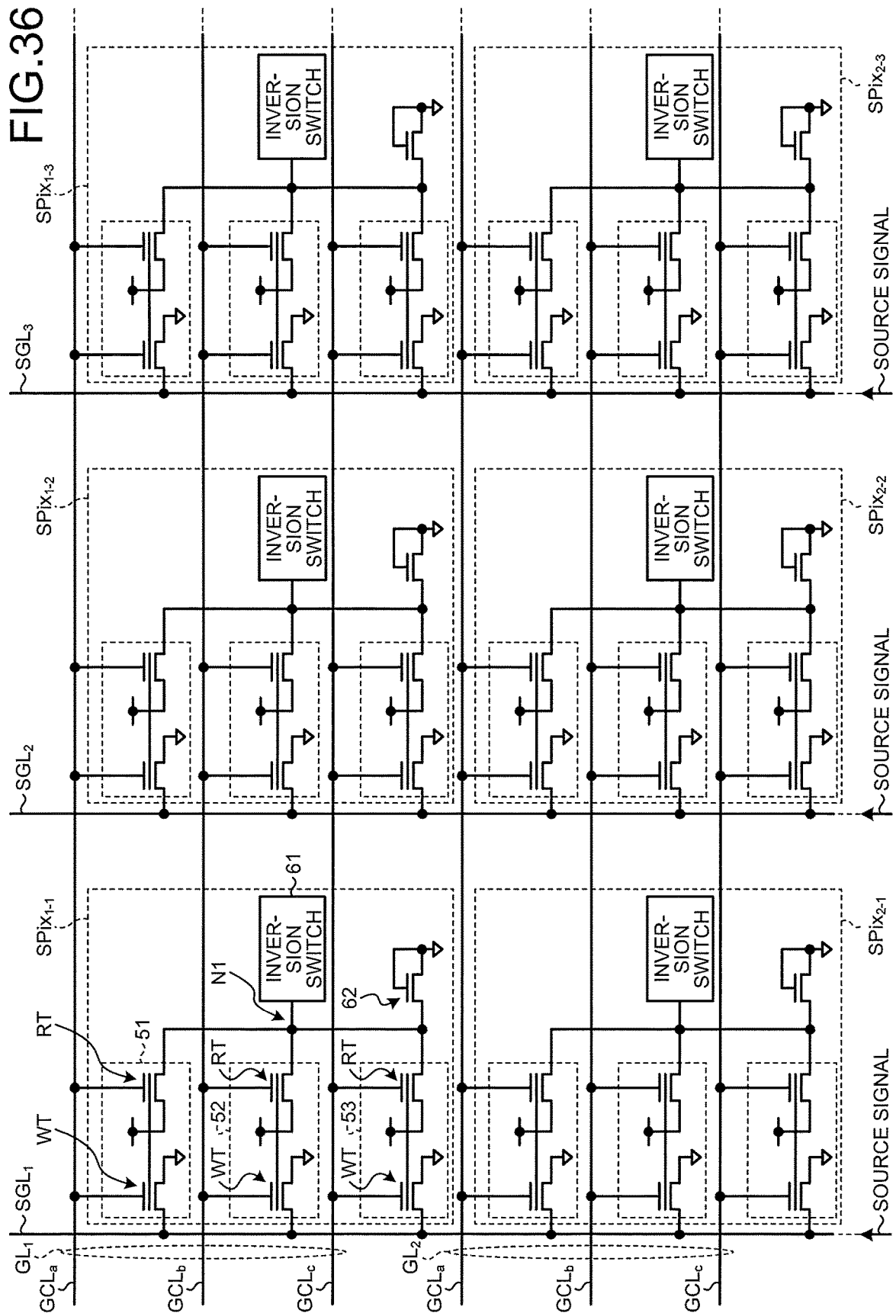
FIG. 36 is a diagram illustrating a configuration of the sub-pixels of a display device according to a sixth embodiment of the present disclosure.

FIG. 36 is a diagram illustrating a configuration of the sub-pixels of a display device according to the sixth embodiment. FIG. 36 illustrates six sub-pixels SPix of 2 rows×3 columns out of the sub-pixels SPix of M rows×(N×3) columns. FIG. 36 does not illustrate the display signal lines FRP, the inverted display signal lines xFRP, the liquid crystal LQ, and the retention capacitors C.

One of the drain and the source of the writing transistor WT in each of the sub-pixels SPix is coupled to the reference potential. The other of the drain and the source of the writing transistor WT in each of the sub-pixels SPix is coupled to the source line SGL. In other words, the source-drain paths of the writing transistors WT of the sub-pixels SPix in each column are coupled in parallel. Accordingly, the writing transistors WT of the sub-pixels SPix in each column are coupled in what is called the NOR architecture.

The configuration of the sub-pixels of the sixth embodiment differs from the configuration of the sub-pixels of the fourth embodiment (refer to FIG. 23) in the coupling of the reading transistors RT. The gate of the reading transistor RT of each of the sub-pixels SPix is coupled to the gate line GCL. Consequently, the display device of the sixth embodiment does not include the memory selection lines SEL of the fourth embodiment.

Figure 38:
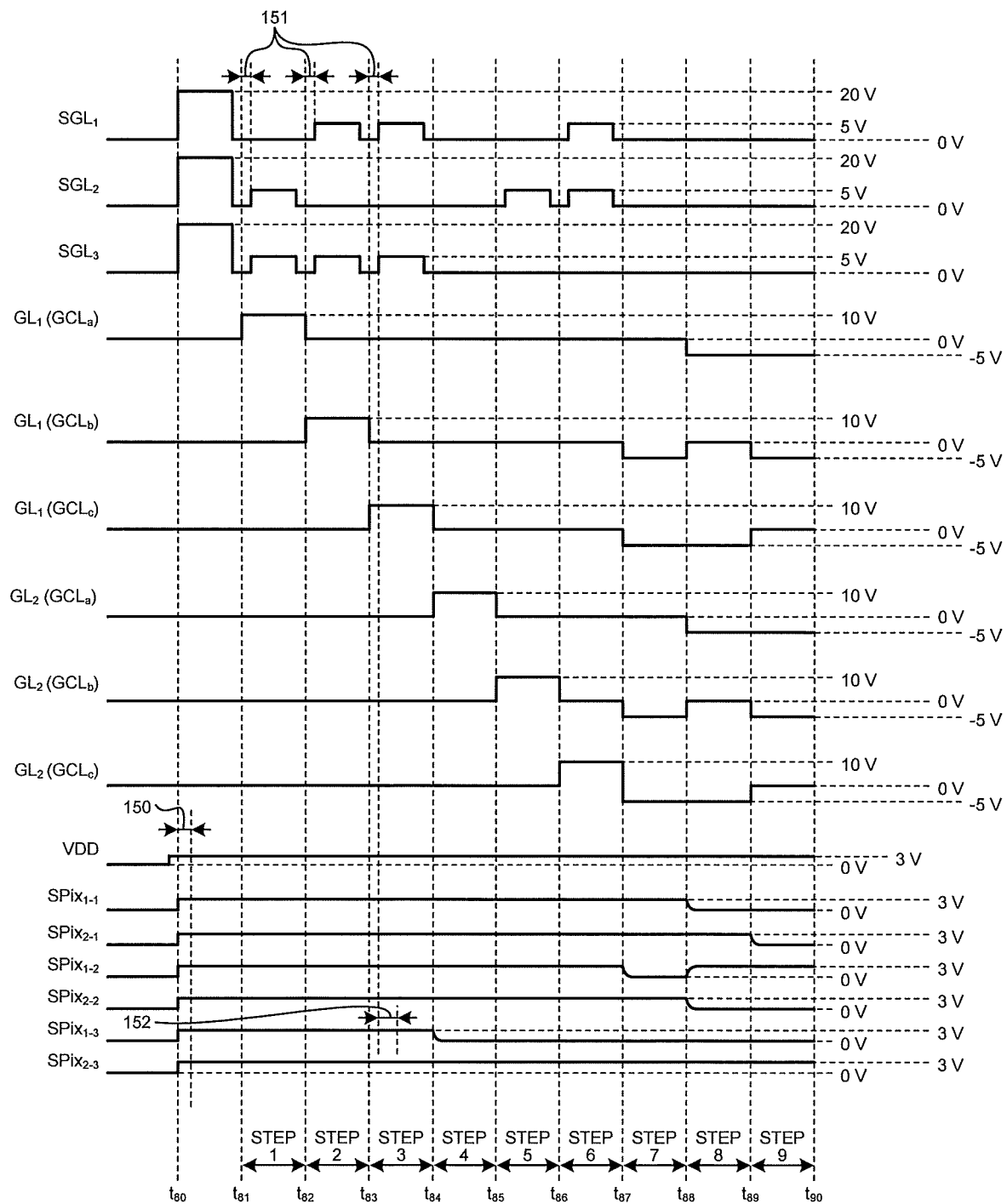
FIG. 38 is a timing diagram illustrating operation timing when the sub-pixel data is written to and read from the sub-pixels of the display device according to the sixth embodiment.

FIG. 37 is a diagram illustrating the sub-pixel data written to the sub-pixels of the display device according to the sixth embodiment. FIG. 38 is a timing diagram illustrating operation timing when the sub-pixel data is written to and read from the sub-pixels of the display device according to the sixth embodiment. FIG. 39 is a diagram illustrating the potentials of the various parts when the writing is performed to the sub-pixels of the display device according to the sixth embodiment. FIG. 40 is a diagram illustrating the potentials of the various parts when the reading is performed from the sub-pixels of the display device according to the sixth embodiment.

With reference to FIGS. 36 to 40, the following describes operations when the sub-pixel data is written to and read from the sub-pixels SPix of the display device of the sixth embodiment.

The writing transistor WT serving as the flash memory needs to be erased before being written with the sub-pixel data. In FIGS. 38 to 40, a period from time $t_{80}$ to time $t_{81}$ is the erasing period.

A period from time $t_{81}$ to time $t_{87}$ after the erasing period is the writing period. The writing period includes step 1 from time $t_{81}$ to time $t_{82}$, step 2 from time $t_{82}$ to time $t_{83}$, step 3 from time $t_{63}$ to time $t_{84}$, step 4 from time $t_{84}$ to time $t_{85}$, step 5 from time $t_{85}$ to time $t_{86}$, and step 6 from time $t_{86}$ to time $t_{87}$.

A period from time $t_{87}$ to time $t_{84}$ after the writing period is the reading period. The reading period includes step 7 from time $t_{87}$ to time $t_{88}$, step 8 from time $t_{88}$ to time $t_{89}$, and step 9 from time $t_{89}$ to time $t_{90}$.

Step 1 is a period of writing to the first memories 51 of the respective sub-pixels $SPix_{1-3}$, $SPix_{1-2}$, and $SPix_{1-3}$ in the first row. Step 2 is a period of writing to the second memories 52 of the respective sub-pixels $SPix_{1-1}$, $SPix_{1-2}$, and $SPix_{1-3}$ in the first row. Step 3 is a period of writing to the third memories 53 of the respective sub-pixels $SPix_{1-1}$, $SPix_{1-2}$, and $SPix_{1-3}$ in the first row.

Step 4 is a period of writing to the first memories 51 of the respective sub-pixels $SPix_{2-1}$, $SPix_{2-2}$, and $SPix_{2-3}$ in the second row. Step 5 is a period of writing to the second memories 52 of the respective sub-pixels $SPix_{2-1}$, $SPix_{2-2}$, and $SPix_{2-3}$ in the second row. Step 6 is a period of writing to the third memories 53 of the respective sub-pixels $SPix_{2-1}$, $SPix_{2-2}$, and $SPix_{2-3}$ in the second row.

Step 7 is a period of reading from the first memories 51 of the respective sub-pixels SPix. Step 8 is a period of reading from the second memories 52 of the respective sub-pixels SPix. Step 9 is a period of reading from the third memories 53 of the respective sub-pixels SPix.

Referring to FIGS. 38 and 39, at time $t_{80}$ when the erasing period begins, the gate line drive circuit 9 outputs the gate signals of 0 V to the first gate line $GCL_a$, the second gate line $GCL_b$, and the third gate line $GCL_c$ of the gate line group $GL_1$ and to the first gate line $GCL_a$, the second gate line $GCL_b$, and the third gate line $GCL_c$ of the gate line group $GL_2$. The source line drive circuit 5 outputs the source signals of 20 V to the source lines $SGL_1$, $SGL_2$, and $SGL_3$. Accordingly, the high electric field is applied between each of the gates of the writing transistors WT of all the sub-pixels SPix and the semiconductor substrate. As a result, the tunneling effect causes electrons in the floating gates WTg of all the sub-pixels SPix to be released to the semiconductor substrate.

After the erasing delay time 150 has elapsed from time $t_{80}$, the threshold voltages of the writing transistors WT and the reading transistors RT in all the memories of all the sub-pixels SPix shift in the negative voltage direction (to, for example, −2 V). This means that the sub-pixel data in the first memory 51, the second memory 52, and the third memory 53 of all sub-pixels SPix is collectively erased to be 1. At this time, the gate signals of 0 V are supplied to the first gate line $GCL_a$ of the gate line group $GL_1$ to the first gate line $GCL_a$ of the gate line group $GL_6$. Accordingly, the reading transistors RT in all the memories of all the sub-pixels SPix are turned on. This operation sets the potentials of the nodes N1 of all the sub-pixels SPix to 3 V (power supply potential VDD).

Step 1 and step 2 of the writing period are the same as step 1 and step 2 of the fourth embodiment, and therefore will not be described.

At time $t_{83}$ when step 3 begins, the gate line drive circuit 9 maintains a voltage of 0 V of the first gate line $GCL_a$ of the gate line group $GL_1$, outputs the gate signal of 0 V to the second gate line $GCL_b$ of the gate line group $GL_1$, outputs the gate signal of 10 V to the third gate line $GCL_c$ of the gate line group $GL_1$, and maintains the gate signals of 0 V of the first gate line $GCL_a$, the second gate line $GCL_b$, and the third gate line $GCL_c$ of the gate line group $GL_2$.

After the delay time 151 has elapsed from time $t_{83}$, the source line drive circuit 5 supplies the source signal of 5 V in negative logic to the source lines $SGL_1$ and $SGL_3$, and maintains the source signal of 0 V of the source line $SGL_2$.

Accordingly, a voltage of 5 V is applied between the drain and the source of the writing transistor WT in the third memory 53 of the sub-pixel $SPix_{1-1}$. The third gate line $GCL_c$ of the gate line group $GL_1$ is supplied with 10 V. Accordingly, a current flows between the drain and the source of the writing transistor WT in the third memory 53 of the sub-pixel $SPix_{1-1}$. This current generates the hot electron effect between the gate of the writing transistor WT in the third memory 53 of the sub-pixel $SPix_{1-1}$ and the semiconductor substrate.

Accordingly, electrons are injected from the drain end (or source end) of the semiconductor substrate to the floating gate WTg of the writing transistor WT in the third memory 53 of the sub-pixel $SPix_{1-1}$. This electron injection shifts the threshold voltages of the writing transistor WT and the reading transistor RT in the third memory 53 of the sub-pixel $SPix_{1-1}$ in the positive voltage direction (to, for example, +2 V). Accordingly, the sub-pixel data of the third memory 53 of the sub-pixel $SPix_{1-1}$ is set to 0.

The voltage between the drain and the source of the writing transistor WT in the third memory 53 of the sub-pixel $SPix_{1-2}$ is 0 V. As a result, no current flows between the drain and the source of the writing transistor WT in the third memory 53 of the sub-pixel $SPix_{1-2}$. Accordingly, the hot electron effect does not occur between the gate of the writing transistor WT in the third memory 53 of the sub-pixel $SPix_{1-2}$ and the semiconductor substrate. As a result, the threshold voltages of the writing transistor WT and the reading transistor RT in the third memory 53 of the sub-pixel $SPix_{1-2}$ are maintained at the voltages in the negative voltage direction (at, for example, −2 V). Consequently, the sub-pixel data of the third memory 53 of the sub-pixel $SPix_{1-2}$ is maintained at 1.

A voltage of 5 V is applied between the drain and the source of the writing transistor WT in the third memory 53 of the sub-pixel $SPix_{1-3}$. The third gate line $GCL_c$ of the gate line group $GL_1$ is supplied with 10 V. Accordingly, a current flows between the drain and the source of the writing transistor WT in the third memory 53 of the sub-pixel $SPix_{1-3}$. This current generates the hot electron effect between the gate of the writing transistor WT in the third memory 53 of the sub-pixel $SPix_{1-3}$ and the semiconductor substrate.

Accordingly, electrons are injected from the drain end (or source end) of the semiconductor substrate to the floating gate WTg of the writing transistor WT in the third memory 53 of the sub-pixel $SPix_{1-3}$. This electron injection shifts the threshold voltages of the writing transistor WT and the reading transistor RT in the third memory 53 of the sub-pixel $SPix_{1-3}$ in the positive voltage direction (to, for example, +2 V). Accordingly, the sub-pixel data of the third memory 53 of the sub-pixel $SPix_{1-3}$ is set to 0.

After the delay time 151 and the writing delay time 152 have elapsed from time $t_{83}$, the sub-pixel data of the first memory 51, the second memory 52, and the third memory 53 of the sub-pixel $SPix_{1-3}$ is all 0. In other words, the threshold voltages of the reading transistors RT in the first memory 51, the second memory 52, and the third memory 53 of the sub-pixel $SPix_{1-3}$ are +2 V. The gate line drive circuit 9 maintains the gate signals of the first gate line $GCL_a$ and the second gate line $GCL_b$ of the gate line group $GL_1$ at 0 V, outputs the gate signal of 10 V to the third gate line $GCL_c$ of the gate line group $GL_1$, and maintains the gate signals of 0 V of the first gate line $GCL_a$, the second gate line $GCL_b$, and the third gate line $GCL_c$ of the gate line group $GL_2$. In other words, the first gate line $GCL_a$ and the second gate line $GCL_b$ of the gate line group $GL_1$ are supplied with 0 V, and the third gate line $GCL_c$ of the gate line group $GL_1$ is supplied with 10 V. As a result, the reading transistors RT in the first memory 51 and the second memory 52 of the sub-pixel $SPix_{1-3}$ are turned off, and the reading transistor RT in the third memory 53 of the sub-pixel $SPix_{1-3}$ is turned on. Accordingly, the potential of the node N1 of the sub-pixel $SPix_{1-3}$ is still maintained at 3 V (power supply potential VDD) after the delay time 151 and the writing delay time 152 have elapsed from time $t_{83}$. At the time when the voltage of the third gate line $GCL_c$ turns to 0 V, all the reading transistors in the first to third memories are placed in the off-state, and the potential of the node N1 turns to 0 V.

The same operations as those from step 1 to step 3 are performed from step 4 to step 6. As a result, the sub-pixel data illustrated in FIG. 37 is written to the sub-pixels $SPix_{1-1}$ to $SPix_{2-3}$.

Step 7 to step 9 of the reading period are the same as step 7 to step 9 of the fifth embodiment, and therefore will not be described.

The display device of the sixth embodiment provides the same effect as that of the display device of the fourth embodiment.

In addition, unlike the display device of the fourth embodiment, the display device of the sixth embodiment can eliminate the need for the memory selection line groups $SL_1$, $SL_2$, . . . . As a result, the display device of the sixth embodiment can further lower the risk of short circuits caused by, for example, foreign matter, and can have a still higher yield rate.

Seventh Embodiment

Figure 41:
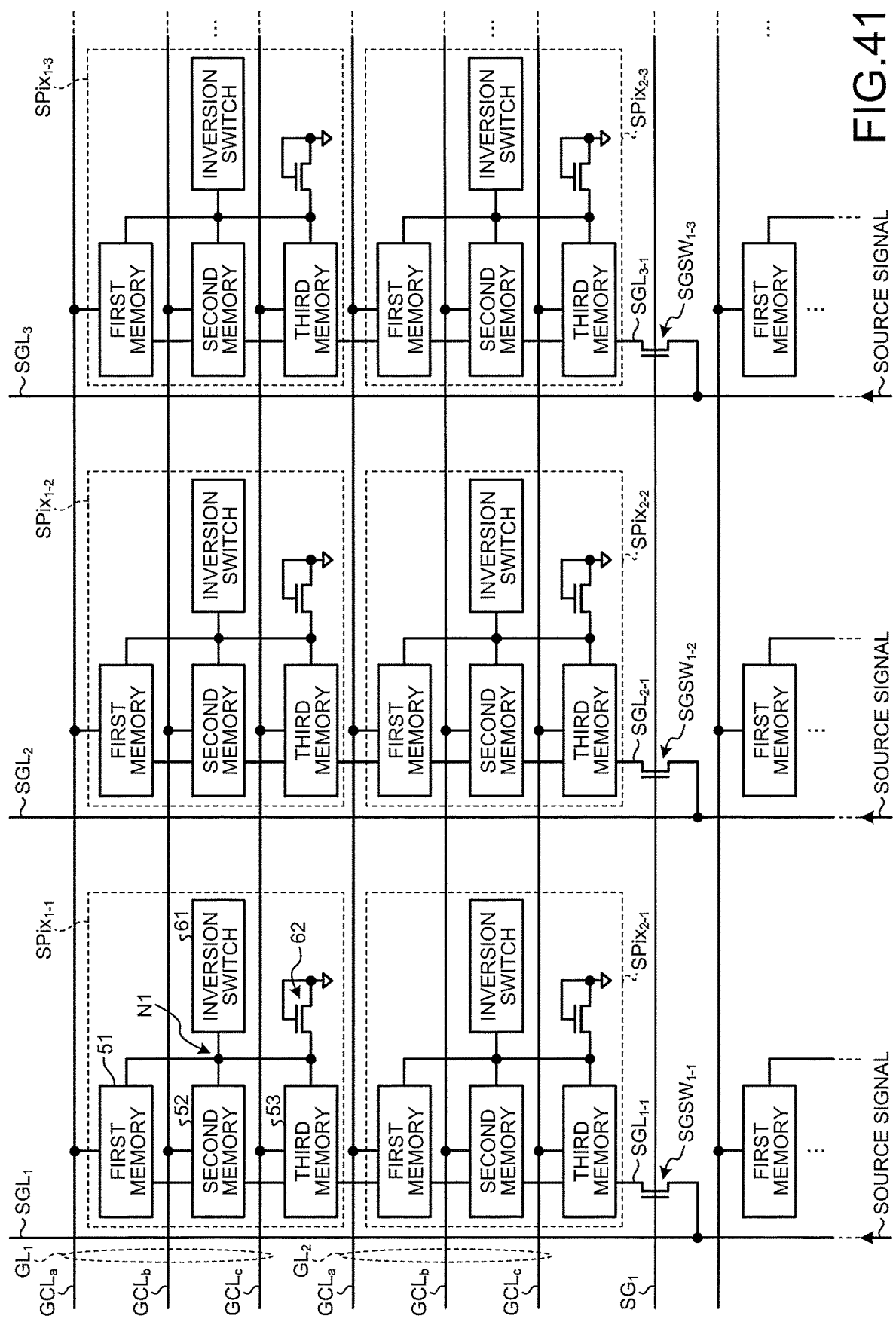
FIG. 41 is a diagram illustrating a configuration of the sub-pixels of a display device according to a seventh embodiment of the present disclosure.

FIG. 41 is a diagram illustrating a configuration of the sub-pixels of a display device according to a seventh embodiment of the present disclosure. FIG. 41 illustrates six sub-pixels SPix of 2 rows×3 columns out of the sub-pixels SPix of M rows×(N×3) columns. FIG. 41 does not illustrate the display signal lines FRP, the inverted display signal lines xFRP, the liquid crystal LQ, and the retention capacitors C.

The configuration of the sub-pixels of the seventh embodiment differs from the configuration of the sub-pixels of the fifth embodiment (refer to FIG. 29) in the coupling of the first memory 51 to the third memory 53. The first memory 51 to the third memory 53 of the sub-pixel $SPix_{1-1}$ and the first memory 51 to the third memory 53 of the sub-pixel $SPix_{2-1}$ are coupled to the source line $SGL_1$ through a switch $SGSW_{1-1}$. In other words, the first memory 51 to the third memory 53 of the sub-pixel $SPix_{1-1}$ and the first memory 51 to the third memory 53 of the sub-pixel $SPix_{2-1}$ are coupled to a branch source line $SGL_{1-1}$ branched through the switch $SGSW_{1-1}$.

In the same manner, the first memory 51 to the third memory 53 of the sub-pixel $SPix_{1-2}$ and the first memory 51 to the third memory 53 of the sub-pixel $SPix_{2-2}$ are coupled to the source line $SGL_2$ through a switch $SGSW_{1-2}$. In other words, the first memory 51 to the third memory 53 of the sub-pixel $SPix_{1-2}$ and the first memory 51 to the third memory 53 of the sub-pixel $SPix_{2-2}$ are coupled to a branch source line $SGL_{2-1}$ branched through the switch $SGSW_{1-2}$.

In the same manner, the first memory 51 to the third memory 53 of the sub-pixel $SPix_{1-3}$ and the first memory 51 to the third memory 53 of the sub-pixel $SPix_{2-3}$ are coupled to the source line $SGL_3$ through a switch $SGSW_{1-3}$. In other words, the first memory 51 to the third memory 53 of the sub-pixel $SPix_{1-3}$ and the first memory 51 to the third memory 53 of the sub-pixel $SPix_{2-3}$ are coupled to a branch source line $SGL_{31}$ branched through the switch $SGSW_{1-3}$.

The switches $SGSW_{1-1}$, $SGSW_{1-2}$, and $SGSW_{1-3}$ are transistors, but the present disclosure is not limited thereto. The gates of the switches $SGSW_{1-1}$, $SGSW_{1-2}$, and $SGSW_{1-3}$ are coupled to a switch control line $SG_1$.

In the seventh embodiment, the switch SGSW is provided for each two rows of the sub-pixels SPix, but the present disclosure is not limited thereto. The switch SGSW may be provided for each row or each three or more rows of the sub-pixels SPix.

The internal configuration of the memories of the seventh embodiment is the same as the internal configuration of the memories of the fifth embodiment (refer to FIG. 29) or the internal configuration of the memories of the sixth embodiment (refer to FIG. 36). The display device of the seventh embodiment may be provided with the memory selection line groups $SL_1$, $SL_2$, ..., and the internal configuration of the memories of the seventh embodiment may be the same as the internal configuration of the memories of the third embodiment (refer to FIG. 18) or the internal configuration of the memories of the fourth embodiment (refer to FIG. 23).

When erasing or writing the sub-pixel data from or to the sub-pixels SPix in the first and second rows, the gate line drive circuit 9 outputs a high-level switch control signal to the switch control line $SG_1$. This operation couples the first memory 51, the second memory 52, and the third memory 53 of the sub-pixels SPix in the first and second rows to the source lines SGL. This coupling allows the sub-pixel data to be erased from or written to the first memory 51, the second memory 52, and the third memory 53 of the sub-pixels SPix in the first and second rows.

When not erasing or writing the sub-pixel data from or to the sub-pixels SPix in the first and second rows, the gate line drive circuit 9 outputs a low-level switch control signal to the switch control line $SG_1$. This operation shuts off the first memory 51, the second memory 52, and the third memory 53 of the sub-pixels SPix in the first and second rows from the source lines SGL.

The display device of the seventh embodiment provides the same effect as that of the display devices according to the first to sixth embodiments.

Further, the display device of the seventh embodiment can erase or write the sub-pixel data from or to the sub-pixels SPix in a row coupled to the source lines SGL based on the switch control signal. This means that the display device of the seventh embodiment can perform partial erasure or partial writing. As a result, the display device of the seventh embodiment can reduce the number of sub-pixels SPix coupled to the source lines SGL at one writing time. As a result, the display device of the seventh embodiment can reduce load resistance and load capacitance of the source lines SGL. Accordingly, the display device of the seventh embodiment can quickly write the sub-pixel data to the sub-pixels SPix.

Application Example

Figure 42:
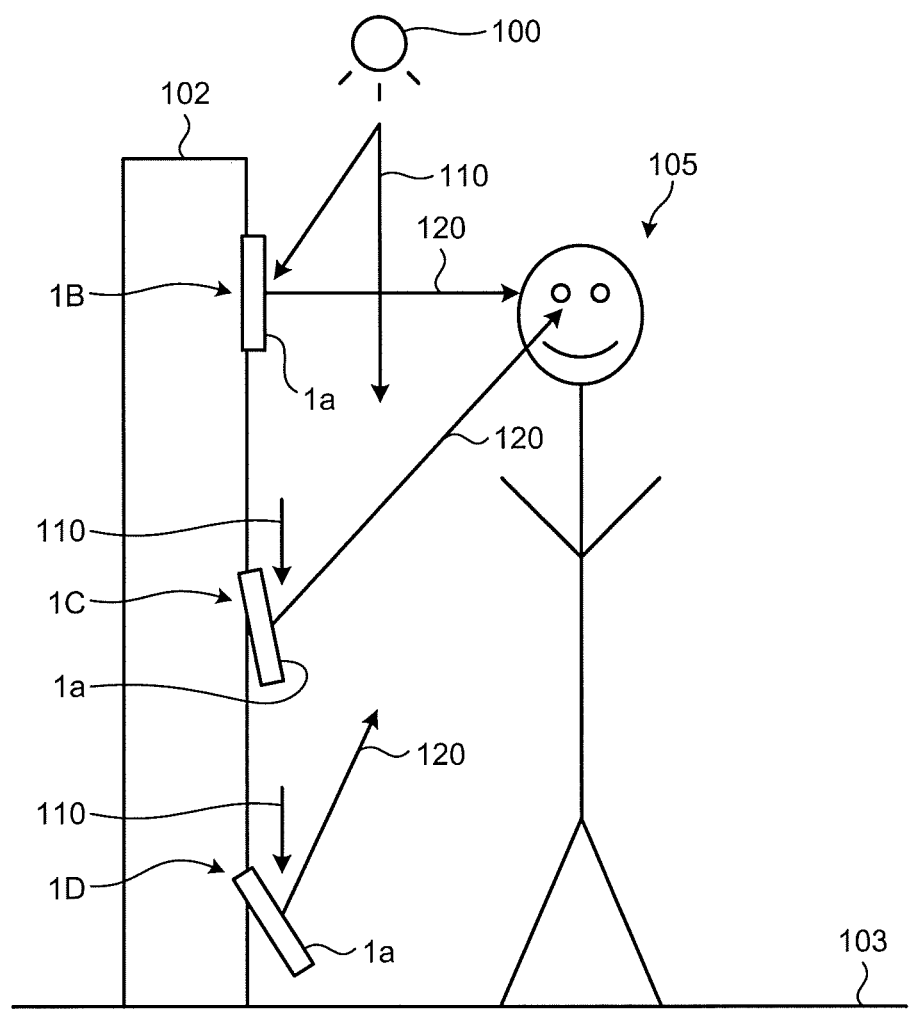
FIG. 42 is a diagram illustrating an application example of the display device according to any one of the first to seventh embodiments.

FIG. 42 is a diagram illustrating an application example of the display device according to any one of the first to seventh embodiments. FIG. 42 is a diagram illustrating an example in which the display device is applied to an electronic shelf label.

As illustrated in FIG. 42, display devices 1B, 1C, and 1D are mounted on a shelf 102. Each of the display devices 1B, 1C, and 1D has the same configuration as that of the display device according to any one of the first to seventh embodiments.

Each of the display devices 1B, 1C, and 1D is mounted at a height from a floor surface 103 different from one another, and mounted so as to have a panel inclination angle different from one another. The panel inclination angle is an angle formed between the normal line to the display surface 1a and the horizontal direction. The display devices 1B, 1C, and 1D reflect incident light 110 from a lighting device 100 serving as a light source to output an image 120 toward a viewer 105.

The display device according to any one of the first to seventh embodiments is preferably applied to the electronic shelf label. This is because of the following two reasons.

First, in the flash memory, a tunnel oxide film formed between the semiconductor substrate and the floating gate deteriorates each time electrons pass therethrough. This means that the tunnel oxide film deteriorates each time the sub-pixel data is written. Accordingly, the number of rewriting of the flash memory is bound by an upper limit.

When the display device according to any one of the first to seventh embodiments is applied to a smartphone or a personal computer, the sub-pixel data is frequently written to the sub-pixels SPix, and the life of the device is likely to be reduced. Accordingly, when the display device according to any one of the first to seventh embodiments is applied to the smartphone or the personal computer, the life of the device needs to be considered.

In contrast, in the electronic shelf label, the sub-pixel data is written to the sub-pixels SPix when, for example, the price of a product is changed or the product is replaced. Accordingly, when the display device according to any one of the first to seventh embodiments is applied to the electronic shelf label, the sub-pixel data is less frequently written to the sub-pixels SPix, and the life of the device is less likely to be reduced.

Accordingly, applying the display device according to any one of the first to seventh embodiments to the electronic shelf label can substantially reduce the need for considering the life of the device.

Second, in the electronic shelf label, if the price of the product is not changed and the product is not replaced, the same image may be repeatedly displayed for several days. If a volatile memory, such as a DRAM or an SRAM, is used in the electronic shelf label, the sub-pixel data needs to be written to, for example, the DRAM or the SRAM before the daily opening time of a product sales store even for displaying the same image as that up to the previous day. Alternatively, the electronic shelf label needs to be provided with a battery for memory holding to hold the sub-pixel data up to the previous day stored in, for example, the DRAM or the SRAM.

In contrast, when the display device according to any one of the first to seventh embodiments is applied to the electronic shelf label, since the nonvolatile flash memory is used in the sub-pixel SPix, the sub-pixel data need not be written to the sub-pixels SPix before the daily opening time of the product sales store for displaying the same image as that up to the previous day. The electronic shelf label need not be provided with the battery for memory holding. Accordingly, the convenience of the product sales store can be improved by applying the display device according to any one of the first to seventh embodiments to the electronic shelf label.

The preferred embodiments of the present disclosure have been described above. The present disclosure is, however, not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure. At least one of various omissions, replacements, and modifications of the components can be made without departing from the gist of the embodiments and the modifications described above.

What is claimed is:

1. A display device comprising:
   a plurality of sub-pixels arranged in a row direction and a column direction, each of the sub-pixels including a memory block that has at least one memory configured to store sub-pixel data;
   a common electrode configured to be supplied with a common potential common to the sub-pixels;
   a common electrode drive circuit coupled to the common electrode and configured to output the common potential to the common electrode;
   a first display signal line and a second display signal line; and
   an inversion drive circuit configured to:
      output a first display signal inverted in polarity with respect to the common potential at a predetermined cycle to the first display signal line, and
      output a second display signal in phase with the common potential to the second display signal line, wherein
   the at least one memory includes:
      a first transistor including a first floating gate and configured to store the sub-pixel data based on an electric charge in the first floating gate; and
      a second transistor including a second floating gate electrically coupled to the first floating gate of the first transistor, one of a drain and a source of the second transistor being coupled to a power supply potential, the other of the drain and the source being coupled to a node,
   each of the sub-pixels further includes:
      a sub-pixel electrode; and
      a switch circuit configured to output a potential based on a potential of the node to the sub-pixel electrode,
   the switch circuit is configured to couple either of:
      the first display signal line; and
      the second display signal line
         to the sub-pixel electrode based on the potential of the node, and
   each of the sub-pixels is configured to display an image based on the potential of the node.

2. The display device according to claim 1, wherein source-drain paths of the first transistors of the memories are electrically coupled in series.

3. The display device according to claim 2, further comprising a plurality of source lines each provided in each column, and each configured to supply a source signal including the sub-pixel data to the first transistors of the memories in a corresponding column.

4. The display device according to claim 2, further comprising a plurality of gate lines each provided in each row, and each configured to supply a gate signal to the gates of the first transistors of the memories in a corresponding row.

5. The display device according to claim 4, wherein each of the gate lines is electrically coupled to the gates of the corresponding second transistors.

6. The display device according to claim 2, wherein the memory block comprises a plurality of the memories arranged in the column direction.

7. The display device according to claim 6, further comprising a plurality of memory selection lines each provided in each row, and each configured to supply a memory selection signal to the gates of the second transistors of the memories in a corresponding row.

8. The display device according to claim 6, further comprising a plurality of gate lines each provided in each row, and each configured to supply a gate signal to the gates of the first transistors of the memories in a corresponding row, wherein the second transistors of the memories in the corresponding row are coupled to a corresponding one of the gate lines.

9. The display device according to claim 1, wherein source-drain paths of the first transistors of the memories are electrically coupled in parallel.

10. The display device according to claim 9, further comprising a plurality of source lines each provided in each column, and each configured to supply a source signal including the sub-pixel data to the first transistors of the memories in a corresponding column.

11. The display device according to claim 10, wherein the memories arranged in the column direction are electrically coupled to a corresponding one of the source lines through a switch.

12. The display device according to claim 9, further comprising a plurality of gate lines each provided in each row, and each configured to supply a gate signal to the gates of the first transistors of the memories in a corresponding row.

13. The display device according to claim 12, wherein each of the gate lines is electrically coupled to the gates of the corresponding second transistors.

14. The display device according to claim 9, wherein the memory block comprises a plurality of the memories arranged in the column direction.

15. The display device according to claim 14, further comprising a plurality of memory selection lines each provided in each row, and each configured to supply a memory selection signal to the gates of the second transistors of the memories in a corresponding row.

16. The display device according to claim 14, further comprising a plurality of gate lines each provided in each row, and each configured to supply a gate signal to the gates of the first transistors of the memories in a corresponding row, wherein the second transistors of the memories in the corresponding row are coupled to a corresponding one of the gate lines.

17. The display device according to claim 1, wherein the common electrode drive circuit is configured to supply a signal inverted from the first display signal and having an opposite phase of a phase of the first display signal in synchronization with the first display signal as the common potential to the common electrode.

18. The display device according to claim 1, wherein each of the sub-pixels further includes a pull-down resistor configured to pull down the node.

19. An electronic shelf label comprising:
a plurality of sub-pixels arranged in a row direction and a column direction, each of the sub-pixels including a memory block that has at least one memory configured to store sub-pixel data;
a common electrode configured to be supplied with a common potential common to the sub-pixels;
a common electrode drive circuit coupled to the common electrode and configured to output the common potential to the common electrode;
a first display signal line and a second display signal line; and
an inversion drive circuit configured to:
output a first display signal inverted in polarity with respect to the common potential at a predetermined cycle to the first display signal line, and
output a second display signal in phase with the common potential to the second display signal line,
wherein
the at least one memory includes:
a first transistor including a first floating gate and configured to store the sub-pixel data based on an electric charge in the first floating gate; and
a second transistor including a second floating gate electrically coupled to the first floating gate of the first transistor, one of a drain and a source of the second transistor being coupled to a power supply potential, the other of the drain and the source being coupled to a node,
each of the sub-pixels further includes:
a sub-pixel electrode; and
a switch circuit configured to output a potential based on a potential of the node to the sub-pixel electrode,
the switch circuit is configured to couple either of:
the first display signal line; and
the second display signal line
to the sub-pixel electrode based on the potential of the node, and
each of the sub-pixels is configured to display an image based on the potential of the node.

* * * * *